United States Patent
Epple et al.

(10) Patent No.: US 8,363,315 B2
(45) Date of Patent: Jan. 29, 2013

(54) CATADIOPTRIC PROJECTION OBJECTIVE WITH MIRROR GROUP

(75) Inventors: Alexander Epple, Aalen (DE); Wilhelm Ulrich, Aalen (DE); Aurelian Dodoc, Heidenheim (DE); Hans-Juergen Mann, Oberkochen (DE); David Shafer, Salem, CT (US)

(73) Assignee: Carl Zeiss SMT GmbH, Oberkochen (DE)

( * ) Notice: Subject to any disclaimer, the term of this patent is extended or adjusted under 35 U.S.C. 154(b) by 1410 days.

(21) Appl. No.: 11/578,101

(22) PCT Filed: Apr. 7, 2005

(86) PCT No.: PCT/EP2005/003645
§ 371 (c)(1),
(2), (4) Date: Oct. 15, 2007

(87) PCT Pub. No.: WO2005/098505
PCT Pub. Date: Oct. 20, 2005

(65) Prior Publication Data
US 2011/0261444 A1 Oct. 27, 2011

Related U.S. Application Data

(60) Provisional application No. 60/560,267, filed on Apr. 8, 2004.

(51) Int. Cl.
*G02B 17/00* (2006.01)
(52) U.S. Cl. .......................... 359/365; 359/364; 359/366
(58) Field of Classification Search .................. 359/237, 359/649, 650, 651
See application file for complete search history.

(56) References Cited

U.S. PATENT DOCUMENTS 2,380,887 A 7/1945 Warmisham
(Continued)

FOREIGN PATENT DOCUMENTS

DE 1064734 B 9/1959
DE 10332112 1/2005
(Continued)

OTHER PUBLICATIONS

BPAI Interference No. 105,753, *Omura v. Shafer*, Omura Status Report, filed Mar. 23, 2011.
(Continued)

*Primary Examiner* — James Jones
(74) *Attorney, Agent, or Firm* — Fish & Richardson P.C.

(57) ABSTRACT

A catadioptric projection objective for imaging an off-axis object field arranged in an object surface of the projection objective onto an off-axis image field arranged in an image surface of the projection objective has a front lens group, a mirror group comprising four mirrors and having an object side mirror group entry, an image side mirror group exit, and a mirror group plane aligned transversely to the optical axis and arranged geometrically between the mirror group entry and the mirror group exit; and a rear lens group. The mirrors of the mirror group are arranged such that at least one intermediate image is positioned inside the mirror group between mirror group entry and mirror group exit, and that radiation coming from the mirror group entry passes at least four times through the mirror group plane and is reflected at least twice on a concave mirror surface of the mirror group prior to exiting the mirror group at the mirror group exit. The mirror group entry is positioned in a region where radiation exiting the front lens group has an entry chief ray height. A second reflecting area is positioned in a region where radiation impinging on the second mirror has a second chief ray height deviating from the entry chief ray height in a first direction; and a fourth reflecting area is positioned in a region where radiation impinging on the fourth mirror has a fourth chief ray height deviating from the entry chief ray height in a second direction opposite to the first direction.

4 Claims, 14 Drawing Sheets

U.S. PATENT DOCUMENTS

| | | |
|---|---|---|
| 3,244,073 A | 4/1966 | Bouwers et al. |
| 4,103,990 A | 8/1978 | Yamada |
| 4,241,390 A | 12/1980 | Markle et al. |
| 4,293,186 A | 10/1981 | Offner |
| 4,346,164 A | 8/1982 | Tabarelli et al. |
| 4,398,809 A | 8/1983 | Canzek |
| 4,443,068 A | 4/1984 | Itoh |
| 4,469,414 A | 9/1984 | Shafer |
| 4,482,219 A | 11/1984 | Canzek |
| 4,666,259 A | 5/1987 | Iizuka |
| 4,685,777 A | 8/1987 | Hirose |
| 4,701,035 A | 10/1987 | Hirose |
| 4,711,535 A | 12/1987 | Shafer |
| 4,757,354 A | 7/1988 | Sato et al. |
| 4,779,966 A | 10/1988 | Friedman |
| 4,812,028 A | 3/1989 | Matsumoto |
| 4,834,515 A | 5/1989 | Mercado |
| 4,861,148 A | 8/1989 | Sato et al. |
| 4,951,078 A | 8/1990 | Okada |
| 5,004,331 A | 4/1991 | Haseltine et al. |
| 5,031,976 A | 7/1991 | Shafer |
| 5,063,586 A | 11/1991 | Jewell et al. |
| 5,114,238 A | 5/1992 | Sigler |
| 5,153,898 A | 10/1992 | Suzuki et al. |
| 5,212,588 A | 5/1993 | Viswanathan et al. |
| 5,220,590 A | 6/1993 | Bruning et al. |
| 5,315,629 A | 5/1994 | Jewell et al. |
| 5,353,322 A | 10/1994 | Bruning et al. |
| 5,410,434 A | 4/1995 | Shafer |
| 5,477,304 A | 12/1995 | Nishi |
| 5,488,229 A | 1/1996 | Elliott et al. |
| 5,515,207 A | 5/1996 | Foo |
| 5,636,066 A | 6/1997 | Takahashi |
| 5,650,877 A | 7/1997 | Phillips, Jr. et al. |
| 5,652,679 A | 7/1997 | Freeman |
| 5,686,728 A | 11/1997 | Shafer |
| 5,717,518 A | 2/1998 | Shafer et al. |
| 5,729,376 A | 3/1998 | Hall et al. |
| 5,734,496 A | 3/1998 | Beach |
| 5,802,335 A | 9/1998 | Sturlesi et al. |
| 5,805,346 A | 9/1998 | Sweatt |
| 5,805,365 A | 9/1998 | Sweatt |
| 5,815,310 A | 9/1998 | Williamson |
| 5,825,043 A | 10/1998 | Suwa |
| 5,861,997 A | 1/1999 | Takahashi |
| 5,917,879 A | 6/1999 | Mashima |
| 5,956,192 A | 9/1999 | Williamson |
| 5,999,310 A | 12/1999 | Shafer et al. |
| 6,033,079 A | 3/2000 | Hudyma |
| 6,097,537 A | 8/2000 | Takahashi et al. |
| 6,169,627 B1 | 1/2001 | Schuster |
| 6,169,637 B1 | 1/2001 | Tsunashima |
| 6,172,825 B1 | 1/2001 | Takahashi |
| 6,188,513 B1 | 2/2001 | Hudyma et al. |
| 6,195,213 B1 | 2/2001 | Omura et al. |
| 6,213,610 B1 | 4/2001 | Takahashi et al. |
| 6,259,510 B1 | 7/2001 | Suzuki |
| 6,262,845 B1 | 7/2001 | Sweatt |
| 6,285,737 B1 | 9/2001 | Sweatt et al. |
| 6,353,470 B1 | 3/2002 | Dinger |
| 6,426,506 B1 | 7/2002 | Hudyma |
| 6,473,243 B1 | 10/2002 | Omura |
| 6,600,608 B1 | 7/2003 | Shafer et al. |
| 6,631,036 B2 | 10/2003 | Schuster |
| 6,636,350 B2 | 10/2003 | Shafer et al. |
| 6,750,948 B2 | 6/2004 | Omura |
| 6,757,051 B2 | 6/2004 | Takahashi et al. |
| 6,822,727 B2 | 11/2004 | Shima |
| 6,829,099 B2 | 12/2004 | Kato et al. |
| 6,842,298 B1 | 1/2005 | Shafer et al. |
| 6,873,476 B2 | 3/2005 | Shafer et al. |
| 6,909,492 B2 | 6/2005 | Omura |
| 6,912,042 B2 | 6/2005 | Shafer |
| 6,995,886 B2 | 2/2006 | Hendriks |
| 6,995,918 B2 | 2/2006 | Terasawa |
| 7,030,965 B2 | 4/2006 | Takahashi |
| 7,075,726 B2 | 7/2006 | Terasawa et al. |
| 7,079,314 B1 | 7/2006 | Suenaga et al. |
| 7,085,075 B2 | 8/2006 | Mann et al. |
| 7,092,168 B2 | 8/2006 | Terasawa et al. |
| 7,187,503 B2 | 3/2007 | Rostalski et al. |
| 7,190,530 B2 | 3/2007 | Mann et al. |
| 7,218,445 B2 | 5/2007 | Shafer et al. |
| 7,224,520 B2 | 5/2007 | Mitchell |
| 7,237,915 B2 | 7/2007 | Hudyma |
| 7,239,453 B2 | 7/2007 | Terasawa et al. |
| 7,309,870 B2 | 12/2007 | Omura |
| 7,312,463 B2 | 12/2007 | Omura |
| 7,348,575 B2 | 3/2008 | Omura |
| 7,385,756 B2 | 6/2008 | Shafer et al. |
| 7,463,422 B2 | 12/2008 | Kamenov |
| 2002/0024741 A1 | 2/2002 | Terasawa et al. |
| 2002/0176063 A1 | 11/2002 | Omura |
| 2003/0011755 A1 | 1/2003 | Omura et al. |
| 2003/0011894 A1 | 1/2003 | Schuster |
| 2003/0174408 A1 | 9/2003 | Rostalski et al. |
| 2003/0197922 A1 | 10/2003 | Hudyma |
| 2003/0197946 A1 | 10/2003 | Omura |
| 2003/0234912 A1 | 12/2003 | Omura |
| 2003/0234992 A1 | 12/2003 | Shafer |
| 2004/0012866 A1 | 1/2004 | Mann et al. |
| 2004/0130806 A1 | 7/2004 | Takahashi |
| 2004/0160677 A1 | 8/2004 | Epple et al. |
| 2004/0240047 A1 | 12/2004 | Shafer et al. |
| 2005/0036213 A1 | 2/2005 | Mann et al. |
| 2005/0117224 A1* | 6/2005 | Shafer et al. .................. 359/649 |
| 2005/0179994 A1 | 8/2005 | Webb |
| 2005/0185269 A1 | 8/2005 | Epple et al. |
| 2005/0190435 A1 | 9/2005 | Shafer et al. |
| 2005/0225737 A1 | 10/2005 | Weissenrieder et al. |
| 2005/0248856 A1 | 11/2005 | Omura et al. |
| 2006/0012885 A1 | 1/2006 | Beder et al. |
| 2006/0066962 A1 | 3/2006 | Totzeck et al. |
| 2006/0077366 A1 | 4/2006 | Shafer |
| 2006/0082905 A1 | 4/2006 | Shafer et al. |
| 2006/0119750 A1 | 6/2006 | Epple et al. |
| 2006/0121364 A1 | 6/2006 | Omura |
| 2006/0198018 A1 | 9/2006 | Shafer et al. |
| 2006/0221456 A1 | 10/2006 | Shafer et al. |
| 2006/0244938 A1 | 11/2006 | Schuster |
| 2006/0256447 A1 | 11/2006 | Dodoc |
| 2007/0024960 A1 | 2/2007 | Omura |
| 2007/0037079 A1 | 2/2007 | Omura |
| 2007/0037080 A1 | 2/2007 | Omura |
| 2007/0091451 A1 | 4/2007 | Schuster |
| 2007/0109659 A1 | 5/2007 | Rostalski et al. |
| 2007/0165198 A1 | 7/2007 | Kneer et al. |
| 2007/0236674 A1 | 10/2007 | Shafer et al. |
| 2007/0297072 A1 | 12/2007 | Omura |
| 2008/0151364 A1 | 6/2008 | Shafer et al. |
| 2008/0151365 A1 | 6/2008 | Shafer et al. |
| 2008/0186567 A1 | 8/2008 | Shafer et al. |
| 2008/0212170 A1 | 9/2008 | Shafer et al. |
| 2008/0285121 A1 | 11/2008 | Shafer et al. |
| 2008/0297889 A1 | 12/2008 | Shafer et al. |
| 2008/0310014 A1 | 12/2008 | Shafer et al. |

FOREIGN PATENT DOCUMENTS

| | | |
|---|---|---|
| DE | 102005056721 | 11/2006 |
| EP | 0267766 | 5/1988 |
| EP | 0951054 | 10/1999 |
| EP | 1059550 | 12/2000 |
| EP | 1 069 448 A1 | 1/2001 |
| EP | 1 098 215 A1 | 5/2001 |
| EP | 1318425 B1 | 6/2003 |
| EP | 1 336 887 A1 | 8/2003 |
| EP | 1336887 A1 | 8/2003 |
| JP | 5-175098 | 7/1993 |
| JP | 6-188169 | 7/1994 |
| JP | 8-166542 | 6/1995 |
| JP | 8-330220 | 12/1996 |
| JP | 9-148241 | 6/1997 |
| JP | 10-163099 | 6/1998 |
| JP | 10-214783 | 8/1998 |
| JP | 10-284408 | 10/1998 |
| JP | 10-303114 | 11/1998 |
| JP | 2000-058436 | 2/2000 |

| | | |
|---|---|---|
| JP | 2000-505958 | 5/2000 |
| JP | 2001-166210 | 6/2001 |
| JP | 2001-228401 | 8/2001 |
| JP | 2003114387 | 10/2001 |
| JP | 3246615 | 11/2001 |
| JP | 2002-208551 | 7/2002 |
| JP | 2002-372668 | 12/2002 |
| JP | 2003-307680 | 10/2003 |
| JP | 2004-317534 | 11/2004 |
| JP | 2004-333761 | 11/2004 |
| JP | 2005-003982 | 1/2005 |
| JP | 2005-107362 | 4/2005 |
| SU | 124665 | 3/1959 |
| TW | 529080 | 4/2003 |
| TW | 559674 | 11/2003 |
| WO | WO 92/05462 | 4/1992 |
| WO | WO 94/06047 | 3/1994 |
| WO | WO 98/28665 | 7/1998 |
| WO | WO 99/26097 | 5/1999 |
| WO | WO 99/42905 | 8/1999 |
| WO | WO 99/57596 | 11/1999 |
| WO | WO 01/04682 | 1/2001 |
| WO | WO 01/51979 A2 | 7/2001 |
| WO | WO 0151979 A2 | 7/2001 |
| WO | WO 01/55767 A2 | 8/2001 |
| WO | WO 01/59502 | 8/2001 |
| WO | WO 02/35273 | 5/2002 |
| WO | WO 03/036361 | 5/2003 |
| WO | WO 03/088330 | 10/2003 |
| WO | WO 2004/010200 | 1/2004 |
| WO | WO 2004/019128 | 3/2004 |
| WO | WO 2004/107011 A1 | 9/2004 |
| WO | WO 2005/015316 | 2/2005 |
| WO | WO 2005/040890 | 5/2005 |
| WO | WO 2005/059654 | 6/2005 |
| WO | WO 2005/059055 | 7/2005 |
| WO | WO 2005/098504 | 10/2005 |
| WO | WO 2005/098505 | 10/2005 |
| WO | WO 2005/098506 | 10/2005 |
| WO | WO 2005111689 | 11/2005 |
| WO | WO 2006/005547 | 1/2006 |
| WO | WO 2007/025643 | 3/2007 |
| WO | WO 2007/086220 | 8/2007 |

OTHER PUBLICATIONS

BPAI Interference No. 105,753, *Omura v. Shafer*, Omura Status Report on the Federal Curcuit Appel of Interference No. 105,678 , filed Jan. 26, 2011.
BPAI Interference No. 105,753, *Omura v. Shafer*, Omura Status Report on the Federal Circuit Appeal of Interference No. 105,678, filed Nov. 18, 2010.
BPAI Interference No. 105,753, *Omura v. Shafer*, Omura Status Report on the Federal Circuit Appeal of Interference No. 105678, filed Nov. 3, 2010.
BPAI Interference No. 105,753, *Omura v. Shafer*, Omura Status Report on the Federal Circuit Appeal of Interference No. 105678, filed Oct. 6, 2010.
BPAI Interference No. 105,753, *Omura v. Shafer*, Brief of Appellant Omura, filed Sep. 8, 2010.
BPAI Interference No. 105,753, *Omura v. Shafer*, Omura Status Report on the Federal Circuit Appeal of Interference No. 105,678, filed Sep. 8, 2010.
BPAI Interference No. 105,753, *Omura v. Shafer*, Omura Status Report on the Federal Circuit Appeal of Interference 105678, filed Aug. 25, 2010.
BPAI Interference No. 105,753, *Omura v. Shafer*, Order Bd.R. 104(c), filed Aug. 11, 2010.
BPAI Interference No. 105,753, *Omura v. Shafer*, Omura Annotated Claim, filed Jul. 27, 2010.
BPAI Interference No. 105,753, *Omura v. Shafer*, Shafer Annotated Claim, filed Jul. 27, 2010.
BPAI Interference No. 105,753, *Omura v. Shafer*, Omura First Exhibit List, filed Jul. 20, 2010.
BPAI Interference No. 105,753, *Omura v. Shafer*, Omura Response to Order to Show Cause, filed Jul. 20, 2010.
BPAI Interference No. 105,753, *Omura v. Shafer*, Order Bd.R. 109(b)Authorizing Office Records, filed Jul. 14, 2010.
BPAI Interference No. 105,753, *Omura v. Shafer*, Shafer Request for File Copies, filed Jul. 13, 2010.
BPAI Interference No. 105,753, *Omura v. Shafer*, Shafer Clean Copy of Claim, filed Jul. 13, 2010.
BPAI Interference No. 105,753, *Omura v. Shafer*, Shafer Notice of Real Party in Interest, filed Jul. 13, 2010.
BPAI Interference No. 105,753, *Omura v. Shafer*, Shafer Notice of Related Proceedings, filed Jul. 13, 2010.
BPAI Interference No. 105,753, *Omura v. Shafer*, Shafer Submission of Appointment of Additional Attorney, filed Jul. 13, 2010.
BPAI Interference No. 105,753, *Omura v. Shafer*, Shafer Designation of Lead and Backup Lead Counsel, filed Jul. 13, 2010.
BPAI Interference No. 105,753, *Omura v. Shafer*, Omura Request for File Copies, filed Jul. 13, 2010.
BPAI Interference No. 105,753, *Omura v. Shafer*, Omura Clean Copy of Claims, filed Jul. 13, 2010.
BPAI Interference No. 105,753, *Omura v. Shafer*, Omura Notice of Relatred Proceedings, filed Jul. 13, 2010.
BPAI Interference No. 105,753, *Omura v. Shafer*, Omura Notice of Real Party in Interest, filed Jul. 13, 2010.
BPAI Interference No. 105,753, *Omura v. Shafer*, Omura Designation of Lead and Backup Attorneys, filed Jul. 13, 2010.
BPAI Interference No. 105,753, *Omura v. Shafer*, Order to Show Cause Bd.R. 104(a), filed Jun. 29, 2010.
BPAI Interference No. 105,753, *Omura v. Shafer*, Stanidng Order, filed Jun. 29, 2010.
BPAI Interference No. 105,753, *Omura v. Shafer*, Declaration Bd.R. 203(b), filed Jun. 29, 2010.
BPAI Interference No. 105,753, *Omura v. Shafer*, Omura Exhibit #1001, Interference No. 105,678, Paper No. 74 (Feb. 5, 2010)—Decision—Request for Rehearing—Bd.R. 127(d) , dated Jul. 20, 2010.
BPAI Interference No. 105,753, *Omura v. Shafer*, Omura Exhibit #1002, Interference No. 105,678, Paper No. 1 (Jan. 30, 2009)—Declaration Bd.R. 203(b) , dated Jul. 20, 2010.
BPAI Interference No. 105,753, *Omura v. Shafer*, Omura Exhibit #1003, Interference No. 105,678, Paper No. 47 (Aug. 26, 2009)—Omura Response 1, filed Jul. 20, 2010, dated Jul. 20, 2010.
BPAI Interference No. 105,753, *Omura v. Shafer*, Omura Exhibit #1004, US Patent No. 7,309,870, issued Dec. 18, 2007, dated Jul. 20, 2010.
BPAI Interference No. 105,749, *Shafer v. Omura*, Index of Shafer's Exhibits for the Record, filed Feb. 11, 2011.
BPAI Interference No. 105,749, *Shafer v. Omura*, Shafer's Submission of the Record, filed Feb. 11, 2011.
BPAI Interference No. 105,749, *Shafer v. Omura*, Omura Notice of Time Period 8 Filings, filed Feb. 11, 2011.
BPAI Interference No. 105,749, *Shafer v. Omura*, Order Miscellaneous Bd.R. 104(a), filed Jan. 21, 2011.
BPAI Interference No. 105,749, *Shafer v. Omura*, Omura Notice re Oral Argument, filed Jan. 3, 2011.
BPAI Interference No. 105,749, *Shafer v. Omura*, Shafer Request for Oral Hearing, filed Jan. 3, 2011.
BPAI Interference No. 105,749, *Shafer v. Omura*, Shafer Updated List of Exhibits, filed Jan. 3, 2011.
BPAI Interference No. 105,749, *Shafer v. Omura*, Order Miscellaneous Bd.R. 104(a), filed Dec. 15, 2010.
BPAI Interference No. 105,749, *Shafer v. Omura*, E-Mail Communication, filed Dec. 13, 2010.
BPAI Interference No. 105,749, *Shafer v. Omura*, Omura Third Exhibit List, filed Dec. 3, 2010.
BPAI Interference No. 105,749, *Shafer v. Omura*, Omura Reply 5, filed Dec. 3, 2010.
BPAI Interference No. 105,749, *Shafer v. Omura*, Omura Reply 4, filed Dec. 3, 2010.
BPAI Interference No. 105,749, *Shafer v. Omura*, Omura Reply 3, filed Dec. 3, 2010.
BPAI Interference No. 105,749, *Shafer v. Omura*, Omura Reply 2, filed Dec. 3, 2010.
BPAI Interference No. 105,749, *Shafer v. Omura*, Omura Reply 1, filed Dec. 3, 2010.

BPAI Interference No. 105,749, *Shafer* v. *Omura*, Shafer Reply 3, filed Dec. 3, 2010.
BPAI Interference No. 105,749, *Shafer* v. *Omura*, Shafer Reply 2, filed Dec. 3, 2010.
BPAI Interference No. 105,749, *Shafer* v. *Omura*, Shafer Reply 1, filed Dec. 3, 2010.
BPAI Interference No. 105,749, *Shafer* v. *Omura*, Shafer Updated List of Exhibits, filed Dec. 3, 2010.
BPAI Interference No. 105,749, *Shafer* v. *Omura*, Omura Notice of Action Issued in Omura Continuation, filed Nov. 16, 2010.
BPAI Interference No. 105,749, *Shafer* v. *Omura*, Shafer Updated List of Exhibits, filed Nov. 5, 2010.
BPAI Interference No. 105,749, *Shafer* v. *Omura*, Omura Opposition 3, filed Nov. 5, 2010.
BPAI Interference No. 105,749, *Shafer* v. *Omura*, Omura Opposition 2, filed Nov. 5, 2010.
BPAI Interference No. 105,749, *Shafer* v. *Omura*, Shafer Opposition 5, filed Nov. 5, 2010.
BPAI Interference No. 105,749, *Shafer* v. *Omura*, Shafer Opposition 4, filed Nov. 5, 2010.
BPAI Interference No. 105,749, *Shafer* v. *Omura*, Shafer Opposition 3, filed Nov. 5, 2010.
BPAI Interference No. 105,749, *Shafer* v. *Omura*, Shafer Opposition 2, filed Nov. 5, 2010.
BPAI Interference No. 105,749, *Shafer* v. *Omura*, Shafer Opposition 1, filed Nov. 5, 2010.
BPAI Interference No. 105,749, *Shafer* v. *Omura*, Omura Opposition 1, filed Nov. 5, 2010.
BPAI Interference No. 105,749, *Shafer* v. *Omura*, Shafer Notice of Change of Real Party-in-Interest, filed Nov. 3, 2010.
BPAI Interference No. 105,749, *Shafer* v. *Omura*, Shafer Notice of Change of Counsel Contact Information, filed Nov. 3, 2010.
BPAI Interference No. 105,749, *Shafer* v. *Omura*, Notice of Stipulation to Extend Time Period 3, filed Oct. 8, 2010.
BPAI Interference No. 105,749, *Shafer* v. *Omura*, Shafer Updated List of Exhibits, filed Sep. 17, 2010.
BPAI Interference No. 105,749, *Shafer* v. *Omura*, Shafer Responsive Motion 3, filed Sep. 17, 2010.
BPAI Interference No. 105,749, *Shafer* v. *Omura*, Omura Second Exhibit List, filed Sep. 17, 2010.
BPAI Interference No. 105,749, *Shafer* v. *Omura*, Omura Responsive Motion 5, filed Sep. 17, 2010.
BPAI Interference No. 105,749, *Shafer* v. *Omura*, Omura Responsive Motion 4, filed Sep. 17, 2010.
BPAI Interference No. 105,749, *Shafer* v. *Omura*, Omura Responsive Motion 3, filed Sep. 17, 2010.
BPAI Interference No. 105,749, *Shafer* v. *Omura*, Notice of Stipulation to Extend Time Period 2, filed Sep. 10, 2010.
BPAI Interference No. 105,749, *Shafer* v. *Omura*, Order—Miscellaneous—Bd.R. 104(C), filed Sep. 2, 2010.
BPAI Interference No. 105,749, *Shafer* v. *Omura*, Notice of Filing of Shafer Priority Statement, filed Aug. 20, 2010.
BPAI Interference No. 105,749, *Shafer* v. *Omura*, Shafer List of Exhibits as of August 20, 2010, filed Aug. 20, 2010.
BPAI Interference No. 105,749, *Shafer* v. *Omura*, Shafer Substantive Motion 2, filed Aug. 20, 2010.
BPAI Interference No. 105,749, *Shafer* v. *Omura*, Shafer Substantive Motion 1, filed Aug. 20, 2010.
BPAI Interference No. 105,749, *Shafer* v. *Omura*, Omura First Exhibit List, filed Aug. 20, 2010.
BPAI Interference No. 105,749, *Shafer* v. *Omura*, Omura Notice of Filing Priority Statement, filed Aug. 20, 2010.
BPAI Interference No. 105,749, *Shafer* v. *Omura*, Omura Motion 2, filed Aug. 20, 2010.
BPAI Interference No. 105,749, *Shafer* v. *Omura*, Omura Motion 1, filed Aug. 20, 2010.
BPAI Interference No. 105,749, *Shafer* v. *Omura*, Joint Stipulation to Extend Time Periods 1 to 4, filed Aug. 6, 2010.
BPAI Interference No. 105,749, *Shafer* v. *Omura*, Omura Report of Parties Re Settlement Jul. 28, 2010.
BPAI Interference No. 105,749, *Shafer* v. *Omura*, Order Motion Times Bd.R. 104(c), filed Jun. 25, 2010.
BPAI Interference No. 105,749, *Shafer* v. *Omura*, Shafer Supplemental Notice of Related Proceedings, filed Jun. 25, 2010.
BPAI Interference No. 105,749, *Shafer* v. *Omura*, Omura Motions List, filed Jun. 18, 2010.
BPAI Interference No. 105,749, *Shafer* v. *Omura*, Shafer Motions List, filed Jun. 18, 2010.
BPAI Interference No. 105,749, *Shafer* v. *Omura*, Shafer Annotated Claims, filed May 26, 2010.
BPAI Interference No. 105,749, *Shafer* v. *Omura*, Omura Annotated Claims, filed May 26, 2010.
BPAI Interference No. 105,749, *Shafer* v. *Omura*, Order Bd.R. 109(c)Authorizing Office Records, filed May 14, 2010.
BPAI Interference No. 105,749, *Shafer* v. *Omura*, Shafer File Copy Request, filed May 12, 2010.
BPAI Interference No. 105,749, *Shafer* v. *Omura*, Shafer Clean Copy of Claims, filed May 12, 2010.
BPAI Interference No. 105,749, *Shafer* v. *Omura*, Shafer Notice of Related Proceedings, filed May 12, 2010.
BPAI Interference No. 105,749, *Shafer* v. *Omura*, Shafer Notice of Real Party in Interest, filed May 12, 2010.
BPAI Interference No. 105,749, *Shafer* v. *Omura*, Shafer Submission of Appointment of Additional Attorney, filed May 12, 2010.
BPAI Interference No. 105,749, *Shafer* v. *Omura*, Shafer Designation of Lead Attorney, filed May 12, 2010.
BPAI Interference No. 105,749, *Shafer* v. *Omura*, Omura Request for File Copies, filed May 12, 2010.
BPAI Interference No. 105,749, *Shafer* v. *Omura*, Omura Clean Copy of Claims, filed May 12, 2010.
BPAI Interference No. 105,749, *Shafer* v. *Omura*, Omura Notice of Related Proceedings, filed May 12, 2010.
BPAI Interference No. 105,749, *Shafer* v. *Omura*, Omura Notice of Real Party in Interest, filed May 12, 2010.
BPAI Interference No. 105,749, *Shafer* v. *Omura*, Omura Designation of Lead and Backup Attorney, filed May 12, 2010.
BPAI Interference No. 105,749, *Shafer* v. *Omura*, Standing Order, filed Apr. 28, 2010.
BPAI Interference No. 105,749, *Shafer* v. *Omura*, Declaration Bd.R. 203(b), filed Apr. 28, 2010.
BPAI Interference No. 105,749, *Shafer* v. *Omura*, Shafer Exhibit #2001, Declaration of Richard C. Juergens dated Aug. 19, 2010.
BPAIi Interference No. 105,749, *Shafer* v. *Omura*, Shafer Exhibit #2002, Curriculum Vitae of Richard C. Juergens.
BPAI Interference No. 105,749, *Shafer* v. *Omura*, Shafer Exhibit #2003, U.S. Appl. No. 12/409,394 to Shafer et al., filed Mar. 23, 2009 ("Shafer's Involved Application").
BPAI Interference No. 105,749, *Shafer* v. *Omura*, Shafer Exhibit #2004, U.S. Appl. No. 11/653,366 to Shafer et al., filed Jan. 16, 2007 ("Shafer's Parent Application").
BPAI Interference No. 105,749, *Shafer* v. *Omura*, Shafer Exhibit #2005, WO 2006/005547 to Shafer et al., published on Jan. 19, 2006 ("Shafer's Published PCT Application"); publication of PCT/EP2005/007431, filed Jul. 8, 2005 ("Shafer's PCT Application").
BPAI Interference No. 105,749, *Shafer* v. *Omura*, Shafer Exhibit #2006, U.S. Appl. No. 60/654,950 to Shafer, filed Feb. 23, 2005 ("Shafer's '950 Provisional").
BPAI Interference No. 105,749, *Shafer* v. *Omura*, Shafer Exhibit #2007, U.S. Appl. No. 11/035,103 to Shafer et al., filed Jan. 14, 2005 ("Shafer's '103 Application").
BPAI Interference No. 105,749, *Shafer* v. *Omura*, Shafer Exhibit #2008, U.S. Appl. No. 60/617,674 to Shafer et al., filed Oct. 13, 2004 ("Shafer's '674 Provisional").
BPAI Interference No. 105,749, *Shafer* v. *Omura*, Shafer Exhibit #2009, Filing Receipt mailed Apr. 20, 2009, in Shafer's Involved Application, U.S. Appl. No. 12/409,394.
BPAI Interference No. 105,749, *Shafer* v. *Omura*, Shafer Exhibit #2010, Preliminary Amendment filed Mar. 23, 2009, in Shafer's Involved Application, U.S. Appl. No. 12/409,394.
BPAI Interference No. 105,749, *Shafer* v. *Omura*, Shafer Exhibit #2011, Office communication mailed on Apr. 23, 2010, in Shafer's Involved Application, U.S. Appl. No. 12/409,394.
BPAI Interference No. 105,749, *Shafer* v. *Omura*, Shafer Exhibit #2012, Filing Receipt mailed on Feb. 12, 2007, in Shafer's Parent Application, U.S. Appl. No. 11/653,366.

BPAI Interference No. 105,749, *Shafer* v. *Omura*, Shafer Exhibit #2013, Notice to File Missing Parts mailed on Mar. 15, 2005, in Shafer's '103 Application, U.S. Appl. No. 11/035,103.
BPAI Interference No. 105,749, *Shafer* v. *Omura*, Shafer Exhibit #2014, U.S. Appl. No. 11/583,934 to Omura, filed Oct. 20, 2006 ("Omura's '934 Application").
BPAI Interference No. 105,749, *Shafer* v. *Omura*, Shafer Exhibit #2015, U.S. Patent No. 7,385,756 to Shafer et al., issued on Jun. 10, 2008.
BPAI Interference No. 105,749, *Shafer* v. *Omura*, Shafer Exhibit #2016, Information Disclosure Statement filed on Oct. 20, 2006, in Omura's '934 Application, U.S. Appl. No. 11/583,934.
BPAI Interference No. 105,749, *Shafer* v. *Omura*, Shafer Exhibit #2017, U.S. Patent No. 7,309,870 to Yasuhiro Omura ("Omura's Involved Patent"), issued on Dec. 18, 2007, from Omura's '934 Application, U.S. Appl. No. 11/583,934.
BPAI Interference No. 105,749, *Shafer* v. *Omura*, Shafer Exhibit #2018, U.S. Appl. No. 11/266,288 to Yasuhiro Omura, filed Nov. 4, 2005 ("Omura's Parent Application").
BPAI Interference No. 105,749, *Shafer* v. *Omura*, Shafer Exhibit #2019, WO 2004/107011 to Yasuhiro Omura, published on Sep. 12, 2004; publication of PCT/JP2004/006417, filed May 6, 2004 ("Omura's PCT Application").
BPAI Interference No. 105,749, *Shafer* v. *Omura*, Shafer Exhibit #2020, English Translation of JP2003-128154 to Omura, filed May 6, 2003.
BPAI Interference No. 105,749, *Shafer* v. *Omura*, Shafer Exhibit #2021, English Translation of JP2003-350647 to Omura, filed Oct. 9, 2003.
BPAI Interference No. 105,749, *Shafer* v. *Omura*, Shafer Exhibit #2022, English Translation of JP2003-364596 to Omura, filed Oct. 24, 2003.
BPAI Interference No. 105,749, *Shafer* v. *Omura*, Shafer Exhibit #2023, Microlithography: Science and Technology, ed. James R. Sheats and Bruce W. Smith, Marcel Dekker, Inc., pp. 261-270 (1998).
BPAI Interference No. 105,749, *Shafer* v. *Omura*, Shafer Exhibit #2024, U.S. 2003/0234912 to Yasuhiro Omura, published on Dec. 25, 2003 ("Omura's '912 Publication").
BPAI Interference No. 105,749, *Shafer* v. *Omura*, Shafer Exhibit #2025, Omura et al., *Catadioptric lens development for DUV and VUV projection optics*, Optical Microlithography XVI, *Proc. SPIE*, vol. 5040, pp. 781-788 (2003) ("Omura's SPIE Paper").
BPAI Interference No. 105,749, *Shafer* v. *Omura*, Shafer Exhibit #2026, U.S. Appl. No. 60/591,775 to Beder et al., filed Jul. 26 or 27, 2004 ("The '775 Provisional").
BPAI Interference No. 105,749, *Shafer* v. *Omura*, Shafer Exhibit #2027, Amendment adding claim 52 to U.S. Appl. No. 12/409,394.
BPAI Interference No. 105,749, *Shafer* v. *Omura*, Shafer Exhibit #2028, U.S. Appl. No. 12/561,019 to Shafer et al., filed Sep. 16, 2009.
BPAI Interference No. 105,749, *Shafer* v. *Omura*, Shafer Exhibit #2029, U.S. Appl. No. 12/816,863 to Shafer et al., filed Jun. 16, 2010.
BPAI Interference No. 105,749, *Shafer* v. *Omura*, Shafer Exhibit #2030, Non-final Office Action mailed Nov. 5, 2010, in U.S. Appl. No. 12/884,332 to Yasuhiro Omura.
BPAI Interference No. 105,749, *Shafer* v. *Omura*, Shafer Exhibit #2031, Notice of Proposed Rules on Wednesday, Nov. 26, 2003, in 68 Fed. Reg. (No. 228) at 66648 et seq.
BPAI Interference No. 105,749, *Shafer* v. *Omura*, Shafer Exhibit #2032, Final Rules on Thursday, Aug. 12, 2004, in 69 Fed. Reg. (No. 155) at 49960 et seq.
BPAI Interference No. 105,749, *Shafer* v. *Omura*, Shafer Exhibit #2033, Official Filing receipt mailed on Sep. 27, 2004, in the '775 Provisional, U.S. Appl. No. 60/591,775.
BPAI Interference No. 105,749, *Shafer* v. *Omura*, Shafer Exhibit #2034, English Translation of the '775 Provisional, U.S. Appl. No. 60/591,775.
BPAI Interference No. 105,749, *Shafer* v. *Omura*, Shafer Exhibit #2035, Claim Chart Showing Exemplary Common Disclosure in Shafer Involved Application, Shafer's Parent Application, Shafer's PCT Application, and Shafer's '950 Provisional Relevant to the Count.
BPAI Interference No. 105,749, *Shafer* v. *Omura*, Shafer Exhibit #2036, Claim Chart Showing Exemplary Common Disclosure in Shafer Involved Application, Shafer's Parent Application, Shafer's PCT Application, Shafer's '103 Application and Shafer's '674 Provisional Relevant to the Count.
BPAI Interference No. 105,749, *Shafer* v. *Omura*, Shafer Exhibit #2037, Claim Chart Showing Exemplary Common Disclosure in Shafer Involved Application, Shafer's Parent Application, Shafer's PCT Application, and Shafer's '775 Provisional Relevant to the Count.
BPAI Interference No. 105,749, *Shafer* v. *Omura*, Shafer Exhibit #2038, Code V sequence for the embodiment shown in Fig. 11 of Shafer's Involved Application.
BPAI Interference No. 105,749, *Shafer* v. *Omura*, Shafer Exhibit #2039, Code V sequence for the embodiment shown in Fig. 28 of Shafer's '674 Provisional.
BPAI Interference No. 105,749, *Shafer* v. *Omura*, Shafer Exhibit #2040, Code V sequence for the embodiment shown in Fig. 1 of Shafer's '775 Provisional.
BAPI Interference No. 105,749, *Shafer* v. *Omura*, Shafer Exhibit #2041, Code V sequence for the embodiment shown in Fig. 5 of Omura's Involved Patent.
BPAI Interference No. 105,749, *Shafer* v. *Omura*, Shafer Exhibit #2042, Code V sequence for the embodiment shown in Fig. 7 of Omura's Involved Patent.
BPAI Interference No. 105,749, *Shafer* v. *Omura*, Shafer Exhibit #2043, Code V sequence for the embodiment shown in Fig. 9 of Omura's Involved Patent.
BPAI Interference No. 105,749, *Shafer* v. *Omura*, Shafer Exhibit #2044, Code V sequence for the embodiment shown in Fig. 10 of Omura's Involved Patent.
BPAI Interference No. 105,749, *Shafer* v. *Omura*, Shafer Exhibit #2045, Code V sequence for the embodiment shown in Fig. 14 of Omura's Involved Patent.
BPAI Interference No. 105,749, *Shafer* v. *Omura*, Shafer Exhibit #2046, Code V sequence for the embodiment shown in Fig. 15 of Omura's Involved Patent.
BPAI Interference No. 105,749, *Shafer* v. *Omura*, Shafer Exhibit #2047, Code V sequence for the embodiment shown in Fig. 16 of Omura's Involved Patent.
BPAI Interference No. 105,749, *Shafer* v. *Omura*, Shafer Exhibit #2048, Code V macro for determining COMP1, COMP2, and COMP3.
BPAI Interference No. 105,749, *Shafer* v. *Omura*, Shafer Exhibit #2049, ZEMAX—Optical Design Program—User's Guide, Version 10.0, published in Apr. 2001.
BPAI Interference No. 105,749, *Shafer* v. *Omura*, Shafer Exhibit #2050, U.S. Patent No. 7,688,517 to Omura et al., issued on Mar. 30, 2010.
BPAI Interference No. 105,749, *Shafer* v. *Omura*, Shafer Exhibit #2051, U.S. Patent No. 7,688,422 to Ikezawa et al., issued Mar. 30, 2010.
BPAI Interference No. 105,749, *Shafer* v. *Omura*, Shafer Exhibit #2052, PCT Patent Publication No. WO 2004/019128, published on Mar. 4, 2004 ("Nikon's PCT Application").
BPAI Interference No. 105,749, *Shafer* v. *Omura*, Shafer Exhibit #2053, Great Britain Patent Application GB 0311470.9, filed May 19, 2003 ("the Williamson application").
BPAI Interference No. 105,749, *Shafer* v. *Omura*, Shafer Exhibit #2054, Combined Declaration and Power of Attorney dated Nov. 29, 2005, filed in U.S. Appl. No. 11/266,288.
BPAI Interference No. 105,749, *Shafer* v. *Omura*, Shafer Exhibit #2055, E-mail dated Nov. 4, 2010, from Jonathan Bockman to Marc Wefers regarding stipulation.
BPAI Interference No. 105,749, *Shafer* v. *Omura*, Shafer Exhibit #2056, E-mail dated Aug. 27, 2010, from Christopher Bowley to Jonathan Bockman and Barry Bretschneider regarding service of Shafer Priority Statement.
BPAI Interference No. 105,749, *Shafer* v. *Omura*, Omura Exhibit #1001—U.S. Appl. No. 12/409,394 to Shafer et al.
BPAI Interference No. 105,749, *Shafer* v. *Omura*, Omura Exhibit # 1002—Declaration of Mitchell C. Ruda, Ph.D.
BPAI Interference No. 105,749, *Shafer* v. *Omura*, Omura Exhibit #1003—Curriculum vitae of Mitchell C. Ruda, Ph.D.

BPAI Interference No. 105,749, *Shafer v. Omura*, Omura Exhibit #1004—MPEP 2163.
BPAI Interference No. 105,749, *Shafer v. Omura*, Omura Exhibit #1005—Reply to Action of Jan. 13, 2010, in U.S. Appl. No. 12/409,394 to Shafer et al.
BPAI Interference No. 105,749, *Shafer v. Omura*, Omura Exhibit #1006—Aurelian Dodoc, "Toward the Global Optimum in Lithographic Lens Design," in International Optical Design Conference, OSA Technical Digest (CD) (Optical Society of America, 2010), paper IWD3.
BPAI Interference No. 105,749, *Shafer v. Omura*, Omura Exhibit #1007—U.S. Appl. No. 12/884,332 "Projection Optical Systems, Apparatus, and Exposure Method," to Omura, filed Sep. 17, 2010 (Omura's Continuation Application).
BPAI Interference No. 105,749, *Shafer v. Omura*, Omura Exhibit #1008—EP 1336887 A1 ("Takahashi").
BPAI Interference No. 105,749, *Shafer v. Omura*, Omura Exhibit #1009—Second Declaration of Mitchell C. Ruda, Ph.D.
BPAI Interference No. 105,749, *Shafer v. Omura*, Omura Exhibit #1010—Action dated Jan. 13, 2010, in U.S. Appl. No. 12/409,394 to Shafer et al.
BPAI Interference No. 105,749, *Shafer v. Omura*, Omura Exhibit #1011—U.S. Appl. No. 11/513,160, filed Aug. 31, 2006.
BPAI Interference No. 105,749, *Shafer v. Omura*, Omura Exhibit #1012—File history for U.S. Appl. No. 11/513,160, filed Aug. 31, 2006.
BPAI Interference No. 105,749, *Shafer v. Omura*, Omura Exhibit #1013—U.S. Appl. No. 11/266,288, filed Nov. 4, 2005.
BPAI Interference No. 105,749, *Shafer v. Omura*, Omura Exhibit #1014—File history for U.S. Appl. No. 11/266,288, filed Nov. 4, 2005.
BPAI Interference No. 105,749, *Shafer v. Omura*, Omura Exhibit #1015—International Patent Application No. PCT/JP2004/006417, filed May 6, 2004.
BPAI Interference No. 105,749, *Shafer v. Omura*, Omura Exhibit #1016—Sworn translation of International Patent Application No. PCT/JP2004/006417, filed May 6, 2004.
BPAI Interference No. 105,749, *Shafer v. Omura*, Omura Exhibit #1017—Certified Japanese Patent Application No. 2003-364596, filed Oct. 24, 2003.
BPAI Interference No. 105,749, *Shafer v. Omura*, Omura Exhibit #1018—Sworn translation of Japanese Patent Application No. 2003-364596, filed Oct. 24, 2003.
BPAI Interference No. 105,749, *Shafer v. Omura*, Omura Exhibit #1019—U.S. Appl. No. 11/653,366, filed Jan. 16, 2007.
BPAI Interference No. 105,749, *Shafer v. Omura*, Omura Exhibit #1020—Claim Chart Showing Omura's Entitlement to Benefit.
BPAI Interference No. 105,749, *Shafer v. Omura*, Omura Exhibit #1021—ZEMAX lens data for Omura Figure 14.
BPAI Interference No. 105,749, *Shafer v. Omura*, Omura Exhibit #1022—ZEMAX lens data for Omura Figure 15.
BPAI Interference No. 105,749, *Shafer v. Omura*, Omura Exhibit #1023—ZEMAX lens data for Omura Figure 16.
BPAI Interference No. 105,749, *Shafer v. Omura*, Omura Exhibit #1024—File history for U.S. Patent No. 7,309,870, issued Dec. 18, 2007.
BPAI Interference No. 105,749, *Shafer v. Omura*, Omura Exhibit #1025—Declaration of Yasuhiro Omura.
BPAI Interference No. 105,678, Notice of Appeal filed Apr. 5, 2010; 20 pages.
BPAI Interference No. 105,678, Brief of Appellant Omura filed Aug. 30, 2010.
BPAI Interference No. 105,678, Corrected Appellees Brief dated Oct. 25, 2010.
BPAI Interference No. 105,678, Reply Brief of Appellant Omura filed Nov. 29, 2010; 36 pages.
Federal Circuit opinion in Interference No. 105,678, Decided: Apr. 8, 2011.
Ulrich. "The Development of Dioptric Projection Lenses for DUV Lithography." *International Optical Design Conference*, Proc. of SPIE 4832 (2002).
Levinson. "Chapter 5: Wafer Steppers." *Principles of Lithography*. Bellingham, WA: SPIE, 2001. 150-185.
Malacara and Moore. "Chapter 4: Prisms and Refractive Optical Components." *Handbook of Optical Engineering*. NY: Marcel Dekker, 2001. 142-43.
SPIE 28$^{th}$ Annual International Symposium and Education Program on Microlithography, 5040: Optical Microlithography XVI, Feb. 23-28, 2003, Santa Clara, CA USA. 263-264.
Jacobs et al., "Expansion hysteresis upon thermal cycling of Zerodur," Applied Optics, 23(17), Sep. 1, 1984.
Lindig et al., Applied Optics, 24(2), Oct. 15, 1985.
Sworn Translation of International Patent Application No. PCT/JP2004/006417, filed May 6, 2004.
Certified Japanese Application No. 2003-364596, filed Oct. 24, 2003.
Sworn Translation of Japanese Application No. 2003-364596, filed Oct. 24, 2003.
Claim Chart Showing Omura's Entitlement to Benefit.
Declaration of Mitchell C. Ruda, Ph.D.
Curriculum vitae of Mitchell C. Ruda, Ph.D.
Warren Smith, "Modern Optical Engineering," 123-25 (McGraw Hill 1966).
File history for U.S. Appl. No. 11/266,288, filed Nov. 4, 2005. (submitted in 4 separate documents due to size).
Declaration of Richard C. Juergens dated Jun. 1, 2009.
*Curriculum Vitae* of Richard C. Juergens.
U.S. Appl. No. 60/654,950 to David Shafer, filed Feb. 23, 2005.
Office communication mailed on Jan. 6, 2009, in Shafer's Involved Application, U.S. Appl. No. 11/653,366.
Filing Receipt mailed Feb. 12, 2007, in Shafer's Involved Application, U.S Appl. No. 11/653,366.
Information Disclosure Statement filed on Oct. 20, 2006, in Omura's '934 Application, U.S. Appl. No. 11/583,934.
Combined Declaration and Power of Attorney submitted on Oct. 20, 2006, in Omura's '934 Application, U.S. Appl. No. 11/583,934.
Combined Declaration and Power of Attorney submitted on Feb. 7, 2006, in Omura's Parent Application.
Notice of allowance mailed on Aug. 14, 2007, in Omura's '934 Application, U.S. Appl. No. 11/583,934.
Issue Fee Payment mailed on Nov. 2, 2007, in Omura's '934 Application, U.S Appl. No. 11/583,934.
Claims marked to show differences between: (1) Omura's '934 Application, U.S. Appl. No. 11/583,934, filed Oct. 20, 2006 and (2) Shafer's Published PCT Application, WO 2006/005547 to Shafer et al., published on Jan. 19, 2006.
Requirement for Restriction/Election mailed on Apr. 4, 2007, in Omura's Sister Application, U.S. Appl. No. 11/513,160.
Reply to Election of Species Requirement filed on Apr. 27, 2007, in Omura's Sister Application, U.S. Appl. No. 11/513,160.
Office Communication mailed on Jul. 5, 2007, in Omura's Sister Application, U.S. Appl. No. 11/513,160.
Supplemental Reply to Election of Species Requirement filed on Oct. 3, 2007, in Omura's Sister Application, U.S. Appl. No. 11/513,160.
Non-Final Rejection mailed on Dec. 12, 2007, in Omura's Sister Application, U.S. Appl. No. 11/513,160.
Amendment filed on Apr. 9, 2008, in Omura's Sister Application, U.S. Appl. No. 11/513,160.
Final Rejection mailed on Jul. 14, 2008, in Omura's Sister Application, U.S. Appl. No. 11/513,160.
Notice of Appeal filed on Jan. 14, 2009, in Omura's Sister Application, U.S. Appl. No. 11/513,160.
Omura et al., *Catadioptric lens development for DUV and VUV projection optics*, Optical Microlithography XVI, Proc. SPIE vol. 5040, pp. 781-788 (2003).
Optical Prescription Data cited in Declaration of Richard C. Juergens dated Jun. 1, 2009.
Claim Chart Showing Exemplary Common Disclosure in Shafer Involved Application, Shafer's PCT Application, and Shafer's '950 Provisional Relevant to the Count.
Threshold issue, 68 Fed. Reg. 66,648; 66,664; and 66,689 (Nov. 26, 2003).
Threshold issue, 69 Fed. Reg. 49,960; 49,969; 49,991; and 50,019 (Aug. 12, 2004) (to be codified at 37 C.F.R. § 41.201).
Harry J. Levinson, "Principles of Lithography," SPIE, 2001, pp. 150-167.

Warren J. Smith, "Modern Optical Engineering: The Design of Optical Systems," 3rd Edition, McGraw-Hill, New York, 2000, pp. 487-492.
James R. Sheats et al., "Microlithography: Science and Technology," Marcel Dekker, Inc. New York, 1998, pp. 261-270.
P. Rai-Choudhury, "Handbook of Microlithography, Micromachining, and Microfabrication: vol. 1: Microlithogtaphy," SPIE, 1997, pp. 82-126.
U.S Court of Appeals for the Federal Circuit 2008-1466, *Agilent Technologies, Inc.* v. *Affymetrix, Inc.*, Appeal from the US District Court for Northern California District of California in Case No. 06-CV-05958, Judge James Ware, dated Jun. 4, 2009 (26 pages).
Translation of PCT/JP01/09266, filed Oct. 23, 2003, publication No. WO 2002/35273, published May 2, 2002.
Matsuyama et al., "Nikon Projection Lens Update," Optical Microlithography XVII, Proceeding of SPIE, vol. 5377, pp. 730-741.
Warren Smith, "Modern Optical Engineering," 3rd edition, Chapter 13, pp. 439-502 (2000).
BPAI Interference No. 105,678, *Omura* v. *Shafer*, Notice to Declare Interference, filed Jan. 30, 2009.
BPAIi Interference No. 105,678, *Omura* v. *Shafer*, Standing Order, filed Jan. 30, 2009.
BPAI Interference No. 105,678, *Omura* v. *Shafer*, Omura Designation of Lead and Backup Counsel, filed Feb. 13, 2009.
BPAI Interference No. 105,678, *Omura* v. *Shafer*, Omura Notice of Real Party in Interest, filed Feb. 13, 2009.
BPAI Interference No. 105,678, *Omura* v. *Shafer*, Omura Notice of Related Proceedings, filed Feb. 13, 2009.
BPAI Interference No. 105,678, *Omura* v. *Shafer*, Omura Clean Copy of Claims, filed Feb. 13, 2009.
BPAI Interference No. 105,678, *Omura* v. *Shafer*, Omura Request for Copies, filed Feb. 13, 2009.
BPAI Interference No. 105,678, *Omura* v. *Shafer*, Shafer Designation of Lead Attorney, filed Feb. 13, 2009.
BPAIi Interference No. 105,678, *Omura* v. *Shafer*, Shafer Notice of Real Party in Interest, filed Feb. 13, 2009.
BPAI Interference No. 105,678, *Omura* v. *Shafer*, Shafer Notice of Related Proceedings, filed Feb. 13, 2009.
BPAI Interference No. 105,678, *Omura* v. *Shafer*, Shafer Clean Copy of Claims, filed Feb. 13, 2009.
BPAI Interference No. 105,678, *Omura* v. *Shafer*, Schafer File Copy Request, filed Feb. 13, 2009.
BPAI Interference No. 105,678, *Omura* v. *Shafer*, Order Bd.R. 109(B) Authorizing Office Records, filed Feb. 23, 2009.
BPAI Interference No. 105,678, *Omura* v. *Shafer*, Omura Annotated Claims, filed Feb. 27, 2009.
BPAI Interference No. 105,678, *Omura* v. *Shafer*, Shafer Annotated Claims, filed Feb. 27, 2009.
BPAI Interference No. 105,678, *Omura* v. *Shafer*, Shafer Designation of New Lead Counsel, filed Mar. 6, 2009.
BPAI Interference No. 105,678, *Omura* v. *Shafer*, Omura Notice of Non-Receipt of File Copies, filed Mar. 17, 2009.
BPAI Interference No. 105,678, *Omura* v. *Shafer*, Shafer Notice of Missing Copies, filed Mar. 17, 2009.
BPAI Interference No. 105,678, *Omura* v. *Shafer*, Shafer Supplemental Notice of Related Proceeding, filed Mar. 23, 2009.
BPAI Interference No. 105,678, *Omura* v. *Shafer*, Shafer Motion List, filed Mar. 25, 2009.
BPAI Interference No. 105,678, *Omura* v. *Shafer*, Omura Motion List, filed Mar. 25, 2009.
BPAI Interference No. 105,678, *Omura* v. *Shafer*, Shafer Notice of Updated Lead Counsel Contact Information, filed Mar. 30, 2009.
BPAI Interference No. 105,678, *Omura* v. *Shafer*, Order Motion Times Bd.R.104(c), filed Mar. 31, 2009.
BPAI Interference No. 105,678, *Omura* v. *Shafer*, Omura Designation of New Lead and Backup Attorneys, filed Apr. 1, 2009.
BPAI Interference No. 105,678, *Omura* v. *Shafer*, Joint Stipulation to Extend Time Periods 1-4, filed May 5, 2009.
BPAI Interference No. 105,678, *Omura* v. *Shafer*, Shafer Submission of Appointment of Additional Attorney, filed May 18, 2009.
BPAI Interference No. 105,678, *Omura* v. *Shafer*, Shafer Designation of Additional Backup Lead Counsel, filed May 18, 2009.
BPAI Interference No. 105,678, *Omura* v. *Shafer*, Shafer Substantive Motion 1, filed Jun. 2, 2009.
BPAI Interference No. 105,678, *Omura* v. *Shafer*, Shafer Substantive Motion 2, filed Jun. 2, 2009.
BPAI Interference No. 105,678, *Omura* v. *Shafer*, Shafer Substantive Motion 3, filed Jun. 2, 2009.
BPAI Interference No. 105,678, *Omura* v. *Shafer*, Shafer Notice of Filing Priority Statement, filed Jun. 2, 2009.
BPAI Interference No. 105,678, *Omura* v. *Shafer*, Shafer Exhibit List (as of Jun. 2, 2009), filed Jun. 2, 2009.
BPAI Interference No. 105,678, *Omura* v. *Shafer*, Shafer Priority Statement, filed Jun. 2, 2009.
BPAI Interference No. 105,678, *Omura* v. *Shafer*, Omura Notice of Filing Priority Statement, filed Jun. 2, 2009.
BPAI Interference No. 105,678, *Omura* v. *Shafer*, Omura Motion 1, filed Jun. 2, 2009.
BPAI Interference No. 105,678, *Omura* v. *Shafer*, Omura Exhibit List, filed Jun. 2, 2009.
BPAI Interference No. 105,678, *Omura* v. *Shafer*, Omura Priority Statement, filed Jun. 2, 2009.
BPAI Interference No. 105,678, *Omura* v. *Shafer*, Shafer Notice of Serving Priority Statement, filed Jun. 9, 2009.
BPAI Interference No. 105,678, *Omura* v. *Shafer*, Omura Notice of Serving Priority Statement, filed Jun. 9, 2009.
BPAI Interference No. 105,678, *Omura* v. *Shafer*, Order Miscellaneous Bd.R. 104(c), filed Jun. 17, 2009.
BPAI Interference No. 105,678, *Omura* v. *Shafer*, Omura Notice Regarding Responsive Motions, filed Jun. 23, 2009.
BPAI Interference No. 105,678, *Omura* v. *Shafer*, Shafer Submission of Appointment of Additional Attorney, filed Jul. 15, 2009.
BPAI Interference No. 105,678, *Omura* v. *Shafer*, Shafer Designation of Additional Backup Lead Counsel, filed Jul. 15, 2009.
BPAI Interference No. 105,678, *Omura* v. *Shafer*, Joint Stipulation to Extend Time Periods 3 and 4, filed Jul. 31, 2009.
BPAI Interference No. 105,678, *Omura* v. *Shafer*, Second Joint Stipulation to Extend Time Periods 3 and 4, filed Aug. 10, 2009.
BPAI Interference No. 105,678, *Omura* v. *Shafer*, Third Joint Stipulation to Extend Time Periods 3 and 4, filed Aug. 21, 2009.
BPAI Interference No. 105,678, *Omura* v. *Shafer*, Omura Response to Shafer Motion 1, filed Aug. 26, 2009.
BPAI Interference No. 105,678, *Omura* v. *Shafer*, Decision on Motions, filed Aug. 31, 2009.
BPAI Interference No. 105,678, *Omura* v. *Shafer*, Judgment Request for Adverse, filed Aug. 31, 2009.
Deposition of Mitchell C. Ruda, Ph.D., Jul. 23, 2009.
Deposition of Richard C. Juergens, Jul. 17, 2009.
Bal, Matthieu Frédéric, dissertation "Next-Generation Extreme Ultraviolet Lithographic Projection Systems", Chapter 6, (Feb. 10, 2003).
BPAI Interference No. 105,834, *Omura* v. *Shafer*, Declaration 13 Bd.R. 203(b)1, filed Aug. 30, 20011.
BPAI Interference No. 105,834, *Omura* v. *Shafer*, Standing Order, filed Aug. 30, 2011.
BPAI Interference No. 105,834, *Omura* v. *Shafer*, Omura Notice of Real Party in Interest, dated Sep. 13, 2011.
BPAI Interference No. 105,834, *Omura* v. *Shafer*, Omura Notice of Related Proceedings, filed Sep. 13, 2011.
BPAI Interference No. 105,834, *Omura* v. *Shafer*, Shafer Designation of Lead and Backup Lead Counsel, filed Sep. 13, 2011.
BPAI Interference No. 105,834, *Omura* v. *Shafer*, Shafer Notice of Real Party-in-Interest, filed Sep. 13, 2011.
BPAI Interference No. 105,834, *Omura* v. *Shafer*, Shafer Notice of Related Proceedings, filed Sep. 13, 2011.
BPAI Interference No. 105,834, *Omura* v. *Shafer*, Shafer Clean Copy of Claims, filed Sep. 13, 2011.
BPAI Interference No. 105,834, *Omura* v. *Shafer*, Shafer Request for File Copies, filed Sep. 13, 2011.
BPAI Interference No. 105,834, *Omura* v. *Shafer*, Shafer Submission of Appointment of Additional Attorney, filed Sep. 13, 2011.
BPAI Interference No. 105,834, *Omura* v. *Shafer*, Omura Designation of Lead and Backup Attorneys, filed Sep. 13, 2011.
BPAI Interference No. 105,834, *Omura* v. *Shafer*, Omura Request for File Copies, filed Sep. 13, 2011.

BPAI Interference No. 105,834, *Omura v. Shafer*, Omura Clean Copy of Claims, filed Sep. 13, 2011.
BPAI Interference No. 105,834, *Omura v. Shafer*, Order—Bd.R. 109(b)—Authorizing Office Records, filed Sep. 15, 2011.
BPAI Interference No. 105,834, *Omura v. Shafer*, Shafer Annotated Claims, filed Sep. 27, 2011.
BPAI Interference No. 105,834, *Omura v. Shafer*, Omura Annotated Claims, filed Sep. 27, 2011.
BPAI Interference No. 105,834, *Omura v. Shafer*, Shafer Motions List, filed Oct. 19, 2011.
BPAI Interference No. 105,834, *Omura v. Shafer*, Omura Motions List, filed Oct. 19, 2011.
BPAI Interference No. 105,834, *Omura v. Shafer*, Order—Motion Times—Bd.R. 104(c), filed Oct. 27, 2011.
BPAI Interference No. 105,834, *Omura v. Shafer*, Shafer Substantive Motion 1, filed Nov. 7, 2011.
BPAI Interference No. 105,834, *Omura v. Shafer*, Shafer List of Exhibits, filed Nov. 7, 2011.
BPAI Interference No. 105,834, *Omura v. Shafer*, Order—Miscellaneous—Bd.R. 104(a), filed Nov. 10, 2011.
BPAI Interference No. 105,834, *Omura v. Shafer*, Order—Miscellaneous—Bd.R. 104(a), filed Nov. 18, 2011.
BPAI Interference No. 105,834, *Omura v. Shafer*, Omura Opposition 1, filed Nov. 30, 2011.
BPAI Interference No. 105,834, *Omura v. Shafer*, Omura First Exhibit List, filed Nov. 30, 2011.
BPAI Interference No. 105,834, *Omura v. Shafer*, Order—Miscellaneous—Bd.R. 104(a), filed Dec. 5, 2011.
BPAI Interference No. 105,834, *Omura v. Shafer*, Joint Stipulation to Extend Time Periods 1 Through 4, filed Dec. 8, 2011.
BPAI Interference No. 105,834, *Omura v. Shafer*, Joint Stipulation to Extend Time Period 1, filed Dec. 23, 2011.
BPAI Interference No. 105,834, *Omura v. Shafer*, Order—Miscellaneous—Bd.R. 104(a), filed Jan. 4, 2012.
BPAI Interference No. 105,834, *Omura v. Shafer*, Shafer Substantive Motion 3, filed Jan. 10, 2012.
BPAI Interference No. 105,834, *Omura v. Shafer*, Shafer Substantive Motion 4, filed Jan. 10, 2012.
BPAI Interference No. 105,834, *Omura v. Shafer*, Shafer Updated List of Exhibits, filed Jan. 10, 2012.
BPAI Interference No. 105,834, *Omura v. Shafer*, Shafer Substantive Motion 2, filed Jan. 10, 2012.
BPAI Interference No. 105,834, *Omura v. Shafer*, Notice of Filing of Shafer Priority Statement, filed Jan. 10, 2012.
BPAI Interference No. 105,834, *Omura v. Shafer*, Omura Motion 1, filed Jan. 10, 2012.
BPAI Interference No. 105,834, *Omura v. Shafer*, Omura Notice of Filing Priority Statement, filed Jan. 10, 2012.
BPAI Interference No. 105,834, *Omura v. Shafer*, Omura Priority Statement, filed Jan. 10, 2012.
BPAI Interference No. 105,834, *Omura v. Shafer*, Omura Second Exhibit List, filed Jan. 10, 2012.
BPAI Interference No. 105,834, *Omura v. Shafer*, Omura Exhibit 1004—Restatement of the Law, Second, Judgments, § 27(1982).
BPAI Interference No. 105,834, *Omura v. Shafer*, Omura Exhibit 1005—Requirement for Restriction in U.S. Appl. No. 12/816,863, dated Nov. 29, 2010.
BPAI Interference No. 105,834, *Omura v. Shafer*, Omura Exhibit 1006—Amendment in Response to Office Communication in U.S. Appl. No. 12/816,863, dated Nov. 29, 2010.
BPAI Interference No. 105,834, *Omura v. Shafer*, Omura Exhibit 1010—Suggestion of Interference Under Bd. R. 202(a) dated Mar. 28, 2011, in U.S. Appl. No. 12/816,863 to Shafer et al.
BPAI Interference No. 105,834, *Omura v. Shafer*, Omura Exhibit 1011—MPEP 802.01.
BPAI Interference No. 105,834, *Omura v. Shafer*, Omura Exhibit 1012—U.S. Appl. No. 13/081,394 to Shafer et al.
BPAI Interference No. 105,834, *Omura v. Shafer*, Omura Exhibit 1013—U.S. Appl. No. 13/275,760 to Omura.
BPAI Interference No. 105,834, *Omura v. Shafer*, Omura Exhibit 1016—Board Rule 202(a).
BPAI Interference No. 105,834, *Omura v. Shafer*, Shafer Ex. 2005, Judgment—Merits—Bd.R. 127, Interference No. 105,749, Paper No. 157, filed Jun. 29, 2011.

BPAI Interference No. 105,834, *Omura v. Shafer*, Shafer Ex. 2016, Omura Request for Rehearing, Interference No. 105,678, Paper No. 50, filed Sep. 30, 2009.
BPAI Interference No. 105,834, *Omura v. Shafer*, Shafer Ex. 2017, Decision—Request for Rehearing—Bd.R. 127(d), Interference No.
BPAI Interference No. 105,834, *Omura v. Shafer*, Shafer Ex. 2019, Ex parte Robert F. Shaw, 2004 WL 5580635 (Bd.Pat.App. & Interf., May 24, 2004).
BPAI Interference No. 105,834, *Omura v. Shafer*, Shafer, Ex. 2029, Declaration of Richard C. Juergens, dated Jan. 9, 2012.
BPAI Interference No. 105,834, *Omura v. Shafer*, Shafer, Ex. 2034, U.S. Appl. No. 60/536,248 by Shafer et al., filed Jan. 14, 2004 (the "'248 Provisional").
BPAI Interference No. 105,834, *Omura v. Shafer*, Shafer, Ex. 2036, Inventor declaration filed in U.S. Appl. No. 11/583,934 to Yasuhiro Omura.
BPAI Interference No. 105,834, *Omura v. Shafer*, Shafer, Ex. 2039, Code V sequences for the embodiments shown in Fig. 7 of Shafer's Involved Application, Figs. 4 and 7 in the '248 Provisional, and Figs.5, 7, 9, 10, and 14-16 in the Omura Parent Application.
BPAI Interference No. 105,834, *Omura v. Shafer*, Shafer, Ex. 2040, Judgment—Order to Show Cause—Bd.R. 127(a)(2), Interference No. 105,753, Paper No. 41, filed Jun. 14, 2011.
BPAI Interference No. 105,834, *Omura v. Shafer*, Shafer, Ex. 2048, Declaration and Power of Attorney for Patent Application, filed Jun. 16, 2010, in Shafer's Involved Application.
BPAI Interference No. 105,834, *Omura v. Shafer*, Shafer, Ex. 2049, Preliminary Amendment, filed Jun. 16, 2010, in Shafer's Involved Application.
BPAI Interference No. 105,834, *Omura v. Shafer*, Shafer, Ex. 2050, Office Action, mailed Jun. 2, 2011, in Shafer's Involved Application.
BPAI Interference No. 105,834, *Omura v. Shafer*, Shafer, Ex. 2051, Filing Receipt, mailed Jun. 29, 2010, in Shafer's Involved Application.
BPAI Interference No. 105,834, *Omura v. Shafer*, Shafer, Ex. 2052, Filing Receipt, mailed Feb. 12, 2007, in Shafer's Parent Application.
BPAI Interference No. 105,834, *Omura v. Shafer*, Shafer, Ex. 2053, Declaration and Power of Attorney for Patent Application, filed Jun. 12, 2007, in Shafer's Parent Application.
BPAI Interference No. 105,834, *Omura v. Shafer*, Shafer, Ex. 2054, Notice to File Corrected Application Papers, mailed Jun. 29, 2010, in Shafer's Involved Application.
BPAI Interference No. 105,834, *Omura v. Shafer*, Shafer, Ex. 2055, Notice to File Missing Parts of Nonprovisional Application, mailed Mar. 15, 2005, in the '103 Application.
BPAI Interference No. 105,834, *Omura v. Shafer*, Shafer, Ex. 2056, Issue Notification, mailed May 21, 2008, in the '103 Application.
BPAI Interference No. 105,834, *Omura v. Shafer*, Shafer, Ex. 2057, Declaration and Power of Attorney for Patent Application, filed May 16, 2005, in the '103 Application.
Dejager, D., "Camera Viewfinder Using Tilted Concave Mirror Erecting Elements," SPIE vol. 237, 1980 International Lens Design Conference (OSA) pp. 292-298 (1980).
Freeman, M.H., "Innovative Wide-Field Binocular Design," OSA Proceedings of the International Optical Design Conference (OSA), vol. 22, pp. 389-393 (1994).
M. Switkes et al., "Resolution Enhancement of 157-nm Lithography by Liquid Immersion," Proc. SPIE vol. 4691, Optical Microlithography XV, pp. 459-465, Jul. 2002.
Tomoyuki Matsuyama, et al "Nikon Projection Lens Update", in Optical Microlithography XVII, Proc. of SPIE , vol. 5377.65 (2004).
Tomoyuki Matsuyama, et al. "Microlithographic Lens for DUV Scanner", SPIE vol. 4832, Dec. 2002, Conference Jun. 3-7, 2002, pp. 170-174.
Tomoyuki Matsuyama, et al, "High Na and Low Residual Aberration Projection Lens for DUV Scanner", SPIE, vol. 4691, (2002) pp. 687-695.
Willi Ulrich et al, "Trends in Optical Design of Projection Lenses for UV-and EUV-Lithography", Proc. of SPIE vol. 4146 (2000).
E. Glatzel, "New Lenses for Microlithography", SPIE vol. 237 (1980), pp. 310-320.

\* cited by examiner

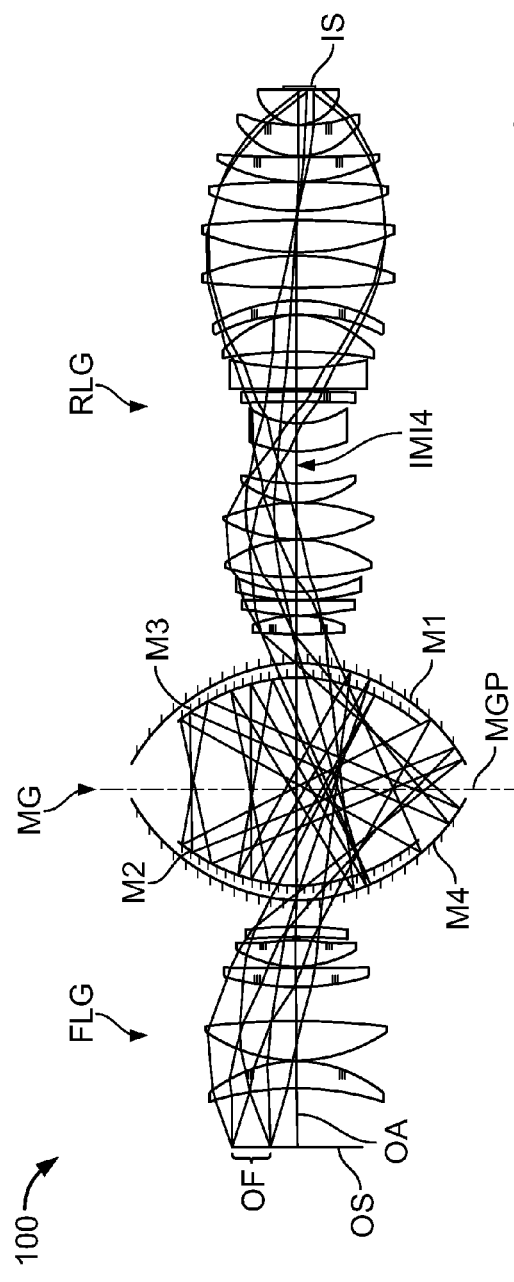
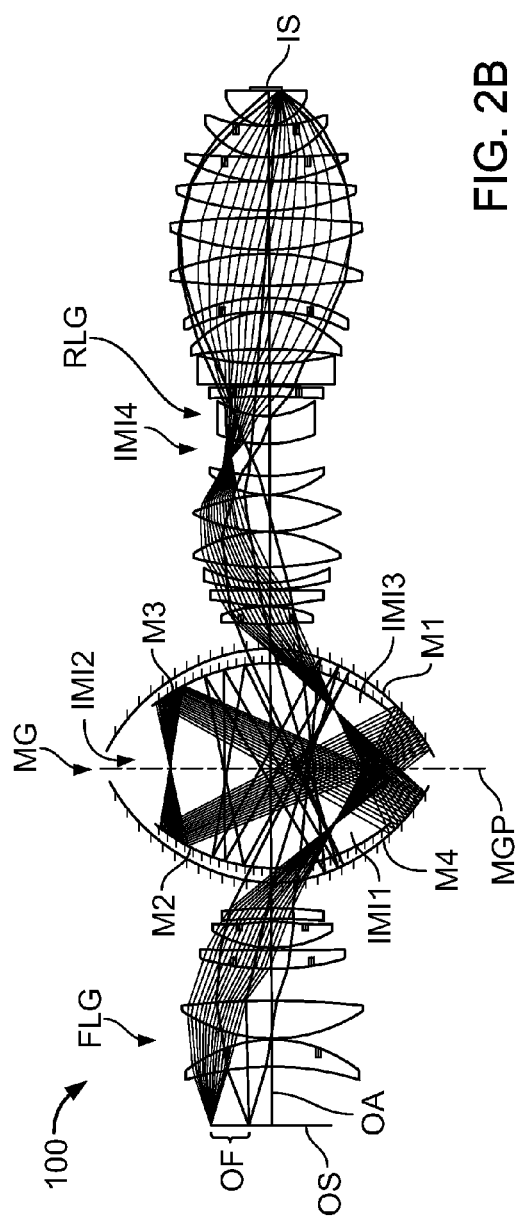
FIG. 2A
FIG. 2B

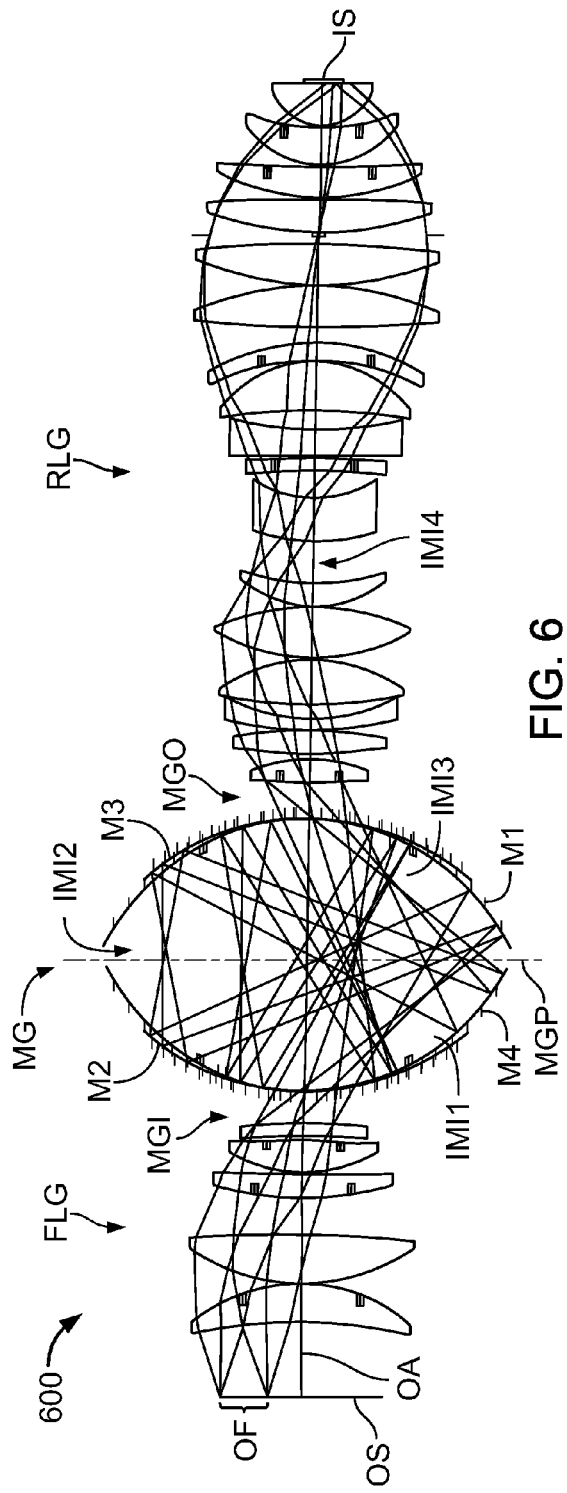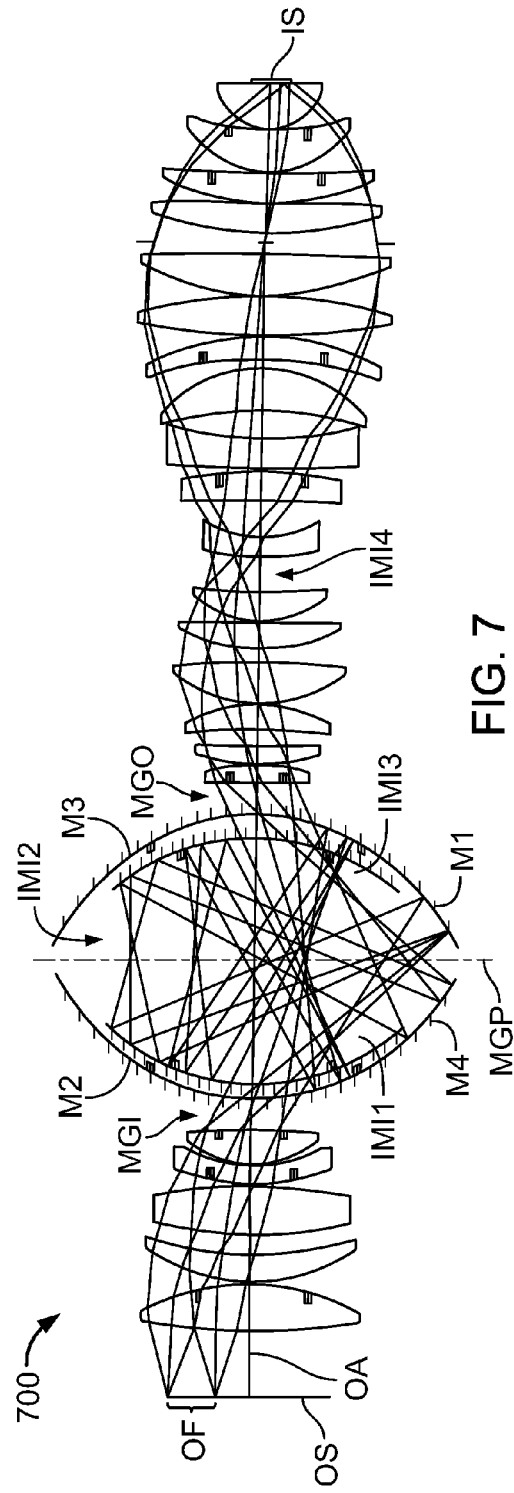

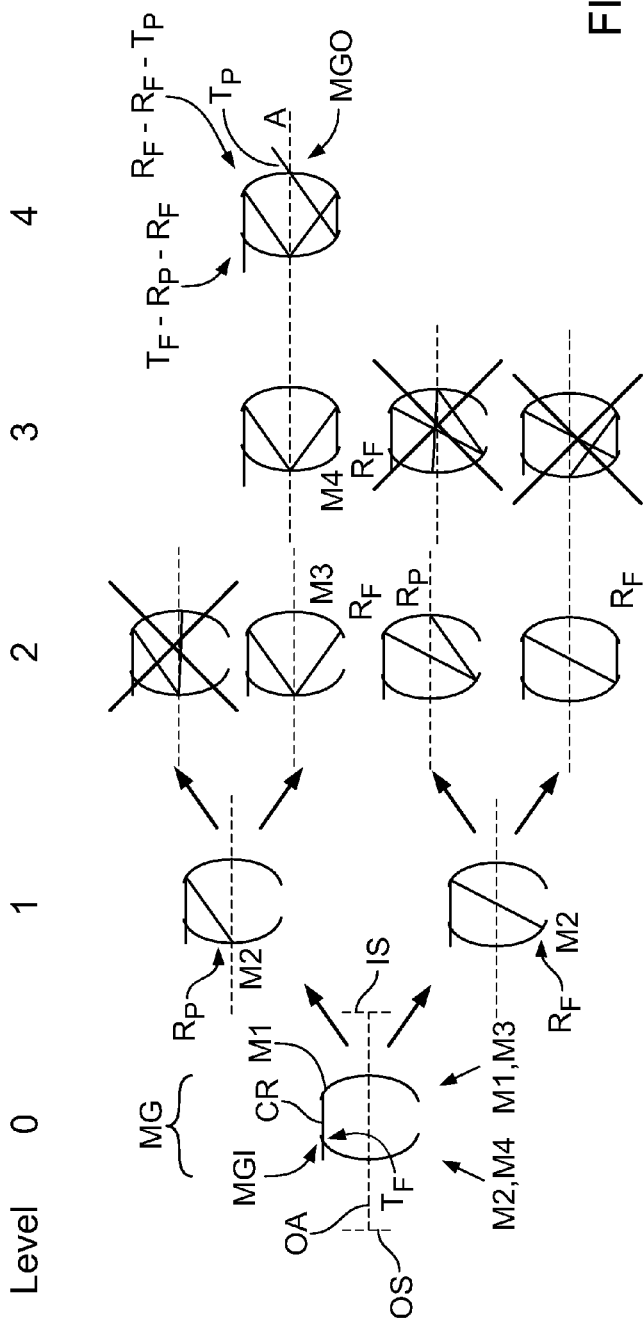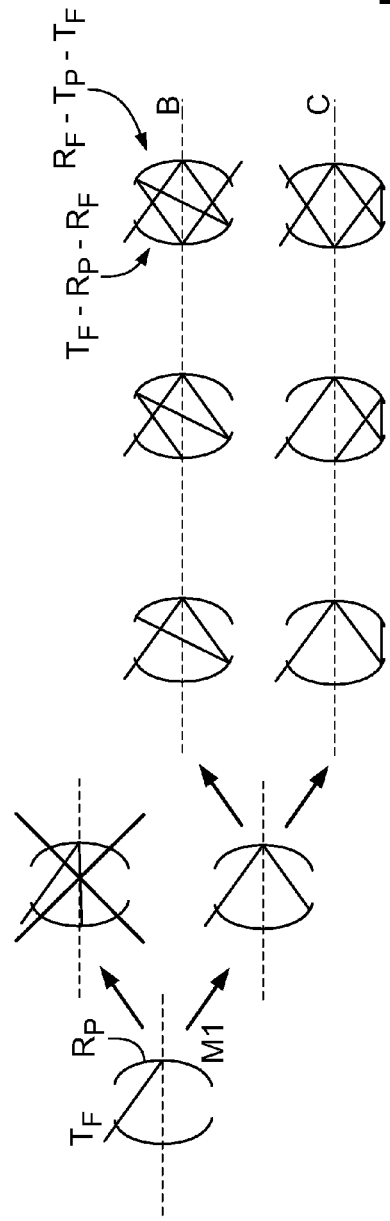
FIG. 8A
FIG. 8B

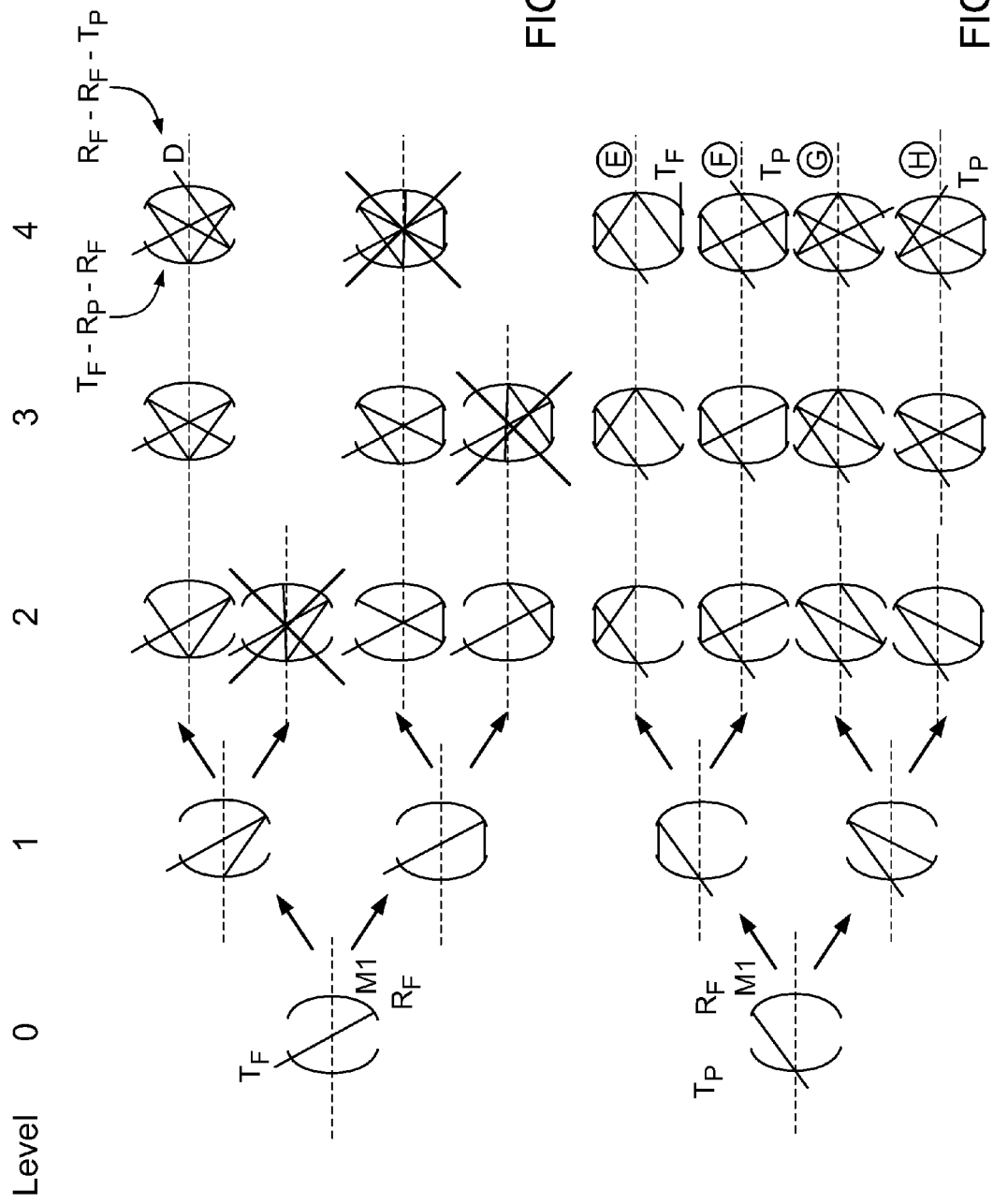

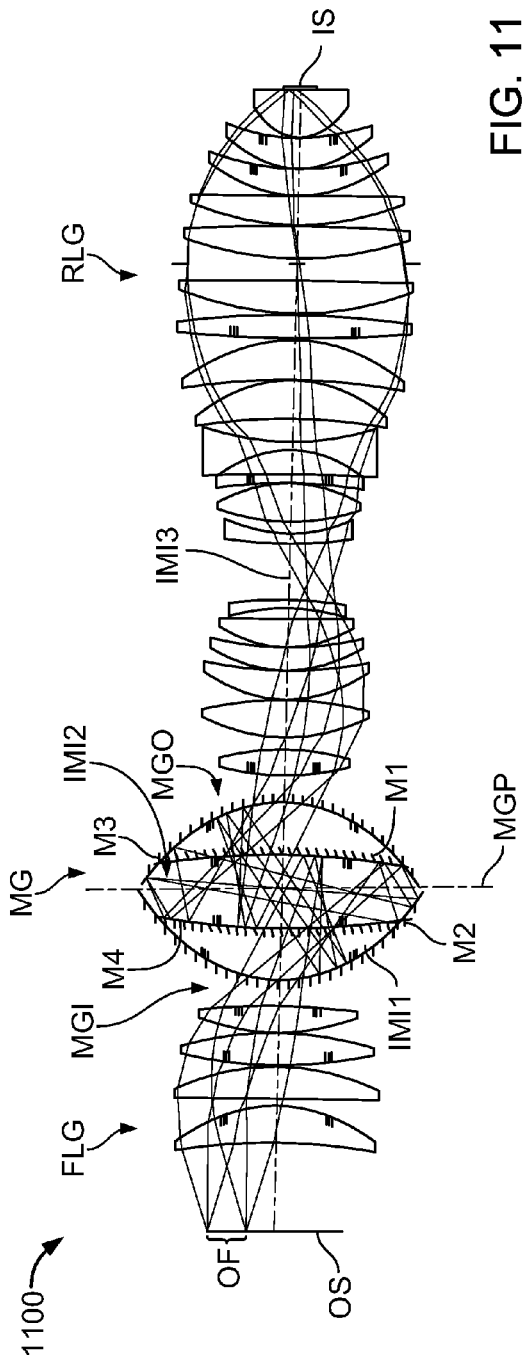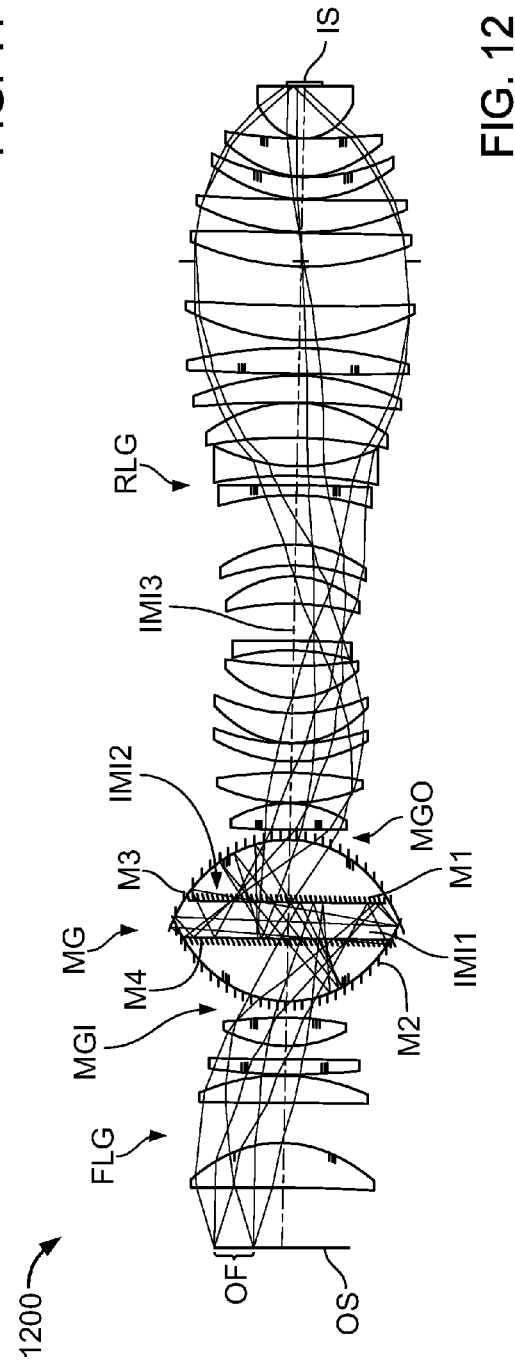

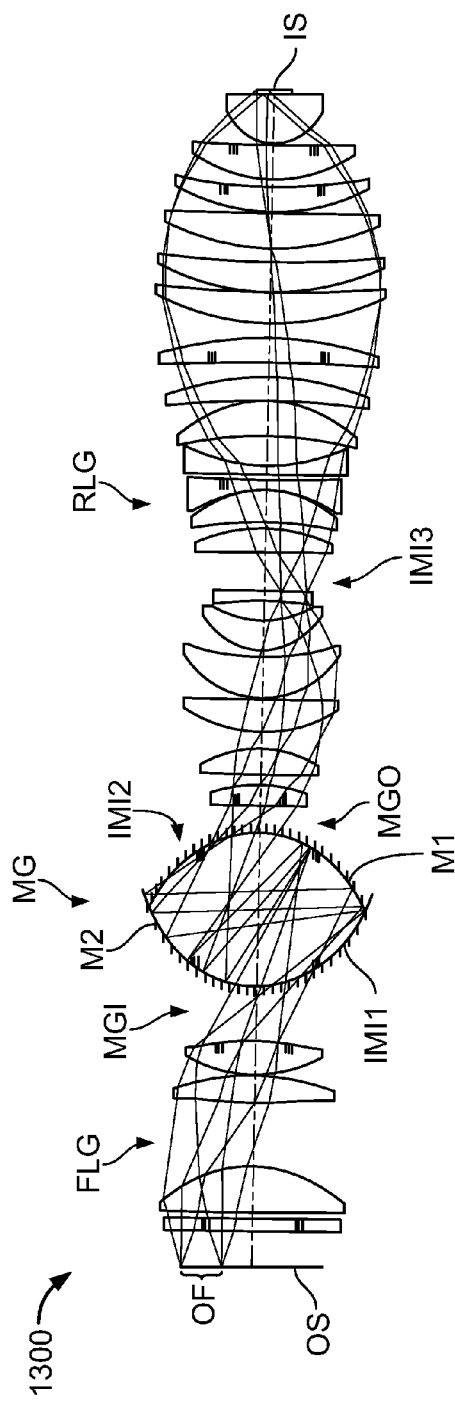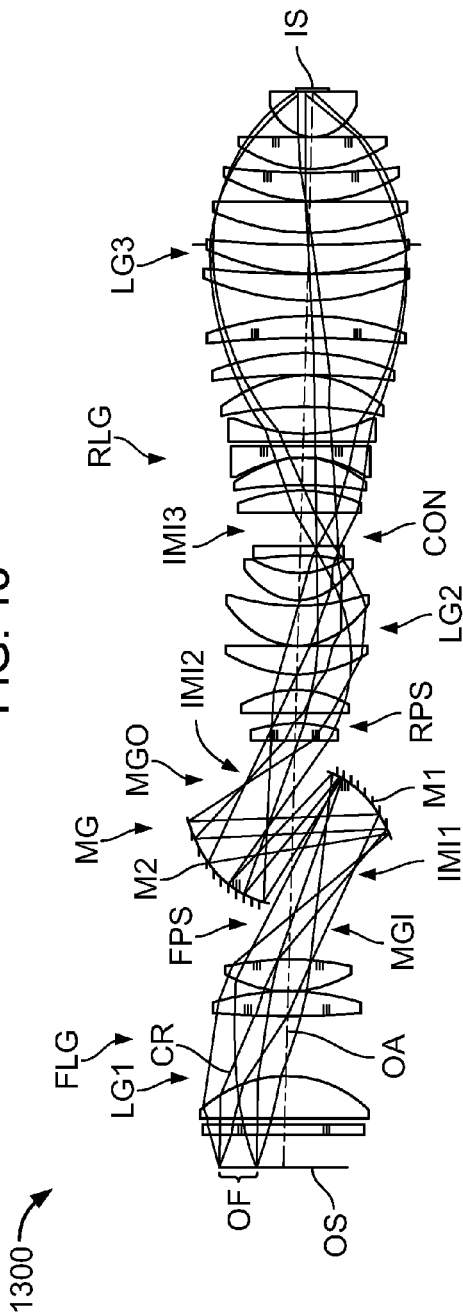

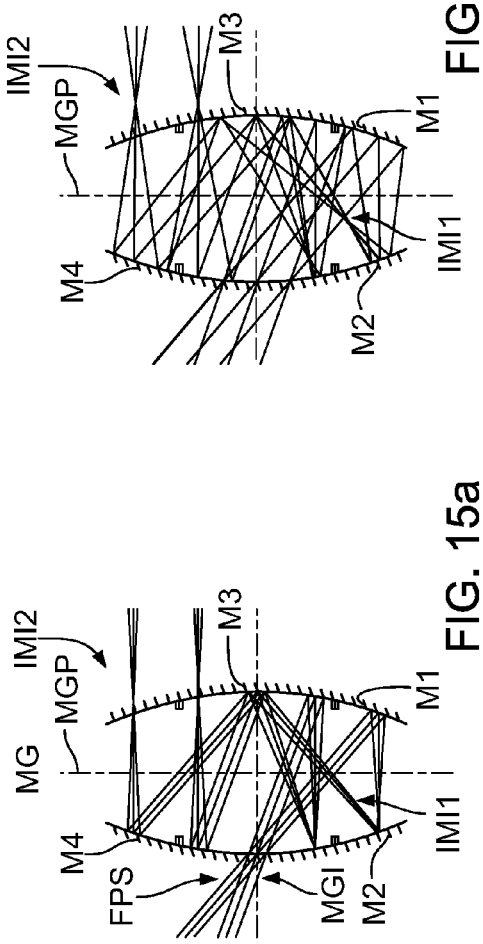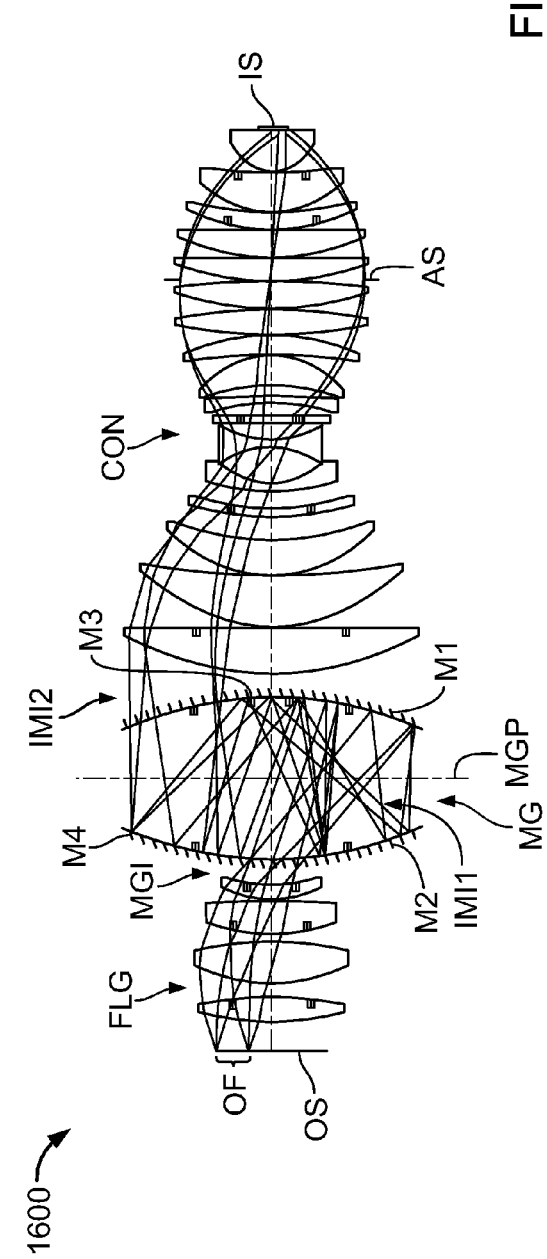

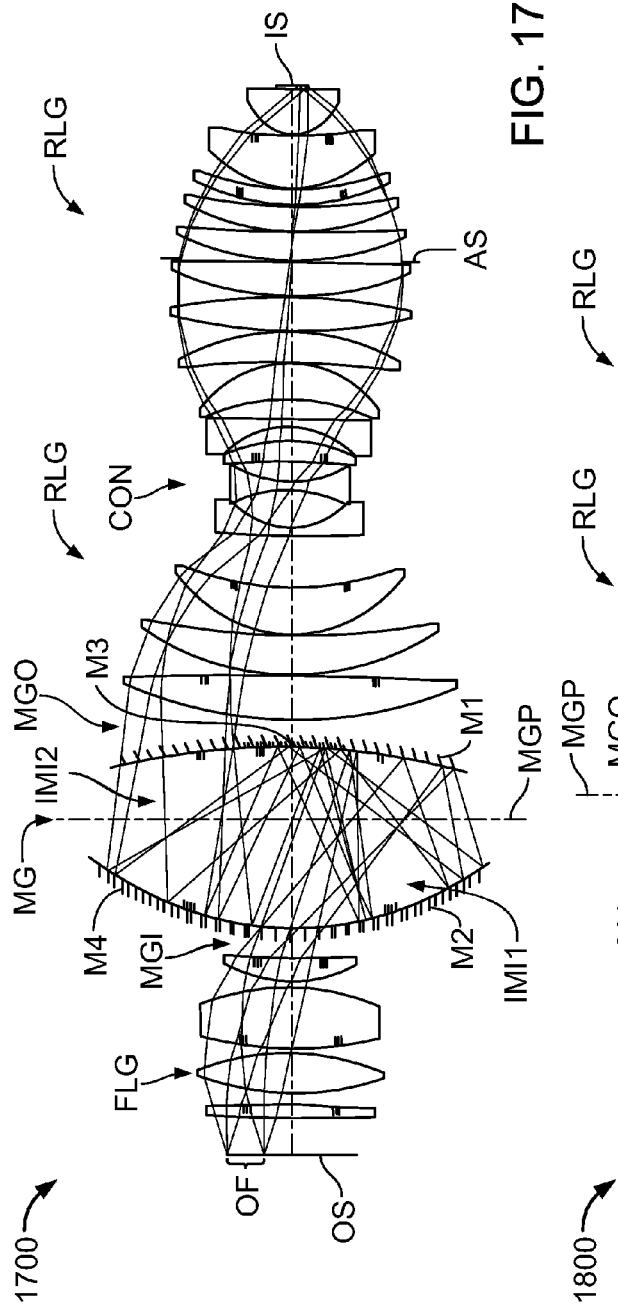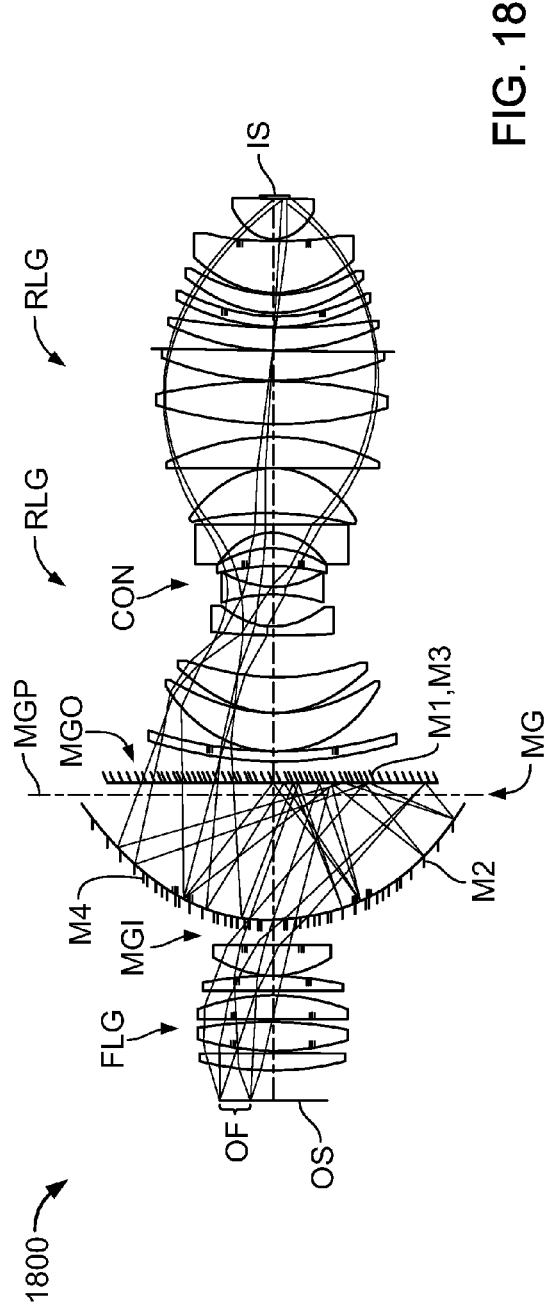
FIG. 17
FIG. 18

CATADIOPTRIC PROJECTION OBJECTIVE WITH MIRROR GROUP

This application claims priority from U.S. provisional application 60/560,267 filed on Apr. 8, 2004. The complete disclosure of that provisional application is incorporated into this application by reference.

BACKGROUND OF THE INVENTION

1. Field of the Invention

The invention relates to a catadioptric projection objective for imaging an off-axis object field arranged in an object surface of the projection objective onto an off-axis image field arranged in an image surface of the projection objective while creating at least one intermediate image.

2. Description of the Related Art

Catadioptric projection objectives are, for example, employed in projection exposure systems, in particular wafer scanners or wafer steppers, used for fabricating semiconductor devices and other types of microdevices and serve to project patterns on photomasks or reticles, hereinafter referred to generically as "masks" or "reticles," onto an object having a photosensitive coating with ultrahigh resolution on a reduced scale.

In order to create even finer structures, it is sought to both increase the image-end numerical aperture (NA) of the projection objective and employ shorter wavelengths, preferably ultraviolet light with wavelengths less than about 260 nm. However, there are very few materials, in particular, synthetic quartz glass and crystalline fluorides, that are sufficiently transparent in that wavelength region available for fabricating the optical elements. Since the Abbe numbers of those materials that are available lie rather close to one another, it is difficult to provide purely refractive systems that are sufficiently well color-corrected (corrected for chromatic aberrations).

The high prices of the materials involved and limited availability of crystalline calcium fluoride in sizes large enough for fabricating large lenses represent problems. Measures that allow reducing the number and sizes of lenses employed and simultaneously contribute to maintaining, or even improving, imaging fidelity are thus desired.

In optical lithography, high resolution and good correction status have to be obtained for a relatively large, virtually planar image field. It has been pointed out that the most difficult requirement that one can ask of any optical design is that it have a flat image, especially if it is an all-refractive design. Providing a flat image requires opposing lens powers and that leads to stronger lenses, more system length, larger system glass mass, and larger higher-order image aberrations that result from the stronger lens curvatures. Conventional means for flattening the image field, i.e. for correctings the Petzval sum in projection objectives for microlithography are discussed in the article "New lenses microlithography" by E. Glatzel, SPIE Vol. 237 (1980), pp. 310-320.

Concave mirrors have been used for some time to help solve problems of color correction and image flattening. A concave mirror has positive power, like a positive lens, but the opposite sign of Petzval curvature. Also, concave mirrors do not introduce color problems.

Therefore, catadioptric systems that combine refracting and reflecting elements, particularly lenses and concave mirrors, are primarily employed for configuring high-resolution projection objectives of the aforementioned type.

Unfortunately, a concave mirror is difficult to integrate into an optical design, since it sends the radiation right back in the direction it came from.

Intelligent designs integrating concave mirrors without causing mechanical problems or problems due to beam vignetting or pupil obscuration are desirable.

When using one or more concave mirrors for correcting the Petzval sum of an imaging system it is desirable that the contribution of the concave mirror to Petzval sum correction is just sufficient to compensate opposing effects of other parts of the projection objective. The contribution to Petzval sum should not be too weak or too strong. Therefore, optical design concepts allowing for a certain amount of flexibility of Petzval sum correction are desirable.

One type of catadioptric group frequently used in projection objectives for microlithography is a combination of a concave mirror arranged close to or at a pupil surface and one or more negative lenses arranged ahead of the concave mirror and passed twice by radiation. The Petzval sum of this type of catadioptric group can be varied by changing the refractive power of the lenses and the concave mirror while maintaining an essentially constant refractive power of the entire catadioptric group. This is one fundamental feature of the Schupmann-Achromat, which is utilized in some types of catadioptric projection objectives, for example those using geometrical beam splitting with one or more planar folding mirrors for guiding radiation towards the catadioptric group and/or for deflecting radiation emanating from the catadioptric group. Representative examples for folded catadioptric projection objectives using planar folding mirrors in combination with a single catadioptric group as described above are given in US 2003/0234912 A1 or US 2004/0160677 A1.

A number of catadioptric projection objectives having one straight (unfolded) optical axis common to all optical elements of the projection objective have been proposed, which will be denoted as "in-line systems" in the following. From an optical point of view, in-line systems may be favorable since optical problems caused by utilizing planar folding mirrors, such as polarization effects, can be avoided. Also, from a manufacturing point of view, in-line systems may be designed such that conventional mounting techniques for optical elements can be utilized, thereby improving mechanical stability of the projection objectives.

The U.S. Pat. No. 6,600,608 B1 discloses a catadioptric in-line projection objective having a first, purely refractive objective part for imaging a pattern arranged in the object plane of the projection objective into a first intermediate image, a second objective part for imaging the first intermediate image into a second intermediate image and a third objective part for imaging the second intermediate image directly, that is without a further intermediate image, onto the image plane. The second objective part is a catadioptric objective part having a first concave mirror with a central bore and a second concave mirror with a central bore, the concave mirrors having the mirror faces facing each other and defining an intermirror space or catadioptric cavity in between. The first intermediate image is formed within the central bore of the concave mirror next to the object plane, whereas the second intermediate image is formed within the central bore of the concave mirror next to the object plane. The objective has axial symmetry and a field centered around the optical axis and provides good color correction axially and laterally. However, since the reflecting areas of the concave mirrors exposed to the radiation are interrupted at the bores, the pupil of the system is obscured.

The Patent EP 1 069 448 B1 discloses catadioptric projection objectives having two concave mirrors facing each other and an off-axis object and image field. The concave mirrors are part of a first catadioptric objective part imaging the object onto an intermediate image positioned adjacent to a concave mirror. This is the only intermediate image, which is imaged to the image plane by a second, purely refractive objective part. The object as well as the image of the catadioptric imaging system are positioned outside the intermirror space defined by the mirrors facing each other. Similar systems having two concave mirrors, a common straight optical axis and one intermediate image formed by a catadioptric imaging system and positioned besides one of the concave mirrors is disclosed in US patent application US 2002/0024741 A1.

US patent application US 2004/0130806 (corresponding to European patent application EP 1 336 887) discloses catadioptric projection objectives having off-axis object and image field, one common straight optical axis and, in that sequence, a first catadioptric objective part for creating a first intermediate image, a second catadioptric objective part for creating a second intermediate image from the first intermediate image, and a refractive third objective part forming the image from the second intermediate image. Each catadioptric system has two concave mirrors facing each other. The intermediate images lie outside the intermirror spaces defined by the concave mirrors.

Japanese patent application JP 2003114387 A and international patent application WO 01/55767 A disclose catadioptric projection objectives with off-axis object and image field having one common straight optical axis, a first catadioptric objective part for forming an intermediate image and a second catadioptric objective part for imaging the intermediate image onto the image plane of this system. Concave and convex mirrors are used in combination.

US patent application US 2003/0234992 A1 discloses catadioptric projection objectives with off-axis object and image field having one common straight optical axis, a first catadioptric objective part for forming an intermediate image, and a second catadioptric objective part for imaging the intermediate image onto the image plane. In each catadioptric objective part concave and convex mirrors are used in combination with one single lens.

International patent application WO 2004/107011 A 1 discloses various catadioptric projection objectives with off-axis object field and image field having one common straight optical axis designed for immersion lithography using an arc shaped effective object field. The projection objectives include various types of mirror groups having two, four or six curved mirrors. Embodiments with one or two intermediate images are disclosed.

U.S. provisional application with Ser. No. 60/536,248 filed on Jan. 14, 2004 by the applicant discloses a catadioptric projection objective having very high NA and suitable for immersion lithography at NA>1. The projection objective comprises: a first objective part for imaging the pattern provided in the object plane into a first intermediate image, a second objective part for imaging the first intermediate imaging into a second intermediate image, and a third objective part for imaging the second intermediate imaging directly onto the image plane. The second objective part includes a first concave mirror having a first continuous mirror surface and a second concave mirror having a second continuous mirror surface, the concave mirror surfaces facing each other and defining an intermirror space. All mirrors are positioned optically remote from a pupil surface. The system has potential for very high numerical apertures at moderate lens mass consumption. A limited flexibility for Petzval sum correction provided by the concave mirrors is given since vignetting problems have to be observed when the refractive power of the concave mirrors is adjusted.

SUMMARY OF THE INVENTION

It is an object of the invention to provide a catadioptric in-line projection objective allowing flexibility for Petzval sum correction at moderate variations of the overall design of the projection objective. It is another object of the invention to provide a catadioptric in-line projection objective that can be built with relatively small amounts of transparent optical material. It is another object of the invention to provide a catadioptric in-line projection objective for microlithography suitable for use in the vacuum ultraviolet (VUV) range having potential for very high image side numerical aperture which may extend to values allowing immersion lithography at numerical apertures NA>1. It is another object of the invention to provide a catadioptric in-line projection objective having an axially compact arrangement of mirrors effective for compensating image curvature abberations caused by lenses with positive power within the projection objective.

As a solution to these and other objects the invention, according to one formulation, provides a catadioptric projection objective for imaging an off-axis object field arranged in an object surface of the projection objective onto an off-axis image field arranged in an image surface of the projection objective while creating at least one intermediate image comprising in that order along an optical axis:

a front lens group having positive refractive power for converging radiation coming from the object field towards a mirror group entry of a mirror group;

the mirror group having the object side mirror group entry, an image side mirror group exit, and a mirror group plane defined transversely to the optical axis and arranged geometrically between the mirror group entry and the mirror group exit; and a rear lens group with positive refractive power for focusing radiation emerging from the mirror group exit onto the image surface;

the mirror group having:

a first mirror for receiving radiation from the mirror group entry on a first reflecting area;

a second mirror for receiving radiation reflected from the first mirror on a second reflecting area;

a third mirror for receiving radiation reflected from the second mirror on a third reflecting area;

and a fourth mirror for receiving radiation reflected from the third mirror on a fourth reflecting area and for reflecting the radiation to the mirror group exit;

at least two of the mirrors being concave mirrors having a concave mirror surface having a surface of curvature rotationally symmetric to the optical axis; wherein:

the mirrors of the mirror group are arranged such that at least one intermediate image is positioned inside the mirror group between mirror group entry and mirror group exit, and that radiation coming from the mirror group entry passes at least four times through the mirror group plane and is reflected at least twice at a concave mirror surface of the mirror group prior to exiting the mirror group at the mirror group exit;

the mirror group entry is positioned in a region where radiation exiting the front lens group has an entry chief ray height;

the second reflecting area is positioned in a region where radiation impinging on the second mirror has a second chief ray height deviating from the entry chief ray height in a first direction; and the fourth reflecting area is positioned in a region where radiation impinging on the fourth mirror has a fourth chief ray height deviating from the entry chief ray height in a second direction opposite to the first direction.

In this formulation, the term "direction" refers to directions along a ray of numbers in a sense that the first direction may be the direction of increasing numbers whereas the second direction is the direction of decreasing numbers or vice versa. If, for example, the entry chief ray height equals zero (i.e. chief ray on the optical axis at the mirror group entry), then the second chief ray height may be positive and the fourth chief ray height may be negative or the other way round. If the entry chief ray height has a finite positive value, then one of the second and fourth chief ray height will have a larger positive value and the other, chief ray height may have a smaller positive value or a negative value, or may be zero. Analogously, if the entry chief ray height has a finite negative value, then one of the second and fourth chief ray height will have a more negative value and the other, remaining chief ray height may have a less negative value or a positive value or may be zero.

In a design where the chief ray positions of the second and fourth reflection (both on object-side mirrors having mirror surfaces facing the image side) occur at opposite sides relative to the position of the chief ray at the mirror group entry, a design space can be used allowing optical designs optimized with regard to effective use of concave mirrors.

Since the radiation entering the mirror group is reflected at least twice on a concave mirror surface before exiting the mirror group, the mirror group can provide strong overcorrection of the Petzval sum, which can at least partly compensate opposite effects on image curvature caused by positive refractive power upstream and/or downstream of the mirror group. The mirror group can, therefore, be regarded as a "Petzval sum corrector". The mirror group can be modified with regard to curvature and relative position of the mirrors in order to modify the amount of Petzval sum provided by the mirror group with only a limited effect on the course of the projection beam within the remainder parts of the projection objective, whereby the design can be optimized such that a suitable distribution of means for correcting Petzval sum within the system can be chosen as needed.

Since the mirrors of the mirror group are arranged such that radiation coming from the mirror group entry passes at least four times through the mirror group plane prior to exiting the mirror group at the mirror group exit, a multitude of at least four reflections can be obtained within an axially compact space defined between the mirror group entry and the mirror group exit. The mirror group plane may be a plane perpendicular to the optical axis and positioned between the vertices of the first and the second mirror of the mirror group.

In some embodiments, exactly four reflections occur within the mirror group providing a good compromise between a desired influence of reflections of the field curvature and an undesired loss of intensity involved with each reflection on a mirror.

In some embodiments of this type the first, second, third and fourth mirror is a concave mirror, thus providing four reflections on concave mirror surfaces. Strong Petzval overcorrection can be obtained this way since each reflection contributes a certain amount of Petzval overcorrection.

In some embodiments, a length ratio LR between an axial mirror group length MGL and a total track length TT of the projection objective is less than 50%, where the mirror group length is the axial distance between a mirror vertex closest to the object surface and a mirror vertex closest to the image surface and the total track length is the axial distance between object surface and the image surface. Preferably LR=MGL/TT is less than 40% or less than 30%, indicating axially compact mirror groups allowing to integrate strong Petzval correction in optical designs with moderate track length.

There are different possibilities to integrate a mirror group into the projection objective.

In some embodiments the mirror group entry includes the optical axis and the positions of the chief rays of the second and fourth reflection are positioned on opposite sides of the optical axis.

In some embodiments it has been found beneficial to integrate the mirror group into the overall design such that the mirror group entry is positioned geometrically close to a front pupil surface of the projection objective. In this case, the projection beam (i.e. the radiation beam emanating from the object field and running to the image field) includes the optical axis in the region of the mirror group entry. An axial position of the mirror group entry "in the vicinity of a pupil surface" may particularly be defined as an axial position where the chief ray height CRH is smaller than the marginal ray height MRH.

The marginal ray is a ray running from an axial field point (on the optical axis) to the edge of an aperture stop. In an off-axis system the marginal ray may not contribute to the formation of an image due to vignetting. The chief ray (also known as principal ray) is a ray running from an outermost field point (farthest away from the optical axis) and intersecting the optical axis at a pupil surface position. Due to rotational symmetry of a projection objective the outermost field point may be chosen from an equivalent field point on the meridional plane.

The front lens group arranged between the object surface and the mirror group entry allows to transform the spatial distribution of radiation at the object surface into a desired angular distribution of radiation at the mirror group entry and to adjust the angles of incidence with which the radiation enters the mirror group and impinges on the first mirror. Also, the design of the front lens group is selected such that the radiation beam entering the mirror group entry has a desired cross-sectional shape allowing to pass the radiation beam into the mirror group exit without hitting adjacent mirror edges, thereby avoiding vignetting of the beam.

In embodiments having the mirror group entry including the optical axis, particularly where the mirror group entry lies geometrically close to a pupil surface, the front lens group may be designed as a Fourier lens group. The term "Fourier lens group" as used here refers to a single optical element or to a group consisting of at least two optical elements which perform one single Fourier transformation or an odd number of consecutive Fourier transformations between a front focal plane and a rear focal plane of the Fourier lens group. A Fourier lens group may be all refractive consisting of one or more transparent lenses. A Fourier lens group may also be purely reflective consisting of one or more mirrors, at least some of the mirrors being curved mirrors. Catadioptric Fourier lens groups combining transparent lenses and mirrors are also possible. In preferred embodiments a Fourier lens group forming the front lens group is purely refractive and performs a single Fourier transformation.

The front lens group may be axially compact having an axial length which may be less than 40% or less than 30% or less than 25% of the total track length of the projection objective.

There are different possibilities to place the mirror group exit. According to one embodiment the mirror group exit is arranged geometrically close to a rear pupil surface optically conjugate to the front pupil surface. In this case, the mirror group is designed to perform a pupil imaging between mirror group entry and mirror group exit. At least one intermediate image is thereby formed within the mirror group. Preferably, more than one intermediate image, e.g. two or three intermediate images, are formed within the mirror group. A mirror group exit close to a pupil surface allows to place the exit such that the optical axis is included into the projection beam at the mirror group exit, thereby allowing moderate lens diameters downstream of the mirror group exit.

The terms "front" and "rear" relate to the position along the optical path, wherein a front pupil surface lies upstream of a rear pupil surface. Geometrically, a front pupil surface will normally be closer to the object surface, whereas a rear pupil surface will normally be closer to the image surface.

Where the mirror group exit is positioned geometrically close to a pupil surface, a Fourier lens group for forming an intermediate image in a constriction region may be provided immediately downstream of the mirror group exit. In this case, a subsequent lens group may be designed as an imaging subsystem for imaging the intermediate image formed by the Fourier lens group onto the image surface on a reduced scale.

In other embodiments, the mirror group exit is arranged outside the optical axis optically close to an intermediate image (i.e. optically remote from a pupil surface), and the second and third lens group combined form an imaging subsystem for imaging that intermediate image onto the image surface on a reduced scale. This type of embodiments generally allows for smaller track length, however, larger lenses are required immediately downstream of the mirror group exit for converging the off-axis projection beam towards the constriction region.

Preferably, at least two negative lenses are arranged in the constriction region in embodiments having a mirror group exit optically remote from the pupil surface. Thereby, a predefined amount of Petzval sum correction is contributed by small negative lenses within a purely refractive section of the projection objective. Since a limited amount of Petzval sum correction can thereby by provided within the refractive section downstream of the mirror group, concave mirrors having moderate curvatures can be utilized within the mirror group.

According to one embodiment the mirror group includes at least one mirror pair consisting of two concave mirrors having mirror surfaces sharing a common surface of curvature provided on a common mirror substrate having a transmissive portion or aperture provided between the concave mirrors of the mirror pair. The concave mirrors of a mirror pair may also be described as a concave mirror having a transmissive aperture wherein non-overlapping reflecting areas of the mirror on both sides of the aperture are used. The transmissive aperture is effective to allow radiation to enter or exit an intermirror space axially defined by the mirror pair on one side and one or more mirrors on the other side. A mirror pair formed by concave mirrors having a common surface of curvature may facilitate manufacturing and mounting of the concave mirrors. In embodiments having a mirror group entry and/or a mirror group exit near a pupil surface, the aperture of the mirror pair includes the optical axis.

In some embodiments, the second and fourth mirror (i.e. the mirrors geometrically closest to the object surface) form a mirror pair provided on a common mirror substrate. An opening or aperture in the mirror substrate may include the optical axis and may define the mirror group entry. Likewise, it is possible that the first and third mirrors form a mirror pair provided on a common mirror substrate. An opening (aperture) provided between the first and third mirror may include the optical axis and may form the mirror group exit. In some embodiments, both the object-side mirrors (second and fourth mirror) as well as the image-side mirrors (first and third mirror) each form a mirror pair on a common mirror substrate such that only two mirror substrates are necessary to provide four mirrors. Manufacturing and mounting is greatly facilitated this way.

The previous and other properties can be seen not only in the claims but also in the description and the drawings, wherein individual characteristics may be used either alone or in sub-combinations as an embodiment of the invention and in other areas and may individually represent advantageous and patentable embodiments.

BRIEF DESCRIPTION OF THE DRAWINGS

FIG. 2 shows the projection objective of FIG. 1 with different representations of the concave mirrors of the mirror group and the projection beam;

FIG. 6 shows a variant of the projection objective of FIG. 1 where the object-side concave mirrors and the image-side concave mirrors each have identical vertex positions and different curvatures;

FIG. 7 shows a variant of the projection objective in FIG. 1 having an asymmetric arrangement of concave mirrors of the mirror group;

FIG. 8(a) to (d) shows a schematic representation of a design space for mirror groups suitable for incorporation into a catadioptric projection objective, where different variants are distinguished by different paths of the projection beam between mirror group entry and mirror group exit;

FIG. 11 shows a variant of the projection objective of FIG. 10 where the mirrors of the mirror group are disposed symmetrically about a mirror group plane;

FIG. 12 shows a variant of the projection objective of FIG. 11 or 12 where the first and fourth mirrors are planar mirrors perpendicular to the optical axis;

FIG. 13 shows a variant of the projection objective of FIG. 12 with the planar mirrors removed to form a two-mirror mirror-group;

FIG. 14 shows a representation of the projection objective of FIG. 13 where effectively used areas of the first and second mirror forming the mirror group are shown;

FIG. 15 shows representations of a four-mirror-mirror-group having an object-side mirror group entry around the optical axis and an off-axis mirror group exit and a path of a low aperture beam (a) and a high aperture beam (b) through the mirror group;

FIG. 16 shows an embodiment of a catadioptric projection objective with two intermediate images where the mirror group of FIG. 15 is incorporated;

FIG. 17 shows a variant of the projection objective of FIG. 16 with a smaller curvature of the first and third mirrors and a convergent beam at the mirror group exit;

FIG. 18 shows a variant of the projection objective of FIG. 17 having almost planar first and third mirrors and a convergent beam at the off-axis mirror group exit;

DETAILED DESCRIPTION OF THE PREFERRED EMBODIMENTS

Figure 1:
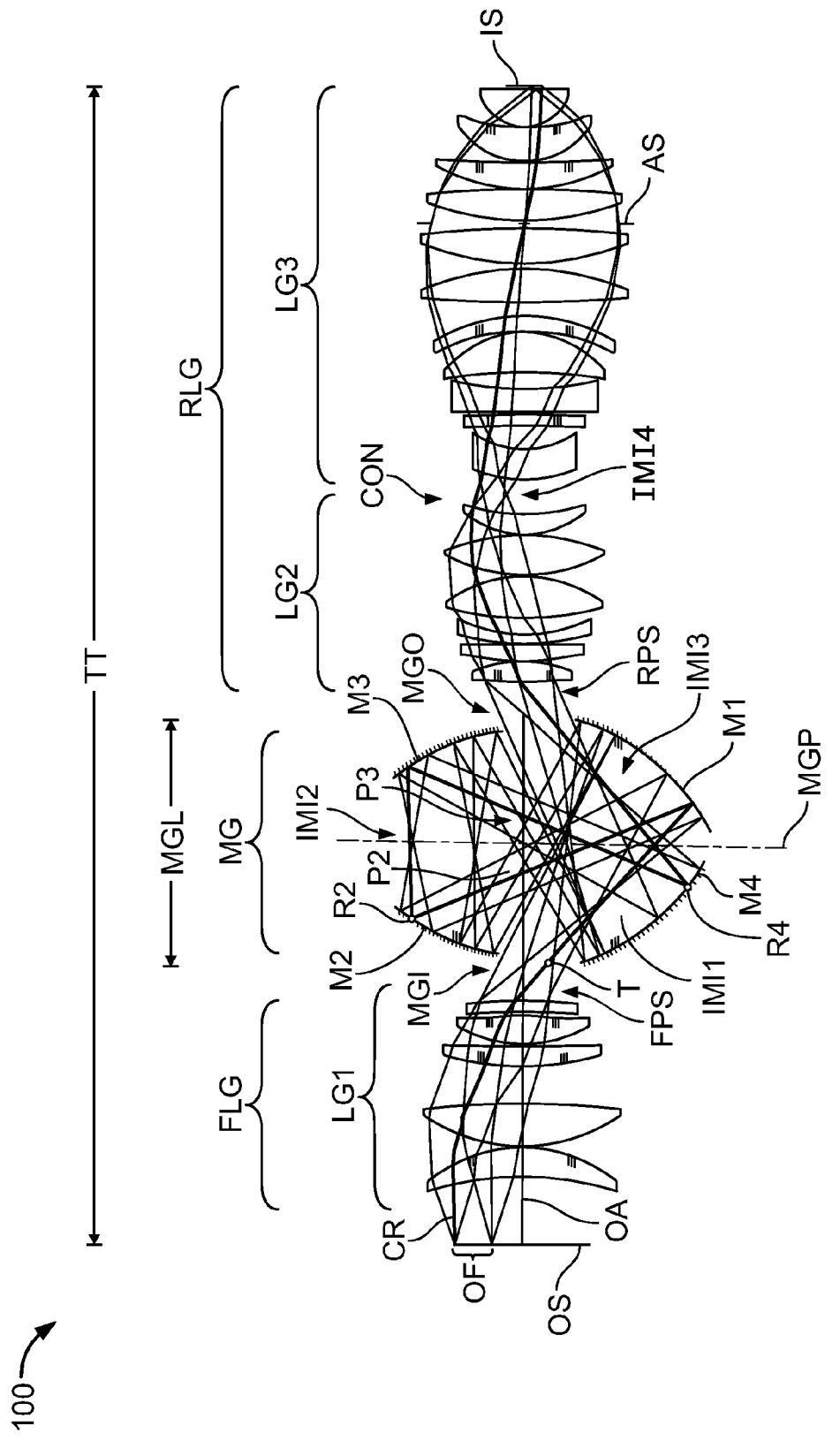
FIG. 1 shows a lens section of an embodiment of a catadioptric immersion objective for microlithography comprising a four-mirror-mirror group (type H in FIG. 8) and four intermediate images.

In the following description of preferred embodiments of the invention, the term "optical axis" shall refer to a straight line or sequence of straight-line segments passing through the centers of curvature of the optical elements involved. The optical axis is folded by reflective surfaces. In the case of those examples presented here, the object involved is either a mask (reticle) bearing the pattern of an integrated circuit or some other pattern, for example, a grating pattern. In the examples presented here, the image of the object is projected onto a wafer serving as a substrate that is coated with a layer of photoresist, although other types of substrate, such as components of liquid-crystal displays or substrates for optical gratings, are also feasible.

Embodiments having a plurality of mirrors are described. Unless stated otherwise, the mirrors will be numbered according to the sequence in which the radiation is reflected on the mirrors. With other words, the numbering of the mirrors denotes the mirrors according to the position along the optical path of radiation, rather than according to geometrical position.

Where appropriate, identical or similar features or feature groups in different embodiments are denoted by similar reference identifications. Where reference numerals are used, those are increased by 100 or multiples of 100 between embodiments.

Where tables are provided to disclose the specification of a design shown in a figure, the table or tables are designated by the same numbers as the respective figures.

In all embodiments given below the surfaces of curvature of all curved mirrors have a common axis of rotational symmetry, also denoted mirror group axis. The mirror group axis coincides with the optical axis OA of the imaging system. Axially symmetric optical systems, also named coaxial systems or in-line systems, are provided this way. Object surface and image surface are parallel. An even number of reflections occurs. The effectively used object field and image field are off-axis, i.e. positioned entirely outside the optical axis. All systems have a circular pupil centered around the optical axis thus allowing use as projection objectives for microlithography.

FIG. 1 shows a lens section of an embodiment of a catadioptric projection objective 100 designed to project an image of a pattern on a reticle arranged in the planar object surface OS (object plane) onto a planar image surface IS (image plane) on a reduced scale, for example 4:1, while creating exactly four real intermediate images IMI1, IMI2, IMI3 and IMI4. An off-axis object field OF positioned outside the optical axis OA is thereby projected on an off-axis image field IF. The path of the chief ray CR of an outer field point of the off-axis object field OF is drawn bold in FIG. 1 in order to facilitate following the beam path.

For the purpose of this application, the term "chief ray" (also known as principal ray) denotes a ray emanating from an outermost field point (farthest away from the optical axis) of the effectively used object field OF and intersecting the optical axis at at least one pupil surface position. Due to the rotational symmetry of the system the chief ray may be chosen from an equivalent field point in the meridional plane as shown in the figures for demonstration purposes. In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (on the optical axis) to the edge of an aperture stop AS. That marginal ray may not contribute to image formation due to vignetting when an off-axis effective object field is used. The chief ray and marginal ray are chosen to characterize optical properties of the projection objectives.

FIG. 2(a) shows a different representation of the projection objective 100 with the surfaces of curvature of the concave mirrors extended across the optical axis to facilitate understanding of the arrangement and design of the concave mirrors. FIG. 2(b) shows yet another representation with a beam bundle emanating from an outermost object field point in order to facilitate understanding the positions of the intermediate images and some properties of the projection beam passing through the projection objective.

A first lens group LG1 immediately following the object surface having positive refractive power provided by five lenses acts as an imaging subsystem to form the first intermediate image IMI1. A front pupil surface FPS formed between object surface and first intermediate image is positioned outside and downstream of the first lens group LG1 at an axial position where the chief ray CR intersects the optical axis OA. An aperture stop may be arranged at the front pupil surface, if desired.

A purely reflective (catoptric) mirror group MG consisting of four separate concave mirrors M1, M2, M3 and M4 arranged mirror symmetrically with respect to a mirror group plane MGP perpendicular to the optical axis is designed to form a second intermediate image IMI2 from the first intermediate image, and a third intermediate image IMI3 from the second intermediate image. All intermediate images IMI1, IMI2, IMI3 are positioned inside a cavity defined by the surfaces of curvature of the concave mirrors.

A second lens group LG2 having positive refractive power provided by six lenses is an imaging subsystem forming a fourth intermediate image IMI4 from the third intermediate image IMI3. A pupil surface RPS formed between the third and fourth intermediate image lies outside the lenses of the second lens group immediately upstream of the entry surface of the first lens of that group.

A third lens group LG3 having positive refractive power provided by eleven lenses (only two weak negative lenses) is designed as a focusing lens group with reducing magnification to image the fourth intermediate image IMI4 onto the image surface IS on a reduced scale.

A constriction region CON characterized by a local minimum of beam diameter is defined between the second and third lens group LG2 and LG3 including the position of the fourth intermediate image IMI4.

The first lens group LG1 forms a front lens group FLG designed to converge the radiation coming from the object field towards the mirror group entry. The second lens group LG2 and the third lens group LG3 in combination serve as a rear lens group RLG for focusing the radiation emerging from the mirror group exit MGO onto the image surface.

The purely reflective (catoptric) mirror group MG is designed to provide strong overcorrection of the Petzval sum counteracting opposite effects of positive refractive power of lenses upstream and downstream of the mirror group. To that end, the mirror group MG consists of a first concave mirror M1 placed on the side of the optical axis opposite to the object field OF, a second concave mirror M2 placed on the object field side of the optical axis, a third concave mirror M3 also placed on the object field side of the optical axis, and a fourth concave mirror M4 placed on the side opposite to the object field. A finite axial distance (vertex distance) exists between the intersections of the surfaces of curvature of the most object side mirror (M4) and the geometrically closest mirror (M2) on the opposite side of the optical axis. A mirror group entry MGI is formed between the mutually facing edges of mirrors M2 and M4. As the mirror arrangement is mirror symmetric to a symmetry plane (mirror group plane MGP) perpendicular to the optical axis, symmetric conditions are given on the exit side, where a mirror group exit MGO is formed between the third mirror M3 closer to the object and the first mirror M1 closer to the image-side. Both mirror group entry MGI and mirror group exit MGO include the optical axis.

The mirror group entry MGI has an axial position geometrically close to the front pupil surface FPS. Since the chief ray height (i.e. the radial distance between the optical axis and the chief ray) equals zero at the front pupil surface, an entry chief ray height CRHI at the mirror group entry is small in absolute values. In FIG. 1, a dot T illustrates the position where the chief ray transits the mirror group entry. This corresponds to a small negative value. After reflection on the first mirror M1, the radiation beam crosses the optical axis and is incident on the second mirror M2. The second reflecting area (footprint) on the second mirror includes the position R2 (dot) where the chief ray impinges on the second mirror. The corresponding second chief ray height CRH2 is larger than the first chief ray height (the ray height being determined in a radial direction to the optical axis with positive values on the side of the object field in this case). Specifically, CRH2 has a positive value. After forming the second intermediate image and reflection on the third mirror M3, the radiation beam crosses the optical axis again and is incident on the fourth mirror M4 in a fourth reflecting area including the position R4 (dot) where the chief ray is reflected on the fourth mirror. The corresponding fourth chief ray height CRH4 is smaller than the entry chief ray height CRHI since it has a more negative value than CRHI. Also, the second and fourth chief ray heights CRH2 and CRH4 have opposite signs, CRH2 being positive and CRH4 being negative.

The small absolute value of entry chief ray height CRHI indicates close vicinity of the mirror group entry to a pupil surface. In contrast, high absolute values of the chief ray heights for the second and fourth reflection indicate that these reflections occur optically remote from a pupil surface optically closer to a field surface nearby (IMI2 for the second reflection, and IMI3 for the fourth reflection). Due to the symmetry of the mirror group, the reflections on the first and third mirrors M1, M3 are also closer to field surfaces than to a pupil surface indicating that all reflections within the mirror group occur close to a field surface optically remote from a pupil surface.

Due to the symmetry of the mirror group, the front pupil surface FPS is positioned near the mirror group entry, whereas the optically conjugate rear pupil surface RPS lies near the mirror group exit. Inside the mirror group, three intermediate images (corresponding to field surfaces) are positioned. When viewed along the light propagation path, the first intermediate image IMI1 is positioned upstream of the first reflection at M1, the second intermediate image IMI2 is positioned between the second and the third reflection between mirrors M2 and M3, and a third intermediate image IMI3 is positioned immediately downstream of the fourth reflection at M4. The mirror group plane MGP is passed five times by the projection beam between mirror group entry and mirror group exit.

An axial mirror group length MGL defined as the axial distance between a mirror vertex closest to the object surface (mirror M4) and a mirror vertex closest to the image surface (mirror M1) is less than 30% of the total track length TT of projection objective (axial distance between object surface and image surface), indicating an axially compact mirror group.

The second intermediate image is essentially telecentric indicated by the fact that the chief ray CR runs almost parallel to the optical axis in the region of the second intermediate image. An essentially collimated beam is formed between the first and second mirrors M1, M2, forming a second pupil surface P2 close to the focal point of the second mirror. Likewise a collimated beam is present between the third and fourth mirror M3, M4, forming a third pupil surface P3 near the focal point of the third mirror M3.

The projection objective 100 is designed as an immersion objective for $\lambda=193$ nm having an image side numerical aperture NA=1.20 when used in conjunction with a high index immersion fluid, e.g. pure water, between the exit face of the objective and the image plane. The size of the rectangular field is 26 mm*5.5 mm. Specifications are summarized in Table 1. The leftmost column lists the number of the refractive, reflective, or otherwise designated surface, the second column lists the radius, r, of that surface [mm], the third column lists the distance, d [mm], between that surface and the next surface, a parameter that is referred to as the "thickness" of the optical element, the fourth column lists the material employed for fabricating that optical element, and the fifth column lists the refractive index of that material. The sixth column lists the optically utilizable, clear, semi diameter [mm] of the optical component. A radius r=0 in a table designates a planar surface (having infinite radius).

A number of surfaces in table 1, are aspherical surfaces. Table 1A lists the associated data for those aspherical surfaces, from which the sagitta or rising height p(h) of their surface figures as a function of the height h may be computed employing the following equation:

$$p(h)=[((1/r)h^2)/(1+\text{SQRT}(1-(1+K)(1/r)^2h^2))]+C1\cdot h^4+C2\cdot h^6+\ldots,$$

where the reciprocal value (1/r) of the radius is the curvature of the surface in question at the surface vertex and h is the distance of a point thereon from the optical axis. The sagitta or rising height p(h) thus represents the distance of that point from the vertex of the surface in question, measured along the z-direction, i.e., along the optical axis. The constants K, C1, C2, etc., are listed in Table 1A.

Some considerations for obtaining a high geometrical light conductance value (etendue, product of numerical aperture and corresponding field size) for the effectively used field are presented in the following. As explained above, radiation enters the four-mirror-design at a mirror group entry MGI geometrically close to a pupil surface (front pupil surface FPS), and the mirror group exit MGO is also geometrically close to a pupil surface (rear pupil surface RPS) indicating that the mirror group performs a pupil imaging within the optical system. Further, each of the mirror surfaces is positioned optically close to a field surface (intermediate image) in a sense that the mirror is optically closer to a field surface than to a pupil surface of the object system. Specifically, the absolute value of the chief ray height may be more than twice the absolute value of the marginal ray height at the mirror surfaces. In order to avoid vignetting of the beam in the region of the pupil surface, the beam must pass the geometrically closest edge of the mirrors forming the mirror group entry or mirror group exit. Regarding the footprints of the beams on the mirrors care must be taken that the entire footprint falls on a reflective area of the mirror instead of passing the edge of a mirror, which would cause vignetting. A further practical requirement is to obtain a sufficiently large object field as close as possible to the optical axis in order to minimize the object field diameter for which the projection objective must be sufficiently corrected for aberrations. Under these conditions, it has been found useful to design the optical systems such that the size of the pupil (i.e. the beam diameter of the beam at a pupil surface) is as small as possible at a pupil plane geometrically close to the mirror group entry (front pupil surface) and mirror group exit (rear pupil surface). A small pupil at the mirror group entry allows to place a geometrically close field (on or near an adjacent mirror) after an odd number of reflections as close as possible to the optical axis without hitting the mirror edge. Likewise, a small pupil at the mirror group exit allows to place a geometrically close field (on or near an adjacent mirror) after an even number of reflections as close as possible to the optical axis without hitting the mirror edge. Further considering that the product of paraxial chief ray angle CRA and the size of a pupil is a constant in an optical imaging system (Lagrange invariant) a small pupil corresponds to large chief ray angles at that pupil surface. In this context it has been found useful for catadioptric in-line systems having mirror groups of the type shown here that the maximum chief ray angle $CRA_{Max}$ should exceed a critical value, thereby allowing to form a small pupil and an oblique beam path in the vicinity of a mirror group entry and mirror group exit which, in turn, allows to place a large off-axis object field close to the optical axis even at high numerical apertures.

The maximum chief ray angle $CRA_{Max}$ at the front pupil surface FPS close to the mirror group entry is about 40° in FIG. 1. Useful values for $CRA_{Max}$ may be in the range between about 20° and about 50°. At lower values, the pupil size increases such that it becomes more difficult to avoid vignetting without increasing the object field diameter to be corrected. At values higher than the upper limit, mirror surfaces may have to extend too far away from the optical axis thereby enlarging the mirror group size in radial direction and making mirror manufacturing and mounting more difficult.

This basic type of design provides useful degrees of freedom with respect to the amount of Petzval sum correction provided by the mirror group. In order to demonstrate this flexibility, design variants have been created where the inner mirrors M2 and M3 are placed closer together or further apart from each other when compared to the arrangement of FIG. 1. In that case, it is desirable to adapt the curvatures of the mirrors such that the focal points of the inner concave mirrors remain essentially at the related pupil positions. In this case, the Petzval sum is changing with increasing or decreasing mirror surface curvature, whereas the telecentric beam at the second intermediate image between M2 and M3 is maintained due to symmetry reasons. Likewise, the pupil imaging property allowing the mirror group to image the front pupil surface (close to the mirror entry) into the rear pupil surface (close to the mirror group exit) remains essentially stable.

Figure 3:
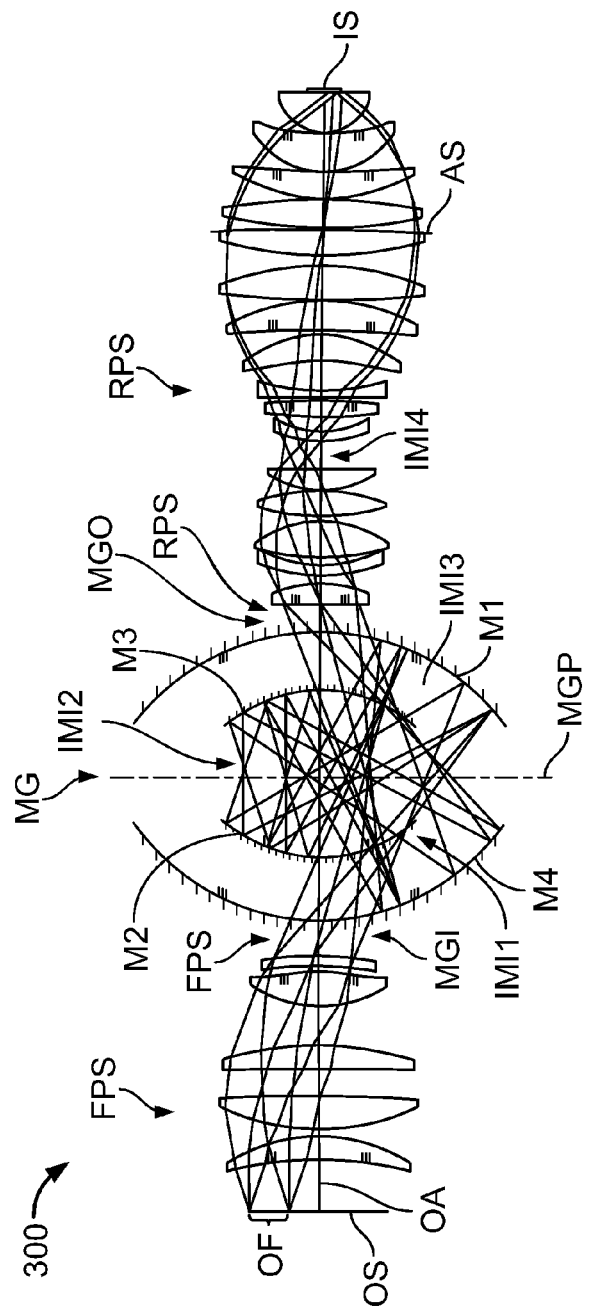
FIG. 3 shows a variant of the projection objective of FIG. 1 having closely spaced inner mirrors of the mirror group.

FIG. 3 shows an example of a projection objective 300 designed as a variant to the embodiment of FIG. 1 where a larger difference between the surface curvatures of the external mirrors M1, M4 on the one hand and the internal mirrors M2, M3 on the other end is obtained. Specifically, the curvature radius of the inner mirrors M2, M3 is decreased and the mirrors are closer together than in the embodiment of FIG. 1. Comparing the embodiments of FIGS. 1 and 3 it can be seen that a variation of Petzval sum correction provided by the mirror group can be obtained within a concept of mirror symmetric arrangement of all four mirrors of the mirror group with respect to the mirror group plane. The mirror group in the embodiment of FIG. 3 has the strongest effect on image curvature due to the larger optical power of the concave mirrors.

Mirror groups designed symmetrically to a symmetry plane may be advantageous from a manufacturing point of view since the same manufacturing and testing devices can be used to manufacture more than one concave mirror of the projection objective. Also, mounting can be facilitated.

In some cases, a larger flexibility for aberration control can be obtained when the mirror group is designed non-symmetric with respect to a mirror group plane MGP perpendicular to the optical axis. In the projection objective 400 of FIG. 4 the symmetry between the mirrors is broken and the second and fourth mirror M2, M4 are combined to form a mirror pair on a single common mirror substrate providing one mirror surface with a defined surface of curvature common to both mirrors M2, M4. The mirror substrate has a transmissive portion TP (formed by a hole in the mirror substrate) arranged such that the optical axis is included and dimensioned to form the mirror group entry MGI where the projection beam provided by the first lens group LG1 near the front pupil surface can pass through the transmissive portion without hitting the edge of the hole (i.e. without vignetting). Using at least one mirror pair of this type helps to reduce the number of optical elements to be manufactured and facilitates mounting of the concave mirrors formed on the common substrate. In the embodiments all concave mirrors are designed as purely conical mirrors, whereby manufacturing and testing is facilitated. In general, aspheric surfaces allow better aberration control.

Figure 4:
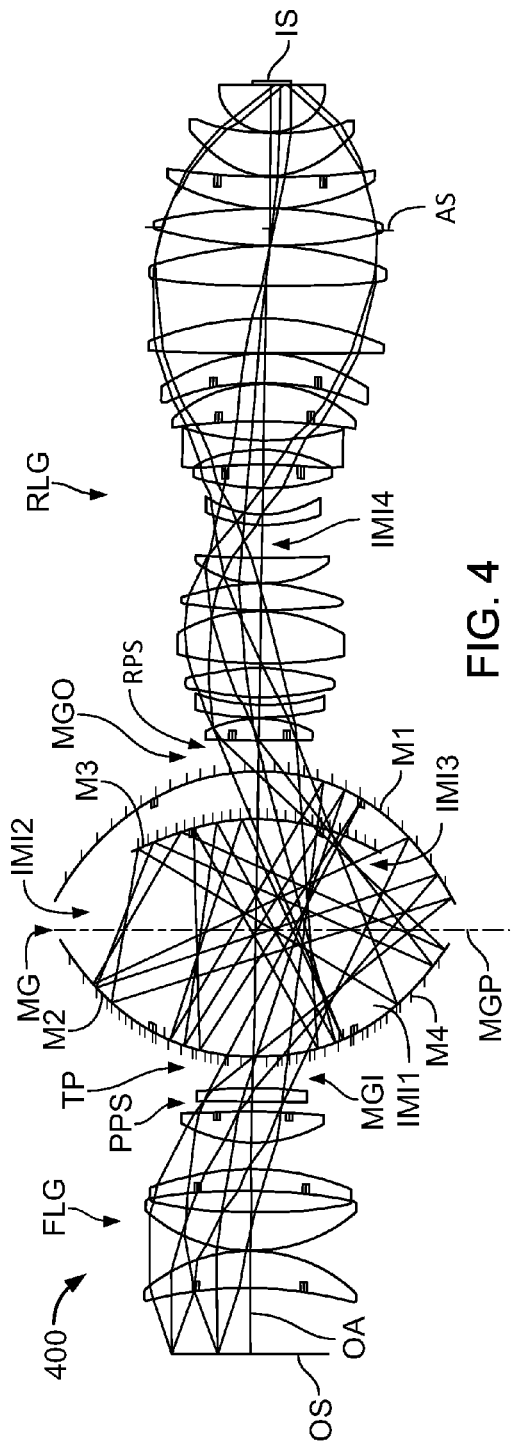
FIG. 4 shows a variant of the projection objective of FIG. 1 where two object-side concave mirrors are formed on a common substrate.
Figure 5:
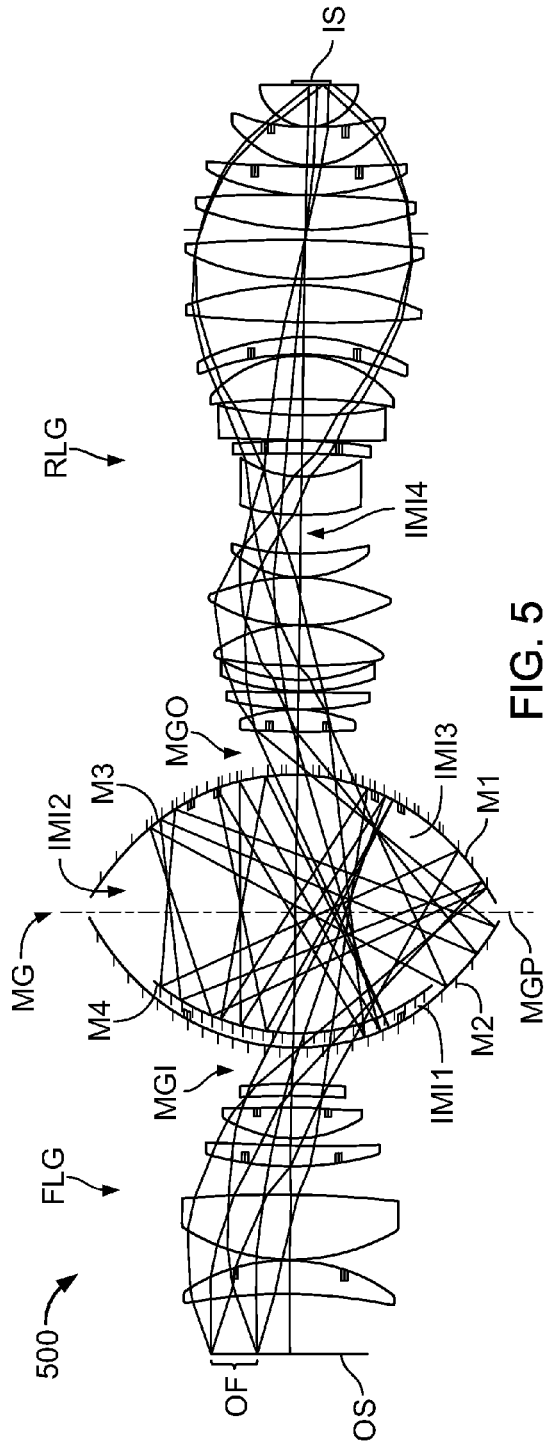
FIG. 5 shows a variant of the projection objective of FIG. 1 where two image-side concave mirrors of the mirror group are formed on one common mirror substrate.

In the projection objective 500 of FIG. 5, a similar system is shown equivalent to that of FIG. 4 in respect to the fact that one single mirror pair formed on a common substrate is provided. Here, the image side mirrors M1 and M3 are formed on a common substrate having a central hole or bore providing a transmissive portion between the concave mirrors forming the mirror group exit MGO where the projection beam passes through when exiting the mirror group MG.

In another embodiment (not shown in the figures) the mirror group is formed of two mirror pairs, where the mirrors M1, M3 are formed on one substrate, and the mirrors M2 and M4 are formed on another substrate, each substrate having a central hole including the optical axis.

Another class of symmetry is demonstrated using the projection objective 600 of FIG. 6 as an example. Here, the vertex positions of the object-side mirrors M2 and M4 on the one hand and of the image-side mirrors M1 and M3 on the other hand are identical. Therefore, the object-side mirrors having their mirror surfaces facing to the image-side have the same axial position, but differ in surface curvature. Likewise, the image-side mirrors having the mirror surfaces facing to the object have the same axial position, but differ in surface curvature. Mounting of the mirrors may be facilitated this way.

In FIG. 7 another variant of a projection objective 700 is shown where no symmetry exists between the mirrors M1 to M4 of the mirror group MG. Specifically, each of the concave mirrors has a different surface curvature and a different vertex position. As the surface curvatures determining the Petzval sum provided by a concave mirror and their axial positions can be selected independently between the concave mirrors, a desired contribution of the mirror group Petzval sum correction can be obtained as desired.

Further characteristic features of the basic design type include the following. High flexibility for the amount of Petzval sum correction as explained. Due to the presence of an intermediate image (fourth intermediate image IMI4) outside the mirror group at a distance therefrom, an accessible field surface is provided, facilitating the correction of aberrations and allowing to introduce a field stop, if desired. Small maximum lens diameters can be used due to the strong Petzval correction provided by the mirror group, thereby keeping the entire system mass and the amount of optical material for the lenses moderate. The mirror group forms an axially compact unit within the projection objective, keeping the overall track length moderate.

The embodiments shown in FIGS. 1 to 7 represent one preferred type of member of a design family having a mirror group having four nested mirrors providing four reflections between mirror group entry and mirror group exit. Specific properties of the design type have been explained with respect to the path described by the chief ray CR through the mirror group. A systematic approach to characterize and qualify the entire design family of this type will now be explained in connection with FIG. 8. In this figure, a mirror group consisting of four concave mirrors is represented schematically by bracket-shaped curved lines having concave sides facing each other. The object-side mirrors M2, M4 geometrically closer to the object surface OS and having mirror surfaces facing the image surface IS are represented by a curved line convex to the object surface, whereas the opposite image-side mirrors M1, M3 are represented by a curved line convex to the image surface. A radiation beam passing through the mirror group between mirror group entry and mirror group exit is characterized by the chief ray CR. As explained exemplarily in connection with FIGS. 1 to 7 various ways to design and arrange the concave mirrors are possible. In a general case, all four mirrors are separate mirrors providing the highest degree of freedom for the design since vertex positions and curvatures can be set independently. Higher symmetries, e.g. one or two mirror pairs, equal vertex positions and/or curvature radii etc are possible.

Where a reflection of the beam occurs on the optical axis OA in the schematic figure, this represents a reflection optically close to a pupil surface (abbreviated by $R_P$). In contrast, where a reflection occurs at a radial distance from the optical axis, this represents a reflection closer to a field surface ($R_F$).

A position where the chief ray CR intersects a curved line representing mirrors corresponds to a region where the radiation beam enters or exits the mirror group. A transmission close to the optical axis will be near a pupil and designated $T_P$, whereas a transmission near a field surface will be designated $T_F$.

FIGS. 8(*a*) to (*d*) represent four branches of the design family different with respect to the position and direction of entry of the radiation beam into the mirror group. The branch in (a) is characterized by a telecentric entry of the beam at MGI (i.e. chief ray parallel to optical axis) close to a field surface outside the optical axis ($T_F$) in level 0. The members of the branch in the following level 1 are generated depending on the position of the second reflection at M2, which may occur on the optical axis ($R_P$) or close to a field surface on the opposite side of the optical axis ($R_F$). In FIG. 8(*a*) both options in the first level are shown below each other.

The members of the second level following the first level are derived from those of the first level depending on the position of the reflection subsequent to the second reflection occurring on the image-side third mirror M3. In each of the two sub-branches following a member of the first level the reflection on the third mirror may theoretically occur either in the image-side pupil position ($R_P$), or in the field position ($R_F$) not yet used on the image-side mirror, i.e. a field position on the opposite side to the first reflection. It appears that among the four members of the second level, three members appear to be physically feasible, whereas the fourth member (uppermost member of level 2) characterized by a reflection on a pupil surface immediately downstream of a reflection on a pupil surface appears to be not feasible. In FIG. 8, options which appear not feasible for physical reasons are crossed out.

The development of the members of the third level follows the same principle for identifying what type or types of reflections appear feasible on the object-side fourth mirror M4. The reflection must occur at a position not yet used on the object-side mirrors. For physical reasons, two of the remaining three options in level 3 appear not feasible, leaving only one option where a reflection on the fourth mirror M4 occurs near a field position ($R_F$) on the same side of the optical axis as the third reflection upstream of the fourth reflection ($R_F$). In the fourth level, the system is completed when the beam reflected on the fourth mirror M4 exits the mirror group at the mirror group exit MGO positioned around the optical axis, indicated by a transmission occurring near a pupil surface ($T_P$).

In summary, FIG. 8(*a*) shows that only one physically meaningful option (type A) remains if a telecentric beam enters a mirror group outside the optical axis close to a field position ($T_F$). In this embodiment, the reflections and transmissions occurring on the object-side of the mirror group may be characterized by the sequence: $T_F$-$R_P$-$R_F$, whereas the reflections and transmissions on the image-side of the mirror group are characterized by: $R_F$-$R_F$-$T_P$.

This notation illustrates that a radiation beam passing through the mirror group is represented by three different positions of "footprints" of the beam in the region of the object-side mirrors and by three different footprints in the region of the image-side mirrors. Using the object-side mirrors M2, M4 as an example, one footprint occurs upon entry of the light beam into the mirror group (here optically remote from the optical axis ($T_F$)), and two at subsequent reflections on object-side mirrors (here $R_P$ and, later, $R_F$).

In order to obtain an optical system free of vignetting, these footprints are not allowed to overlap. Instead, there must be a minimum distance between the footprints. This is made possible by designing the system such that for each set of mirrors (mirrors M2 and M4 on the object-side and mirrors M1 and M3 on the image-side) the chief ray heights for two reflections and one transmission are substantially different from each other. Therefore, only one footprint can include the optical axis. This footprint (in transmission or in reflection) may be close to a pupil surface. The remainder of the footprints (in reflection or transmission) may not include the optical axis, indicating the tendency that these reflections or transmissions will be closer to a field surface, which may be an intermediate image.

In general, the positions of the footprints on the object side of the mirror group in terms of chief ray heights may be characterized as follows. The mirror group entry may be positioned in a region where radiation exiting the front lens group has an entry chief ray height. The second reflecting area may be positioned in a region where radiation impinging on the second mirror has a second chief ray height deviating from the entry chief ray height in a first direction. The fourth reflecting area may positioned in a region where radiation impinging on the fourth mirror has a fourth chief ray height deviating from the entry chief ray height in a second direction opposite to the first direction.

Embodiments of type A require an essentially telecentric input of radiation, which can be provided by an imaging subsystem serving as a relay system arranged between object surface and mirror group entry. Considerable axial installation space may be required for that type of relay system.

Having explained the principle underlying the development of members of this design family depending on position and angle of the chief ray at the mirror group entry, the other branches of the family are developed in a similar fashion. The branch illustrated in FIG. 8(b) is characterized by a chief ray entering the mirror group outside the optical axis near a field surface ($T_F$) inclined to the optical axis such that a first reflection at the first mirror M1 will occur near a pupil surface ($R_P$). Two types of basic designs (type B and type C) may be derived for this type.

Embodiments of type B and C are characterized by a convergent beam on the entry side of the mirror group and a divergent beam on the exit side of the mirror group. Where an in-line system is required, relatively large lenses would be needed close to the mirrors, which may not be desirable if a compact projection objective is wanted.

The branch of the design family depicted in FIG. 8(c) is characterized by an off-axis mirror group entry and a convergent beam with a transmission near a field plane ($T_F$) followed by subsequent reflection on the first mirror M1 near a field surface on the opposite side of the optical axis ($R_F$). Only one embodiment with four reflections (type D) appears theoretically possible. Since an off-axis beam strongly converging is required on the entry side, this variant appears less attractive for compact in-line catadioptric systems.

The fourth branch in FIG. 8(d) is characterized by a mirror group entry close to the optical axis, preferably including that optical axis, such that a first transmission occurs near a pupil surface ($T_P$) and a subsequent first reflection close to a field surface ($R_F$). A total number of four different types (E, F, G, H) can be obtained based on this type of radiation entry. Briefly, type E is characterized by the fact that the mirror group exit MGO is positioned remote from the optical axis such that a transmission near a field surface ($T_F$) occurs at the mirror group exit. Both types F and H, in contrast, are characterized by the fact that a mirror group exit close to the optical axis, preferable including that optical axis, is present to allow that the radiation beam exists the mirror group in the vicinity of a pupil surface ($T_P$). Whereas type G appears less attractive due to the strongly diverging beam at the mirror group exit, types E, F and H appear to be attractive when designing catadioptric in-line projection objectives capable of transporting a large entendu of the effective object field without vignetting at very high numerical apertures, particularly at numerical apertures allowing immersion lithography with image-side numerical apertures NA>1. Preferred embodiments will be explained below.

Other branches (not shown) are related to the branches shown in FIG. 8 by mirror symmetry with respect to an axial plane perpendicular to the meridional plane (paper plane).

Some principles may be derived from the above considerations. Basically, it appears desirable that small footprints are obtained on the mirror surfaces. This appears advantageous with regard to the size of the mirrors as well as to the size of the effective object field which can be imaged through such system. Further, the footprints near pupil surfaces in the region of the mirror group should be small to avoid vignetting of the beam at a mirror edge. Further, considering that the product of paraxial chief ray angle CRA and the size of a pupil is a constant in an optical imaging system (Lagrange invariant), a small pupil corresponds to large chief ray angles at that pupil surface.

Figure 9A:
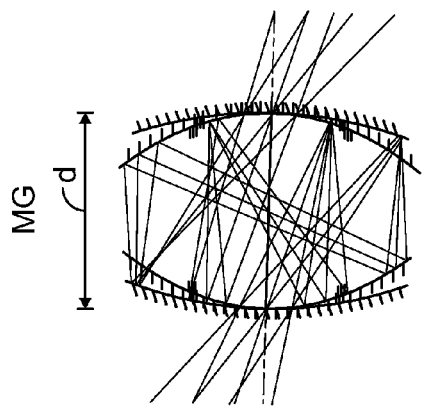
FIG. 9 shows a mirror group with parabolic concave mirrors and a beam path of a low aperture beam (a) and a high aperture beam (b)
Figure 9B:
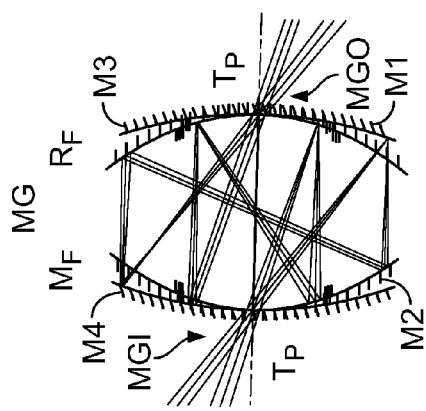

Further, the systematic derivation of desirable variants of the design family allows to indicate useful features with respect to the paraxial construction (refractive/reflective powers and distances of the optical elements) as well as with respect to the aspheric shape of the mirror surfaces. This will be explained in connection with FIG. 9 showing a mirror group MG and a radiation beam entering and exiting a mirror group at mirror group entry and mirror group exit, respectively, both positioned near a pupil surface of the system. A beam with a small aperture is shown in FIG. 9(a), whereas a larger aperture beam is shown in FIG. 9(b) for the same mirror group.

In the notation explained above, the object-side mirrors M2, M4 are characterized by the sequence $T_P$-$R_F$-$R_F$, whereas the image-side mirror M1, M3 are characterized by the sequence $R_F$-$R_F$-$T_P$. Two intermediate images are formed within the mirror group.

The object-side mirrors M2, M4 and the image-side mirrors M1, M3 each have the same vertex position, where an axial distance d exists between the object-side and image-side vertex position. The radiation beam transits the object-side mirrors in the vertex region around the optical axis and is collimated by first mirror M1 consistent with first mirror M1 being a paraboloid mirror having a curvature radius $r_{M1}$=2d at the vertex. Second mirror M2 is designed to reflect the chief ray running parallel to the optical axis such that the beam transits the center of the mirror group, indicating that second mirror M2 is a paraboloid having curvature radius $r_{M2}$=d. Likewise, $r_{M3}$=d and $r_{M4}$=2d for the paraboloid mirrors M3 and M4. Having an object situated a suitable distance upstream of the mirror group, the beam path shown in FIG. 9 can be obtained. A mirror group of this type can be supplemented by additional optical elements to form a catadioptric projection objective by providing a front lens group with positive refractive power upstream of the mirror group entry MGI and a focusing group with positive refractive power downstream of the mirror group exit MGO.

The following examples of embodiments are based on the design principles laid out above. All embodiments have the same light conductance value (etendu) at a constant object field radius and image-side numerical aperture NA=1.20 suitable for immersion lithography. With regard to vignetting, the designs are optimized for an effective object field having rectangular shape and dimensions 26 mm×5.5 mm. The reduction ratio is 4:1 (magnification |β=0.25). One example (based on type H in FIG. 8) has already been discussed in detail in connection with FIGS. 1 to 3, where variants are shown in FIGS. 4 to 7.

Figure 10:
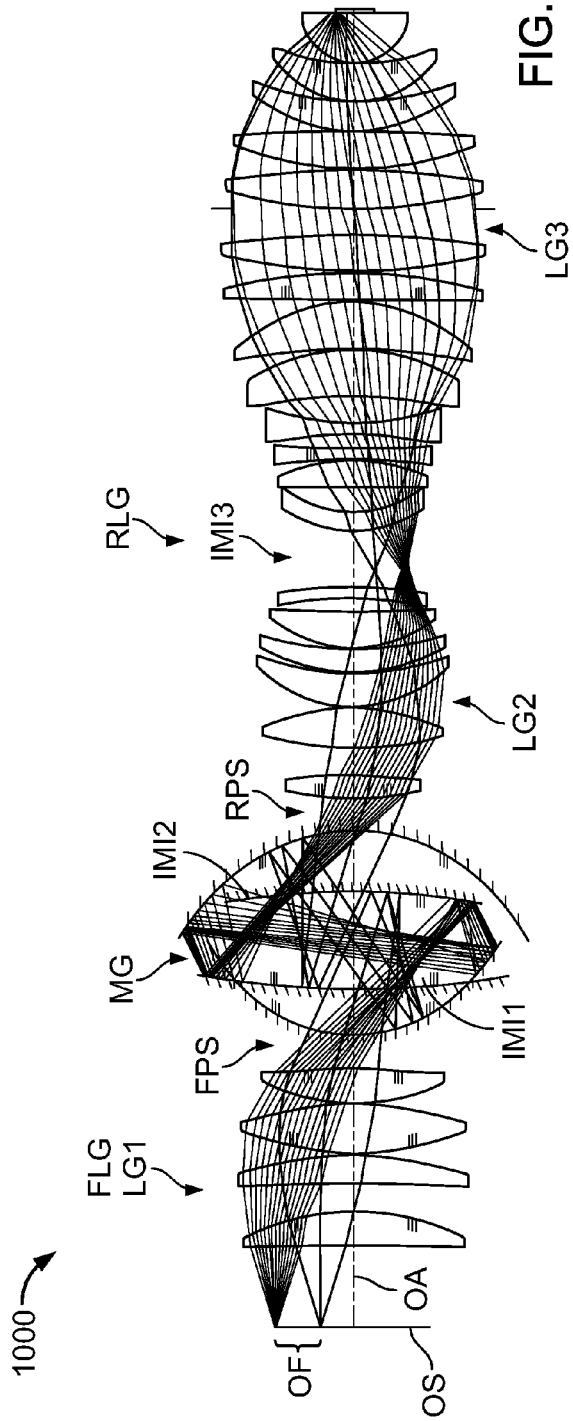
FIG. 10 shows and embodiment of a catadioptric projection objective of type F in FIG. 8 having three intermediate images.

FIG. 10 shows a projection objective 1000 based on type F of FIG. 8, where the surfaces of curvature of first mirror M1 and fourth mirror M4 have large radius indicating a small mirror sag. Here, the beam converged by front lens group FLG enters the mirror group in the vicinity of a system pupil FPS and forms a first intermediate image IMI1 on and/or near the first mirror M1. The beam reflected from the first mirror to the second mirror M2 positioned on the same side at the optical axis is essentially collimated by the second mirror M2 having strong surface curvature and transits a second pupil upon crossing the optical axis. After reflection on strongly curved third mirror M3 and weakly curved fourth mirror M4 positioned on the same side of the optical axis, the beam forms a second intermediate image IMI2 and exits the mirror group at mirror group exit MGO geometrically close to the rear pupil surface RPS. All four concave mirror have an aspheric mirror surface.

Second lens group LG2 forms a third intermediate image IMI3 in the region of the constriction CON before the beam is converged by the third lens group LG3 to form a high aperture beam converging on the image surface IS.

FIG. 11 shows a variant 1100 of the system of FIG. 10, where the mirrors of the mirror group MG are disposed mirror symmetrically around the mirror group plane MGP halfway between the most object-side and the most image-side mirror vertices. In this approach, the inner mirrors (closer to the mirror group plane) can be modified to further reduce the surface curvature. A limiting case is shown as objective 1200 in FIG. 12, where the first mirror M1 and the fourth mirror M4 are degenerated to form planar mirrors aligned perpendicular to the optical axis. As planar mirrors are optically neutral with respect to introduction or removal of optical aberrations, planar mirrors are usually only used as folding mirrors to deflect radiation and, thereby, to fold the optical axis of optical systems. Therefore, planar mirrors can be removed from the beam path without influencing the optical performance. However, vignetting problems may be introduced upon removing a planar mirror. The projection objective 1300 shown in FIG. 13 is basically derived from the embodiment 1200 of FIG. 12 by removing the planar mirrors M1, M4 and modifying the lens groups upstream and downstream of mirror group MG.

FIG. 14 shows the same projection objective 1300 where only the effective parts of the concave mirrors M1 and M2 are shown to facilitate understanding construction of this projection objective. The specification is given in tables 14, 14A. The projection objective has a first lens group LG1 acting as an imaging subsystem to form a first intermediate image IMI1. A second, catoptric subsystem is formed by a mirror group MG and designed to form a second intermediate image IMI2 from the first intermediate. A second lens group LG2 is designed as an imaging subsystem to form a third intermediate image IMI3 from the second intermediate image in a constriction region CON of the rear lens group RLG following the mirror group. A third lens group LG3 with positive refractive power serves to image the intermediate image on a reduced scale onto the image surface IS. The mirror MG consists of a first concave mirror M1 having a mirror surface facing the object side, and a second concave mirror M2 having a mirror surface facing the image side. A mirror group entry MGI is defined in the region where the curvature surface defined by the second mirror intersects the optical axis OA, whereas a mirror group exit MGO is defined where the surface of curvature of the first mirror M1 intersects the optical axis. Both intermediate images (at least the paraxial part thereof) are positioned within an intermirror space defined by the concave mirrors. Both mirrors are arranged near an intermediate image, i.e. optically remote from a pupil surface. The mirror group entry is positioned geometrically in an intermediate region between a front pupil surface downstream of the exit lens of the first lens group LG1 and the first intermediate image. Likewise, the mirror group exit is positioned intermediately between the second intermediate image and the subsequent pupil surface RPS position in the entry section of the second lens group LG2.

It is a characterizing feature of this type of two-mirror in-line projection objective that the angle included between the chief ray CR and the optical axis (chief ray angle CRA) may be as high as 70° or 80° or more indicated by the fact that the radiation beam crosses the optical axis between the first and second mirror almost at right angles. This corresponds to a small beam cross section at this pupil surface. High values for the chief ray angle are also obtained upstream and downstream of the mirror group in the region of the first and second intermediate images, respectively.

Although projection objectives including mirror groups according to types B, C, D or G of FIG. 8 are theoretically possible, they appear less desirable for the following reasons. High values of the chief ray angle CRA next to an intermediate image are needed at the mirror group entry and/or at the mirror group exit to obtain a strongly converging or strongly diverging chief ray in order to obtain a small footprint in a pupil surface. In order to obtain a strongly divergent or convergent chief ray at the mirror group entry outside the optical axis, the front lens group arranged between optical surface and mirror group entry needs to have strong refractive power provided by large diameter lenses. Likewise, if a strongly divergent beam emerging from the mirror group at an off-axis mirror group exit is provided, large lenses providing strong refractive power are needed to guide the beam towards the region of the pupil surface closest to the image surface, where an aperture stop may be positioned. Also, a plurality of relatively large lenses appears to be necessary to realize such systems. As a consequence, large lens diameters and/or large system length may be necessary in such systems.

Systems of type A or E are basically equivalent to each other with a difference lying in the radiation propagation direction. In order to obtain a telecentric beam off-axis at the mirror, group entry (type A) an imaging subsystem serving as a relay system would be required between object surface and mirror group, thereby increasing the system length in this part. A beam having a large chief ray angle emanating from the mirror group close to a pupil surface will normally require that the system part downstream of the mirror group is designed for creating an intermediate image, basically as described in connection with FIGS. 1 to 7, for example.

Mirror groups of type E requiring large chief ray angles (or a small pupil) at the mirror group entry and a telecentric off-axis beam at the mirror group exit will now be explained in connection with FIGS. 15 to 18. In each embodiment, a front lens group FLG serving as a relay system to provide large chief ray angles and a small beam diameter at the front pupil surface FPS close to the mirror group entry is provided. The axial length may be relatively short. In each case, the mirror group MG is designed for providing four reflections between mirror group entry and mirror group exit, thereby forming two intermediate images IMI1, IMI2. The first, second and fourth reflection are optically remote from a pupil surface, whereas the third reflection is near a pupil surface. In each case, the lenses downstream of the mirror group form an imaging subsystem including a constriction region CON with a local minimum of beam diameter for imaging the second intermediate image IMI2 onto the image surface IS. Relatively large lens diameters of lenses immediately downstream of the mirror group are one characterizing feature of these embodiments required to "capture" the off-axis intermediate image and to converge the beam towards the constriction region.

Embodiments of this type may be realized with two physically identical aspheric mirrors having an essentially parabolic shape, where the amount of curvature radius at the vertex, |r|, equals twice the distance d between the vertices of the mirrors. FIGS. 15(*a*) and (*b*) and FIG. 16 illustrate such embodiments. In FIG. 15(*a*) a low aperture beam is shown, whereas in (b) a similar beam is shown at higher numerical aperture to indicate the actual sizes of footprints expected in the region of the front pupil surfaces FPS and in the reflecting areas on the concave mirrors.

A projection objective 1600 with a telecentric beam at the second intermediate image close to the mirror group ext MGI is shown in FIG. 16 showing that large positive lenses with a diameter comparable to the diameter of the mirror group are required to focus the beam towards the image surface.

In order to facilitate lens manufacturing and to reduce system mass, this problem can be alleviated by providing a fourth mirror M4 having a larger refractive power, whereby a chief ray significantly converging at the third intermediate image is obtained (Projection objective 1700 in FIG. 17). Smaller lens diameters of the positive lenses immediately downstream of the mirror group exit are obtained. Note that the footprints of the beam on the image-side mirrors M1 and M3 are overlapping partially. This is made possible by constructing mirrors M1 and M3 on a single mirror substrate having a common surface of curvature, whereby a multiply reflecting mirror is provided which is used twice at reflecting areas overlapping at least partially.

A further improvement with respect to smaller lens diameters immediately downstream of the mirror group is shown exemplarily for projection objective 1800 in FIG. 18, where the radius of curvature of the second and fourth mirrors is further reduced when compared to the previous embodiments, thereby further increasing the chief ray angle to form a convergent beam at the mirror group exit MGO. In this embodiment the image-side mirrors M1, M3 are spherical with large curvature radius, whereas the object-side mirrors M2, M4 are aspherical. The specification is given in tables 18, 18A All embodiments presented so far have an axially compact mirror group providing strong Petzval overcorrection. In some embodiments, synergy effects are obtained for manufacturing and testing since mirrors identical in construction are used, e.g. in mirror-symmetric mirror groups. Also, mirror pairs provided on a common substrate are employed in some embodiments, thereby facilitating manufacturing and mounting. Providing strongly curved mirrors for Petzval correction allows to reduce the number and maximum diameters of lenses, thereby reducing overall dimension and mass consumption of the projection objectives. In some embodiments, a real intermediate image is accessible in the system part downstream of the mirror group, whereby correction of optical performance can be improved by applying a suitable field stop. In the embodiments without intermediate image downstream at the mirror group (e.g. FIGS. 17, 18) relatively flat concave mirrors can be used, which facilitates manufacturing of the mirrors.

All systems are designed for projecting a rectangular effective object field onto the image surface. Improvements with respect to optical design can be obtained if an arcuate field (also denoted "ring field" or "annular field") is used.

In the above mentioned embodiments having four mirrors, the mirrors are nested into each other such that the mirror group plane inside the mirror group is transited five times, thereby allowing to construct axially short mirror groups. In the following, catadioptric projection objectives suitable for immersion lithography are shown schematically, where other arrangements of mirror groups having four consecutive mirrors along a propagation of the projection beam are shown.

Figure 19:
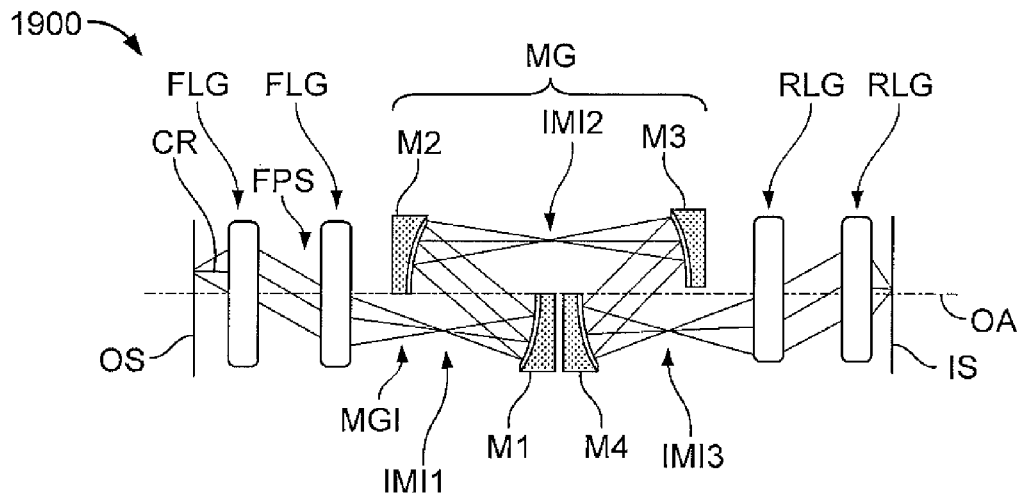
FIG. 19 shows a schematic representation of a catadioptric projection objective suitable for immersion lithography having a mirror group with four concave mirrors arranged in two subsequent pairs of two concave mirrors, the mirrors of a pair being disposed on different sides of the optical axis.

The projection objective 1900 of FIG. 19 has a refractive front lens group FLG following the object surface for forming a first intermediate image IMI1 from the object field. A second, purely reflective imaging subsystem formed by a first mirror M1 and a second mirror M2 having facing concave mirror surfaces is designed to form a second intermediate image IMI2. A third catoptric (purely reflective) imaging subsystem formed by a third mirror M3 and a fourth mirror M4 having facing concave mirror surfaces is designed to form a third intermediate image IMI3, which is then focused onto the image surface IS by a refractive rear lens group RLG. The mirror group entry MGI of the mirror group MG is formed next to second mirror M2 optically close to the first intermediate image, whereas the mirror group exit MGO is formed on the same side of the optical axis OA next to third mirror M3 optically near the third intermediate image IMI3. The front lens group FLG allows to position the first intermediate image IMI1 at an optimum position next to the second mirror and to shape the beam in the region of the mirror group entry such that beam vignetting at the second mirror M2 is avoided. Using an annular field instead of a rectangular field can contribute to avoiding vignetting. As all concave mirrors M1 to M4 are positioned optically closer to field surfaces (at intermediate images) than to pupil surfaces (at intersections between the chief ray CR and the optical axis OA), mirrors with compact size can be used, further contributing to define an optical path where a larger aperture beam from a large object field can be guided through the mirror group without vignetting. The off-axis object field can, therefore, be positioned relatively close to the optical axis, whereby the size of the object field which must be corrected sufficiently, can be minimized.

Figure 20:
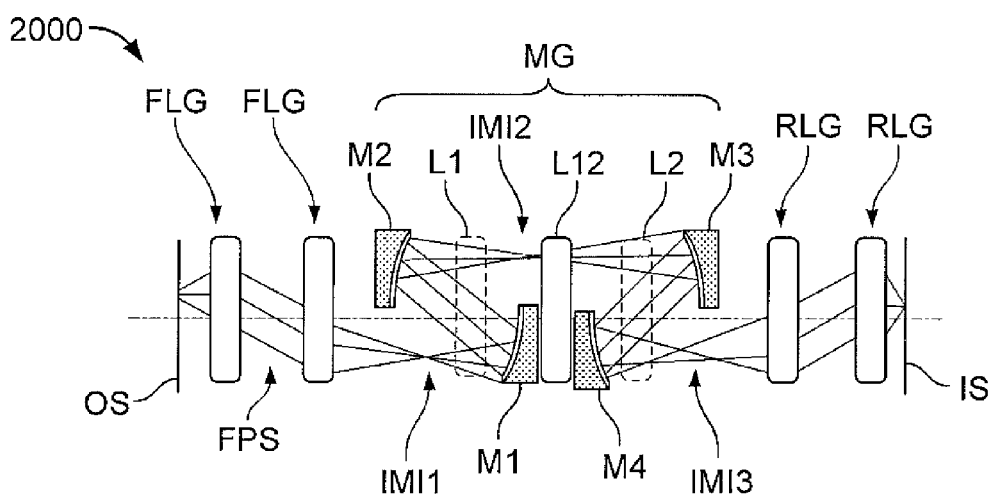
FIG. 20 shows various optional variants of the embodiment of FIG. 19 where one or more lenses are inserted into the mirror group.

As demonstrated by the projection objective 2000 of FIG. 20, the basic design can be modified to include one or more lenses optically within the mirror group such that a catadioptric imaging subsystem imaging the first intermediate image into the third intermediate image is obtained. For example, a lens or lens group L1 may be positioned geometrically between the first and second mirror in order to influence the correction status of second intermediate image. IMI2. One or more lenses used twice or three times in transmission between the first and second intermediate image may be used. Alternatively, or in addition, a lens or lens group L2 may be arranged geometrically between the fourth and third mirror to influence the imaging from second intermediate image IMI2 to third intermediate image IMI3.

Preferably, a positive lens group L12 may be arranged optically between the second and third mirrors M2, M3 close to the second intermediate image IMI2 in order to optimize the transition between the second and third imaging subsystems.

Figure 21:
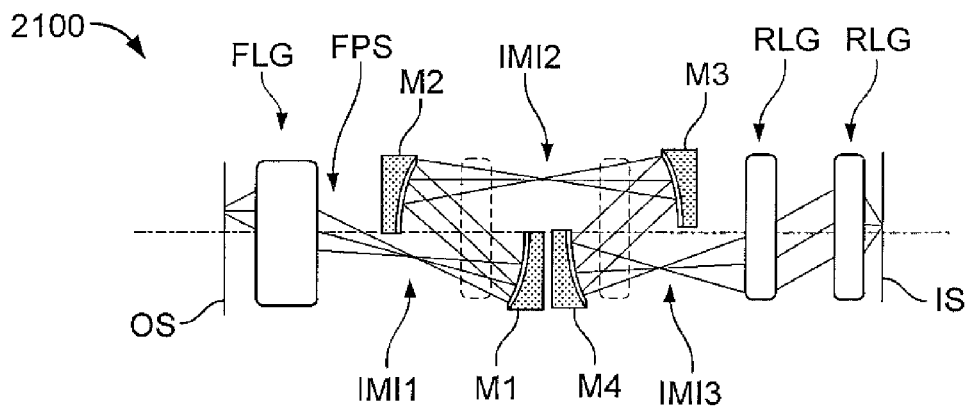
FIG. 21 shows a variant of the embodiments of FIG. 19 or 20 having a front lens group providing a front pupil surface outside the front lens group.

If a compact size particularly on the object side is desired, a compact front lens group FLG designed as a Fourier lens group for creating a front pupil surface FPS near the exit of the front lens group may be provided, as shown schematically for the projection objective 2100 of FIG. 21. This type of front lens group may be combined with each of the variants of mirror groups shown in FIG. 19, 20 or 21.

Figure 22:
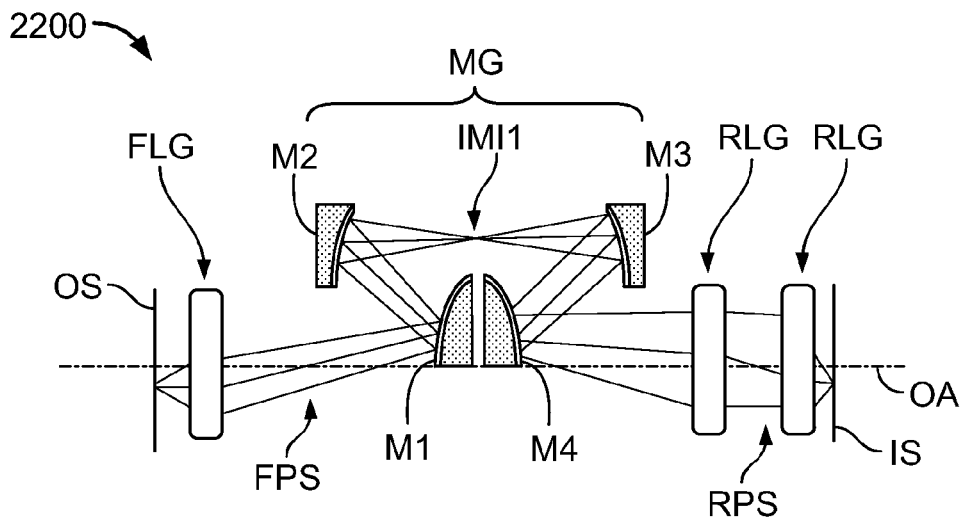
FIG. 22 shows an embodiment of a catadioptric projection objective suitable for immersion lithography having one single intermediate image within a mirror group formed by two concave mirrors and two convex mirrors.

The projection objective 2200 of FIG. 22 is designed to image the object field from the object surface OS onto the image surface IS while creating exactly one intermediate image IMI1 inside the mirror group MG consisting of four mirrors M1 to M4. In this embodiment, a first catadioptric imaging subsystem is formed by the refractive front lens group FLG having positive refractive power, a convex mirror M1 providing negative refractive power, and the subsequent concave mirror M2 having positive refractive power. The first intermediate image IMI2 is imaged by the catadioptric second subsystem formed by concave mirror M3 having positive refractive power, convex mirror M4 providing negative refractive power, and a refractive rear lens group RLG having positive refractive power. The inner mirrors M1, M4 of the mirror group MG may be formed on one common mirror substrate, e.g. a substrate shaped as a biconvex half-lens having convex surfaces coated with a reflection coating.

In the embodiments of FIGS. 19 to 21, the consecutive concave mirrors M1, M2 of the second subsystem, and M3, M4 of the third subsystem are positioned on opposite sides of the optical axis, thereby creating a Z-shaped beam path between subsequent intermediate images, where the projection beam crosses the optical axis at relatively high angles (e.g. between 30° and 60°). In contrast, the mirrors M1 to M4 of the mirror group of projection objective 2200 are arranged on one side of the optical axis only. This arrangement facilitates providing projection objectives which can be used with two separate optical channels on either side of the optical axis, as explained below in connection with FIGS. 23 and 24.

Figure 23:
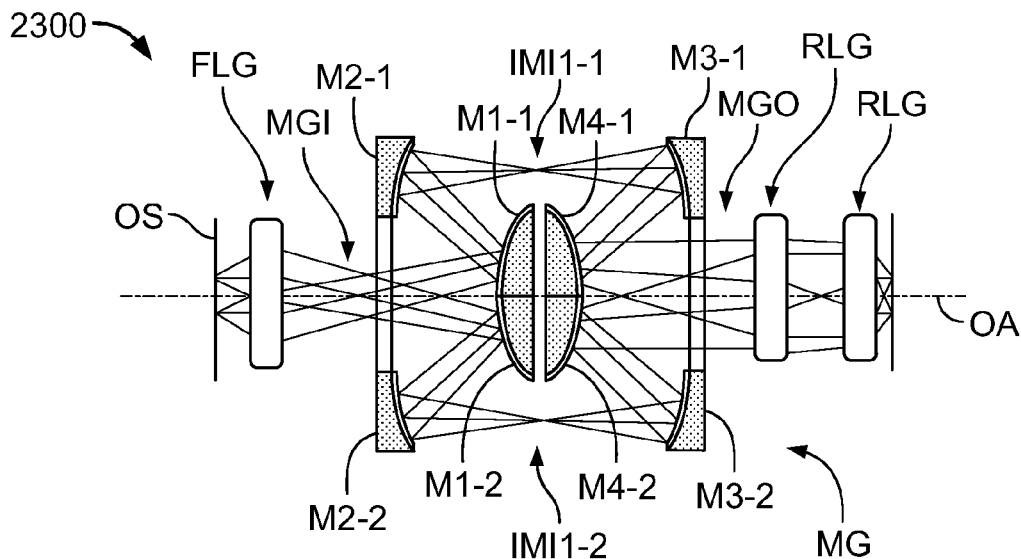
FIG. 23 shows a schematic representation of a double-channel catadioptric projection objective having two optical channels on opposite sides of the optical axis provided by a catoptric mirror group having concave and convex mirrors.

The double-channel projection objective 2300 in FIG. 23 combines two optically identical optical channels of the type shown in FIG. 22. The first optical channel includes, in that sequence, the positive front lens group FLG, convex mirror M1-1, concave mirror M2-1, concave mirror M3-1, convex mirror M4-1, and the refractive positive rear lens group RLG. The optical elements for the second channel are arranged mirror-symmetrically to these optical elements with respect to a mirror plane including the optical axis and aligned perpendicular to the meridional plane shown in the drawings. Therefore, the second channel includes, in that sequence, the positive front lens group FLG (used for both optical channels), a convex first mirror M1-2, a concave second mirror M2-2, a concave third mirror M3-2, a convex fourth mirror M4-2, and the positive refractive rear lens group RLG used in both optical channels. The inner mirrors M1-1, M1-2, M4-1 and M4-2 may be provided on one common mirror substrate shaped like a biconvex positive lens. Also, the object side concave mirrors M2-1 and M2-2 may be provided on one common mirror substrate having a transmissive portion provided by a hole or the like to form the mirror group entry MGI around the optical axis OA. Likewise, the image-side concave mirrors M3-1 and M3-2 may also be formed on a common mirror substrate having a central opening forming the mirror group exit MGO.

Figure 24:
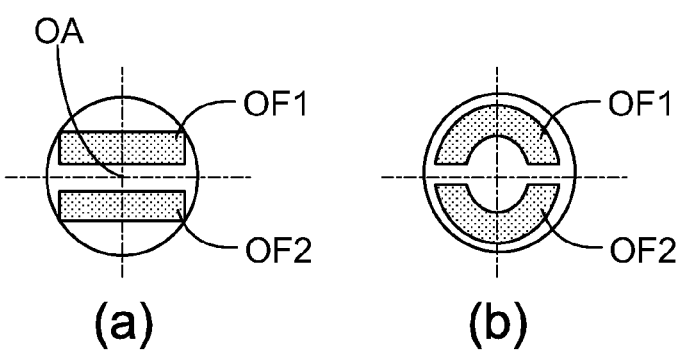
FIG. 24 shows an axial view of the object surface of a double-channel projection objective having rectangular object fields (a) or arcuate object fields (b).

As demonstrated schematically in FIG. 24, a double-channel catadioptric projection objective of the basic type shown in FIG. 24 allows to image two identical off-axis object fields OF1, OF2 disposed on opposite sides of the optical axis OA when viewed in the meridional section simultaneously onto two identical image fields. The effectively used object field may be rectangular, or annular, as shown in FIG. 24(*a*) or (*b*), respectively.

Both optical channels may be used simultaneously. One optical channel may, for example, be used for imaging a pattern on a reticle onto a photosensitive substrate arranged in the image surface. The other optical channel may be used for measuring purposes, thereby forming a part of an optical measuring system for focus detection or for acquiring other measuring data useful for operating a microlithographic projection system.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The contents of all the claims is made part of this description by reference.

TABLE 1

(k25)

| SURFACE | RADIUS | THICKNESS | MATERIAL | INDEX | SEMIDIAM. |
|---|---|---|---|---|---|
| 0 | 0.000000 | 71.809371 | | | 75.0 |
| 1 | −327.637978 | 32.132494 | SILUV | 1.560491 | 93.5 |
| 2 | −169.135759 | 0.996209 | | | 97.3 |
| 3 | 193.567383 | 45.881322 | SILUV | 1.560491 | 101.4 |
| 4 | −950.104533 | 40.297223 | | | 99.3 |
| 5 | 332.998259 | 22.215367 | SILUV | 1.560491 | 79.9 |
| 6 | −250798.749340 | 1.558868 | | | 76.0 |
| 7 | 147.021716 | 31.349085 | SILUV | 1.560491 | 66.5 |
| 8 | −269.376838 | 3.738879 | | | 60.2 |
| 9 | −574.049170 | 12.787736 | SILUV | 1.560491 | 55.4 |
| 10 | −358.379807 | 310.085925 | | | 50.1 |
| 11 | −205.152630 | −261.958073 | REFL | | 194.6 |
| 12 | 202.931962 | 243.803700 | REFL | | 133.4 |
| 13 | −202.931962 | −261.958073 | REFL | | 137.1 |
| 14 | 205.152630 | 313.323179 | REFL | | 189.7 |
| 15 | 333.723117 | 21.965974 | SILUV | 1.560491 | 43.8 |
| 16 | −148.735190 | 1.027909 | | | 48.7 |
| 17 | 297.237468 | 17.668324 | SILUV | 1.560491 | 57.4 |
| 18 | −22655.613711 | 0.996972 | | | 60.6 |
| 19 | 266.059259 | 9.996029 | SILUV | 1.560491 | 64.6 |
| 20 | 167.429960 | 17.644922 | | | 67.2 |
| 21 | 316.769307 | 45.337134 | SILUV | 1.560491 | 75.9 |
| 22 | −141.417016 | 1.734111 | | | 79.0 |
| 23 | 180.402896 | 43.553038 | SILUV | 1.560491 | 81.2 |

TABLE 1-continued (k25)

| SURFACE | RADIUS | THICKNESS | MATERIAL | INDEX | SEMIDIAM. |
|---|---|---|---|---|---|
| 24 | −229.551725 | 0.994573 | | | 79.7 |
| 25 | 106.098586 | 21.908375 | SILUV | 1.560491 | 61.3 |
| 26 | 207.804050 | 37.790308 | | | 56.4 |
| 27 | 149.875422 | 32.465788 | SILUV | 1.560491 | 51.0 |
| 28 | 96.401231 | 25.902263 | | | 50.9 |
| 29 | −805.354747 | 12.377317 | SILUV | 1.560491 | 55.6 |
| 30 | −291.950807 | 1.619530 | | | 59.6 |
| 31 | 5643.346208 | 25.483686 | SILUV | 1.560491 | 61.9 |
| 32 | 359.386131 | 17.719936 | | | 73.0 |
| 33 | −484.371794 | 43.227135 | SILUV | 1.560491 | 76.5 |
| 34 | −111.090269 | 0.983849 | | | 83.1 |
| 35 | −282.651715 | 16.686529 | SILUV | 1.560491 | 88.7 |
| 36 | −193.331408 | 14.595779 | | | 93.1 |
| 37 | 1289.507216 | 36.402691 | SILUV | 1.560491 | 104.6 |
| 38 | −290.056559 | 5.818675 | | | 106.2 |
| 39 | 294.615329 | 37.984725 | SILUV | 1.560491 | 106.1 |
| 40 | −883.131044 | 4.637061 | | | 104.5 |
| 41 | 0.000000 | 3.884710 | | | 101.3 |
| 42 | 304.452540 | 32.963227 | SILUV | 1.560491 | 100.0 |
| 43 | −1175.091696 | 0.988159 | | | 98.0 |
| 44 | 205.061398 | 28.472058 | SILUV | 1.560491 | 89.8 |
| 45 | −1772.564195 | 0.942761 | | | 86.1 |
| 46 | 88.191089 | 36.108906 | SILUV | 1.560491 | 69.2 |
| 47 | 217.978071 | 0.871387 | | | 60.3 |
| 48 | 51.039320 | 40.196538 | SILUV | 1.560491 | 43.4 |
| 49 | 0.000000 | 3.000000 | WATER | 1.430000 | 23.6 |
| 50 | 0.000000 | 0.000000 | | | 18.8 |

TABLE 1A

Aspheric Constants

| SURFACE | 2 | 5 | 8 | 11 | 13 |
|---|---|---|---|---|---|
| K | 0 | 0 | 0 | −0.224372 | −1.25495 |
| C1 | −5.372092E−08 | −4.168360E−08 | 2.254214E−07 | −2.785907E−10 | −1.081432E−08 |
| C2 | 3.653441E−12 | 1.467973E−11 | 1.385239E−11 | 4.167344E−14 | −1.066392E−13 |
| C3 | −2.693024E−16 | −4.220656E−16 | −1.339238E−15 | 4.815732E−23 | −5.881454E−22 |
| C4 | 1.948646E−20 | −1.238484E−19 | 9.377023E−20 | 4.815732E−23 | −5.881454E−22 |
| C5 | −8.492783E−25 | 5.618258E−24 | −2.932861E−23 | −4.290162E−28 | 1.272860E−26 |

| SURFACE | 15 | 30 | 35 | 45 | 47 |
|---|---|---|---|---|---|
| K | 0 | 0 | 0 | 0 | 0 |
| C1 | −3.171151E−07 | 3.087830E−07 | −1.035707E−07 | 9.881636E−08 | 3.873571E−08 |
| C2 | 1.900253E−11 | 2.401684E−11 | 2.333117E−12 | −5.495318E−12 | 1.564412E−11 |
| C3 | −5.773786E−15 | −2.401684E−15 | −9.110880E−18 | 5.554735E−16 | −4.363822E−15 |
| C4 | 1.930642E−19 | 1.697076E−19 | 5.617531E−21 | −3.421920E−20 | 7.459036E−19 |
| C5 | 6.320682E−23 | −1.527037E−22 | 9.796509E−25 | 1.357995E−24 | −6.088648E−23 |

TABLE 14

(k34)

| SURFACE | RADIUS | THICKNESS | MATERIAL | INDEX | SEMIDIAM. |
|---|---|---|---|---|---|
| 0 | 0.000000 | 71.724752 | | | 75.0 |
| 1 | −4121.411157 | 46.865076 | SILUV | 1.560383 | 97.2 |
| 2 | −149.962898 | 3.423696 | | | 99.7 |
| 3 | −367.252336 | 29.694352 | SILUV | 1.560383 | 97.9 |
| 4 | −182.570909 | 48.276329 | | | 98.7 |
| 5 | 959.073897 | 16.529732 | SILUV | 1.560383 | 74.8 |
| 6 | −488.993602 | 1.002605 | | | 73.1 |
| 7 | 128.750652 | 36.221741 | SILUV | 1.560383 | 65.2 |
| 8 | −280.818471 | 219.182223 | | | 61.1 |
| 9 | −113.350282 | −168.653496 | REFL | | 115.9 |
| 10 | 113.350282 | 211.312559 | REFL | | 119.9 |
| 11 | 1682.892626 | 38.461666 | SILUV | 1.560383 | 52.7 |

TABLE 14-continued (k34)

| SURFACE | RADIUS | THICKNESS | MATERIAL | INDEX | SEMIDIAM. |
|---|---|---|---|---|---|
| 12 | −115.634084 | 1.199577 | | | 61.0 |
| 13 | 297.973893 | 28.937392 | SILUV | 1.560383 | 73.7 |
| 14 | −377.238203 | 1.001567 | | | 75.8 |
| 15 | 139.258715 | 30.708005 | SILUV | 1.560383 | 83.0 |
| 16 | 387.895733 | 1.004927 | | | 81.7 |
| 17 | 110.677937 | 31.392930 | SILUV | 1.560383 | 80.4 |
| 18 | 197.438459 | 20.626685 | | | 76.0 |
| 19 | 98.062272 | 27.890402 | SILUV | 1.560383 | 65.5 |
| 20 | 195.590036 | 18.028744 | | | 59.3 |
| 21 | −335.659469 | 9.999763 | SILUV | 1.560383 | 56.7 |
| 22 | 4264.334463 | 40.862649 | | | 52.4 |
| 23 | −276.324463 | 29.760282 | SILUV | 1.560383 | 66.9 |

TABLE 14-continued (k34)

| SURFACE | RADIUS | THICKNESS | MATERIAL | INDEX | SEMIDIAM. |
|---|---|---|---|---|---|
| 24 | −112.588669 | 0.999906 | | | 72.0 |
| 25 | −391.255584 | 31.195933 | SILUV | 1.560383 | 76.3 |
| 26 | −129.691815 | 37.478507 | | | 78.8 |
| 27 | −257.703595 | 9.999895 | SILUV | 1.560383 | 74.6 |
| 28 | −938.678312 | 8.021413 | | | 75.7 |
| 29 | −559.508427 | 9.999819 | SILUV | 1.560383 | 76.0 |
| 30 | 166.815587 | 32.285194 | | | 79.4 |
| 31 | −414.350925 | 32.423065 | SILUV | 1.560383 | 81.9 |
| 32 | −147.795503 | 0.999792 | | | 87.4 |
| 33 | −644.590081 | 21.574078 | SILUV | 1.560383 | 94.6 |
| 34 | −296.542816 | 0.999864 | | | 97.7 |
| 35 | 3311.074462 | 21.600111 | SILUV | 1.560383 | 100.9 |
| 36 | −465.020970 | 1.496340 | | | 103.1 |
| 37 | 255.249942 | 32.190038 | SILUV | 1.560383 | 108.8 |
| 38 | 1404.840128 | 37.695060 | | | 107.9 |
| 39 | 0.000000 | −15.202638 | | | 107.4 |
| 40 | 277.432344 | 31.650721 | SILUV | 1.560383 | 108.0 |
| 41 | 2570.652765 | 4.962705 | | | 106.8 |
| 42 | 258.809947 | 32.551744 | SILUV | 1.560383 | 104.2 |
| 43 | 3849.847647 | 0.999900 | | | 101.9 |
| 44 | 182.274330 | 26.041991 | SILUV | 1.560383 | 94.3 |
| 45 | 499.477958 | 0.999732 | | | 89.6 |
| 46 | 128.727133 | 40.872544 | SILUV | 1.560383 | 82.0 |
| 47 | −1207.592715 | 0.997468 | | | 75.4 |
| 48 | 54.278105 | 48.712729 | SILUV | 1.560383 | 47.8 |
| 49 | 0.000000 | 3.000000 | WATER | 1.430000 | 23.4 |
| 50 | 0.000000 | 0.000000 | | | 18.8 |

TABLE 14A

Aspheric Constants

| SURFACE | 2 | 5 | 8 | 10 | 11 |
|---|---|---|---|---|---|
| K | 0 | 0 | 0 | −0.262667 | 0 |
| C1 | −1.436094E−08 | −1.146558E−07 | −2.513372E−08 | 4.202263E−09 | −1.544236E−07 |
| C2 | 1.736738E−12 | −3.677693E−12 | 9.109044E−12 | 1.189315E−13 | 1.308220E−11 |
| C3 | 1.652186E−16 | 3.300817E−16 | −4.411748E−16 | 6.423802E−18 | −1.220101E−15 |

| SURFACE | 28 | 35 | 45 | 47 |
|---|---|---|---|---|
| K | 0 | 0 | 0 | 0 |
| C1 | 1.560789E−07 | −2.585328E−08 | 7.159379E−08 | 9.964302E−08 |
| C2 | −2.463134E−11 | −4.603895E−13 | −1.225190E−12 | −2.343372E−12 |
| C3 | 1.301161E−15 | −3.126818E−17 | 4.705364E−17 | 1.692824E−16 |

TABLE 18

(k39)

| SURFACE | RADIUS | THICKNESS | MATERIAL | INDEX | SEMIDIAM. |
|---|---|---|---|---|---|
| 0 | 0.000000 | 43.647197 | | | 75.0 |
| 1 | 480.810746 | 22.450775 | SILUV | 1.560383 | 91.5 |
| 2 | −2601.917214 | 0.999999 | | | 92.9 |
| 3 | 244.716473 | 42.646541 | SILUV | 1.560383 | 96.0 |
| 4 | −475.459049 | 5.206433 | | | 96.4 |
| 5 | −65081.942196 | 30.369493 | SILUV | 1.560383 | 95.3 |
| 6 | −282.091757 | 4.319503 | | | 94.7 |
| 7 | 4054.660864 | 21.027317 | SILUV | 1.560383 | 88.4 |
| 8 | −425.538135 | 11.058617 | | | 86.1 |
| 9 | 141.770075 | 43.413138 | SILUV | 1.560383 | 74.0 |
| 10 | −504.879053 | 228.016645 | | | 63.4 |
| 11 | −16139.952712 | −191.788330 | REFL | | 222.9 |
| 12 | 279.609418 | 191.788330 | REFL | | 259.2 |
| 13 | −16139.952712 | −191.788330 | REFL | | 140.0 |
| 14 | 279.609418 | 222.223946 | REFL | | 216.7 |
| 15 | 595.895710 | 11.551775 | SILUV | 1.560383 | 164.0 |
| 16 | 493.518105 | 0.999953 | | | 160.3 |
| 17 | 167.407331 | 52.914514 | SILUV | 1.560383 | 143.3 |
| 18 | 257.576900 | 0.999867 | | | 136.3 |
| 19 | 169.771344 | 48.837857 | SILUV | 1.560383 | 125.3 |
| 20 | 383.581700 | 57.475068 | | | 116.2 |
| 21 | 1366.696104 | 10.061298 | SILUV | 1.560383 | 76.7 |
| 22 | 104.842690 | 46.789200 | | | 65.3 |
| 23 | −218.633249 | 10.006978 | SILUV | 1.560383 | 62.9 |
| 24 | 123.981552 | 28.301688 | | | 63.1 |
| 25 | −420.007166 | 23.760089 | SILUV | 1.560383 | 64.8 |
| 26 | −136.760204 | 20.382264 | | | 69.2 |
| 27 | −87.639997 | 11.719453 | SILUV | 1.560383 | 70.2 |
| 28 | 11545.411095 | 16.873327 | | | 96.9 |

TABLE 18-continued (k39)

| SURFACE | RADIUS | THICKNESS | MATERIAL | INDEX | SEMIDIAM. |
|---|---|---|---|---|---|
| 29 | −421.532046 | 61.462388 | SILUV | 1.560383 | 101.8 |
| 30 | −131.126498 | 1.164116 | | | 111.0 |
| 31 | −4703.328932 | 42.525814 | SILUV | 1.560383 | 136.9 |
| 32 | −322.106158 | 18.815740 | | | 140.3 |
| 33 | 566.126522 | 59.056558 | SILUV | 1.560383 | 151.9 |
| 34 | −681.660146 | 0.999644 | | | 151.9 |
| 35 | 419.172640 | 38.681402 | SILUV | 1.560383 | 146.8 |
| 36 | −89485.147274 | 1.762260 | | | 144.9 |
| 37 | 0.000000 | −0.762294 | | | 144.4 |
| 38 | 339.457499 | 31.487971 | SILUV | 1.560383 | 138.4 |
| 39 | 918.153311 | 0.999905 | | | 135.1 |
| 40 | 263.015881 | 18.899856 | SILUV | 1.560383 | 127.3 |
| 41 | 351.235101 | 0.999907 | | | 122.4 |
| 42 | 180.421341 | 26.449443 | SILUV | 1.560383 | 116.3 |
| 43 | 226.435883 | 0.999902 | | | 110.0 |
| 44 | 155.314905 | 73.471946 | SILUV | 1.560383 | 104.0 |
| 45 | 2619.914961 | 0.999776 | | | 80.8 |
| 46 | 62.797187 | 54.721118 | SILUV | 1.560383 | 53.4 |
| 47 | 0.000000 | 3.000000 | WATER | 1.430000 | 23.3 |
| 48 | 0.000000 | 0.000000 | | | 18.8 |

TABLE 18A

Aspheric Constants

| SURFACE | 3 | 5 | 8 | 10 | 12 |
|---|---|---|---|---|---|
| K | 0 | 0 | 0 | 0 | −0.218707 |
| C1 | −5.326670E−08 | 3.048880E−08 | 4.205559E−08 | 3.924322E−07 | 0.000000E+00 |
| C2 | 5.331856E−12 | −1.401988E−11 | −7.663654E−12 | −5.732989E−11 | 0.000000E+00 |
| C3 | −4.494010E−16 | 9.117764E−16 | 6.020378E−16 | 3.684328E−15 | 0.000000E+00 |

| SURFACE | 16 | 25 | 41 | 45 |
|---|---|---|---|---|
| K | 0 | 0 | 0 | 0 |
| C1 | −5.147358E−09 | −1.191436E−07 | 1.653223E−08 | 7.662196E−08 |
| C2 | −4.097558E−14 | 5.549394E−13 | 6.240040E−14 | −2.469195E−12 |
| C3 | 1.839836E−18 | 1.767377E−16 | −3.065806E−19 | 1.239093E−16 |

The invention claimed is:

1. A catadioptric projection objective for imaging an off-axis object field arranged in an object surface of the projection objective onto an off-axis image field arranged in an image surface of the projection objective while creating at least one intermediate image comprising in that order along a straight optical axis:
   a first imaging subsystem for imaging the object field provided in the object surface into a first intermediate image;
   a second imaging subsystem for imaging the first intermediate image into a second intermediate image;
   a third imaging subsystem for imaging the second intermediate image into a third intermediate image;
   a fourth imaging subsystem for imaging the third intermediate image onto the image plane;
   wherein the second subsystem includes a first mirror having a first continuous mirror surface and a second mirror having a second continuous mirror surface facing the first mirror surface;
   the third subsystem includes a third mirror having a third continuous mirror surface and a fourth concave mirror having a fourth continuous mirror surface facing the third mirror surface;
   at least two of the mirrors being concave mirrors having a concave mirror surface having a surface of curvature defining a mirror axis on the optical axis.

2. Projection objective according to claim 1, wherein all concave mirrors are arranged optically remote from a pupil surface.

3. Projection objective according to claim 1, wherein the first, second, third and fourth mirrors are concave mirrors.

4. Projection objective according to claim 1, wherein a mirror group formed by the first, second, third and fourth mirrors is a purely reflective (catoptric) mirror group.

* * * * *

UNITED STATES PATENT AND TRADEMARK OFFICE
CERTIFICATE OF CORRECTION

PATENT NO. : 8,363,315 B2
APPLICATION NO. : 11/578101
DATED : January 29, 2013
INVENTOR(S) : Alexander Epple et al.

It is certified that error appears in the above-identified patent and that said Letters Patent is hereby corrected as shown below:

On the Title Page:

Page 3, Other Publications, column 1, line 2, delete "Curcuit Appel" and insert --Circuit Appeal--, therefor.

Page 3, Other Publications, column 2, line 20, delete "Relatred" and insert --Related--, therefor.

Page 3, Other Publications, column 2, line 27, delete "Stanidng" and insert --Standing--, therefor.

Page 4, Other Publications, column 2, line 41, delete "BPAIi" and insert --BPAI--, therefor.

Page 5, Other Publications, column 2, line 18, delete "BAPI" and insert --BPAI--, therefor.

Page 7, Other Publications, column 1, line 7, delete "Microlithogtaphy," and insert --Microlithography--, therefor.

Page 7, Other Publications, column 1, line 21, delete "BPAIi" and insert --BPAI--, therefor.

Page 7, Other Publications, column 1, line 35, delete "BPAIi" and insert --BPAI--, therefor.

Page 7, Other Publications, column 2, line 51, delete "20011" and insert --2011--, therefor.

In the Specification:

Column 1, line 55, delete "correctings" and insert --correcting--, therefor.

Column 3, line 26, delete "JP 2003114387" and insert --JP2003/114387--, therefor.

Column 3, line 42, delete "A 1" and insert --A1--, therefor.

Column 4, line 20, delete "abberations" and insert --aberrations--, therefor.

Column 18, line 62, delete "etendu" and insert --etendue--, therefor.

Column 18, line 67, delete "|β=0.25)." and insert --|β|=0.25).--, therefor.

Column 21, line 45, delete "18A" and insert --18A.--, therefor.

Column 25, Table 1A, line 12, delete "2.401684E-11" and insert --1.777935E-11--, therefor.

Signed and Sealed this
Eighteenth Day of June, 2013

Teresa Stanek Rea
*Acting Director of the United States Patent and Trademark Office*